(12) United States Patent
Ye et al.

(10) Patent No.: US 10,312,206 B2
(45) Date of Patent: Jun. 4, 2019

(54) ARRAY SUBSTRATE

(71) Applicant: Au Optronics Corporation, Hsinchu (TW)

(72) Inventors: Jia-Hong Ye, New Taipei (TW); Pin-Fan Wang, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 15/839,870

(22) Filed: Dec. 13, 2017

(65) Prior Publication Data

US 2019/0081124 A1    Mar. 14, 2019

(30) Foreign Application Priority Data

Sep. 11, 2017 (TW) .............. 106131079 A

(51) Int. Cl.
*H01L 23/00* (2006.01)
*H01L 27/32* (2006.01)
*H01L 27/12* (2006.01)

(52) U.S. Cl.
CPC .............. *H01L 24/05* (2013.01); *H01L 24/03* (2013.01); *H01L 27/3258* (2013.01); *H01L 27/3276* (2013.01); *H01L 27/124* (2013.01); *H01L 27/1218* (2013.01); *H01L 27/1248* (2013.01); *H01L 27/1262* (2013.01); *H01L 2224/02235* (2013.01); *H01L 2224/02255* (2013.01); *H01L 2224/03013* (2013.01); *H01L 2224/03614* (2013.01); *H01L 2224/03622* (2013.01); *H01L 2224/05027* (2013.01); *H01L 2224/05073* (2013.01); *H01L 2227/323* (2013.01)

(58) Field of Classification Search
None
See application file for complete search history.

(56) References Cited

U.S. PATENT DOCUMENTS

| | | | |
|---|---|---|---|
| 6,522,073 B2 | 2/2003 | Wu et al. | |
| 7,439,586 B2 | 10/2008 | Jung et al. | |
| 7,985,645 B2 | 7/2011 | Park et al. | |
| 9,449,989 B2 | 9/2016 | Chao et al. | |
| 9,806,283 B2 | 10/2017 | Qu et al. | |
| 2002/0024302 A1 | 2/2002 | Wu et al. | |
| 2002/0115280 A1* | 8/2002 | Lin | H01L 24/05 438/617 |
| 2005/0269638 A1 | 12/2005 | Jung et al. | |
| 2007/0072409 A1* | 3/2007 | Ulmer | C23C 14/081 438/622 |
| 2010/0327410 A1 | 12/2010 | Park et al. | |
| 2016/0071887 A1 | 3/2016 | Chao et al. | |
| 2016/0181287 A1 | 6/2016 | Li et al. | |

(Continued)

FOREIGN PATENT DOCUMENTS

| | | |
|---|---|---|
| CN | 100380220 | 4/2008 |
| CN | 101937837 | 1/2011 |

(Continued)

*Primary Examiner* — Eva Y Montalvo
*Assistant Examiner* — Kevin Quinto
(74) *Attorney, Agent, or Firm* — JCIPRNET

(57) ABSTRACT

An array substrate includes a device array, a bonding pad, and at least one support structure. The bonding pad is located in a bonding area and is electrically connected to the device array. A horizontal distance between the at least one support structure and the bonding pad is between 5 μm and 1000 μm.

14 Claims, 33 Drawing Sheets

(56) References Cited

U.S. PATENT DOCUMENTS

2016/0336536 A1  11/2016  Qu et al.
2017/0042047 A1   2/2017  Oh

FOREIGN PATENT DOCUMENTS

| CN | 104091891 | 10/2014 |
| CN | 104851904 | 8/2015 |
| CN | 105789242 | 7/2016 |
| CN | 103700618 | 9/2016 |
| CN | 106155395 | 11/2016 |
| CN | 106450024 | 2/2017 |
| TW | 486721 | 5/2002 |
| TW | I570899 | 2/2017 |

* cited by examiner

ARRAY SUBSTRATE

CROSS-REFERENCE TO RELATED APPLICATION

This application claims the priority benefit of Taiwan application serial no. 106131079, filed on Sep. 11, 2017. The entirety of the above-mentioned patent application is hereby incorporated by reference herein and made a part of this specification.

BACKGROUND OF THE INVENTION

1. Field of the Invention

The invention relates to an array substrate. More particularly, the invention relates to an array substrate with a support structure.

2. Description of Related Art

With technology advances, flexible electronic products become more and more popular in the market, and a variety of related technologies emerge as well. For instance, the related technology of the flexible electronic products may be used in various electronic devices, such as displays, transducers, wearable devices, etc. It thus can be seen that the flexible electronic products bring significant market opportunities.

Currently, a flexible substrate and an electronic device are formed on a rigid carrier first, and then the flexible substrate and the electronic device are removed from the rigid carrier to form a flexible electronic product. Nevertheless, different components in the electronic device are required to be formed in different environments (e.g., different temperatures). The different components have different thermal expansion coefficients, stress residue thus exists among different components in the same temperature. After the flexible substrate and the electronic device are removed from the rigid carrier, the stress may easily cause the flexible electronic product to deform, and consequently, the electronic device is unable to aligned with a predetermined position. Especially in the bonding area where the flexible electronic product and other devices are bonded to, other devices may not be easily bonded to the flexible electronic product properly after the flexible electronic product is deformed, and as a result, the product is unable to operate normally. Therefore, a method is needed urgently to solve the foregoing problem.

SUMMARY OF THE INVENTION

The invention provides an array substrate which is able to resolve a problem of deformation in a bonding area of the array substrate.

An array substrate provided by an embodiment of the invention includes a device array, a bonding pad, and at least one support structure. The bonding pad is located in a bonding area and is electrically connected to the device array. A horizontal distance between the support structure and the bonding pad is between 5 μm and 1000 μm.

In an embodiment of the invention, deformation of the bonding area of the array substrate generated in the manufacturing process is reduced, and that the bonding pad is not deviated from the predetermined position.

In an embodiment of the invention, yield rates of the products are significantly enhanced.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
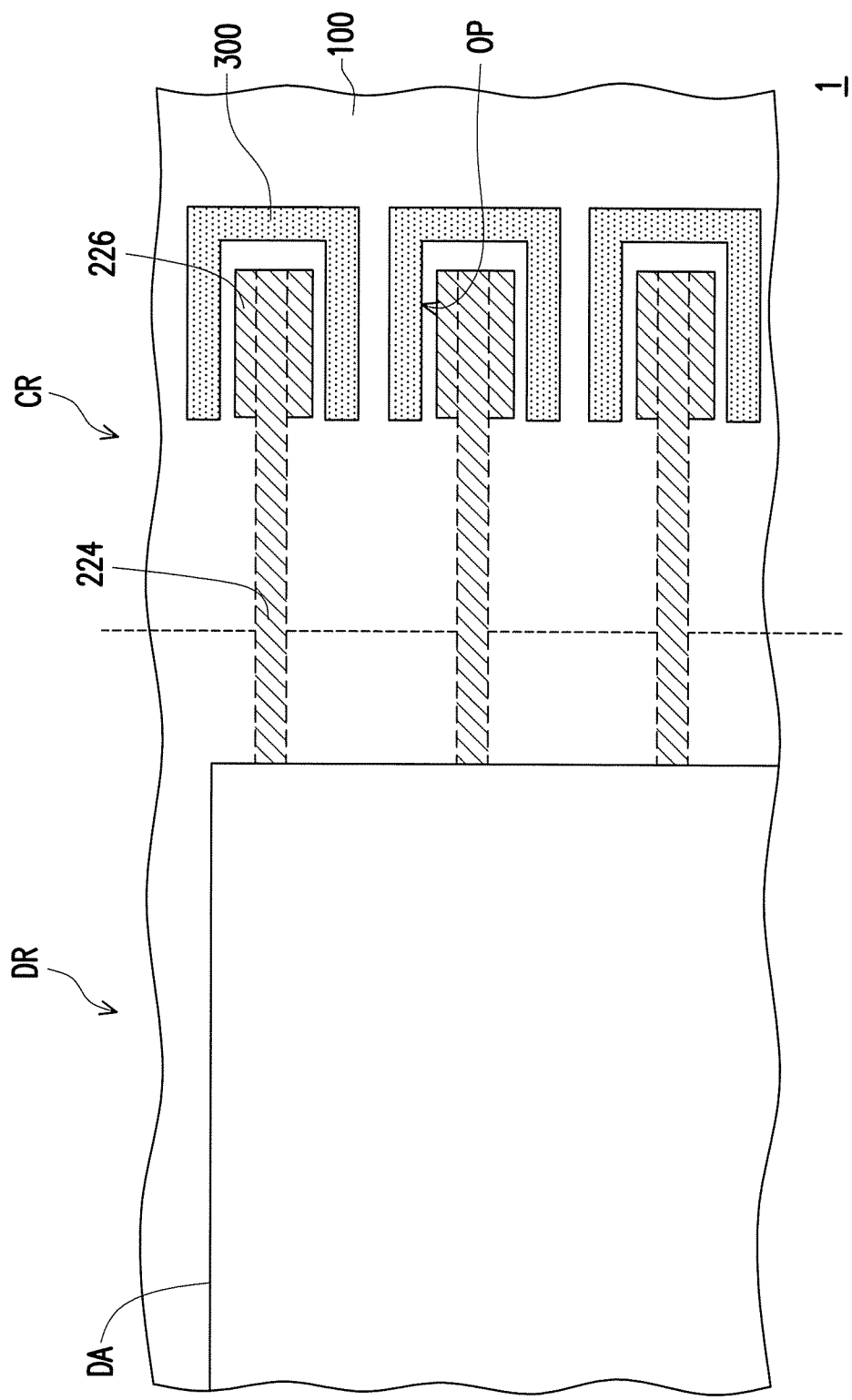
FIG. 1 is a schematic top view of an array substrate according to an embodiment of the invention.

FIG. 1 is a schematic top view of an array substrate according to an embodiment of the invention.

Referring to FIG. 1, an array substrate 1 includes a substrate 100, a device array DA, a plurality of bonding pads 226, and a plurality of support structures 300.

In some embodiments, the substrate 100 may be a flexible substrate, and a material of the substrate 100 includes, for example, polyethylene terephthalate (PET), polyethylene naphthalate (PEN), polyester (PES), polymethylmethacrylate (PMMA), polycarbonate (PC), polyimide (PI), metal foil, or other flexible materials. But the invention is not limited thereto. In some embodiments, the material of the substrate 100 may be glass with flexibility, quartz, an opaque/reflective material (e.g., a conductive material, metal, wafer, ceramics, or other suitable materials), or other suitable materials.

The substrate 100 has a bonding area CR and an array area DR. In an embodiment, the substrate 100 includes the bonding pads 226. The bonding pads 226 are located in the bonding area CR, and the device array DA is located in the array area DR. In some embodiments, the device array DA may be a pixel array, a touch sensing array, a light sensing array or other electronic device arrays. A conductive layer 224 is electrically connected to corresponding bonding pad 226, extends from the bonding area CR towards the device array DA, and is electrically connected to the device array DA. In some embodiments, the conductive layer 224 may include a multi-layer structure or a single-layer structure. The support structures 300 are located in the bonding area CR and are disposed close to the bonding pads 226. A horizontal distance between the support structures 300 and the bonding pads 226 is, for example, between 5 μm and 1000 μm, 5 μm and 500 μm, 5 μm and 250 μm, 5 μm and 150 μm, or 5 μm and 50 μm. In the present embodiment, the support structures 300 are located in the bonding area CR, and each of the support structures 300 is disposed corresponding to one of the bonding pads 226. In the present embodiment, each of the bonding pads 226 is located in an opening OP of the respective corresponding support structure 300.

In the present embodiment, the bonding pads 226 are rectangular, and each of the support structures 300 is disposed corresponding to at least three sides of each of the bonding pads 226. In the present embodiment, each of the support structures 300, for example, includes an opening OP facing the device array DA, and the bonding pad 226 is located in the opening OP. In the present embodiment, an upper surface of each of the support structures 300 is shaped as U-shaped, but the invention is not limited thereto. In other embodiments, the upper surface of each of the support structures 300 is shaped as, including, a triangle, a rectangle, a pentagon, a circle, an ellipse, or other polygonal geometric shapes. In the present embodiment, an upper surface of each of the bonding pads 226 is shaped as a rectangle, but the invention is not limited thereto. In other embodiments, the upper surface of each of the bonding pads 226 is shaped as, including, a triangle, a circle, an ellipse, a pentagon, other polygonal geometric shapes, or a combination of the foregoing shapes. In the present embodiment, the bonding pads 226 are arranged in a row and are respectively aligned, but the invention is not limited thereto. In other embodiments, the bonding pads 226 may be alternately arranged, and the support structures 300 may be alternatively arranged as well.

Based on the above, in the array substrate 1 provided by at least one embodiment of the invention, the support structures 300 are disposed at positions close to the bonding pads 226. Deformation of the bonding area CR of the array substrate 1 generated in a manufacturing process may be reduced by the support structures 300, and that the bonding pads 226 are not deviated from predetermined positions. As such, yield rates of the products are significantly enhanced.

Figure 2A:
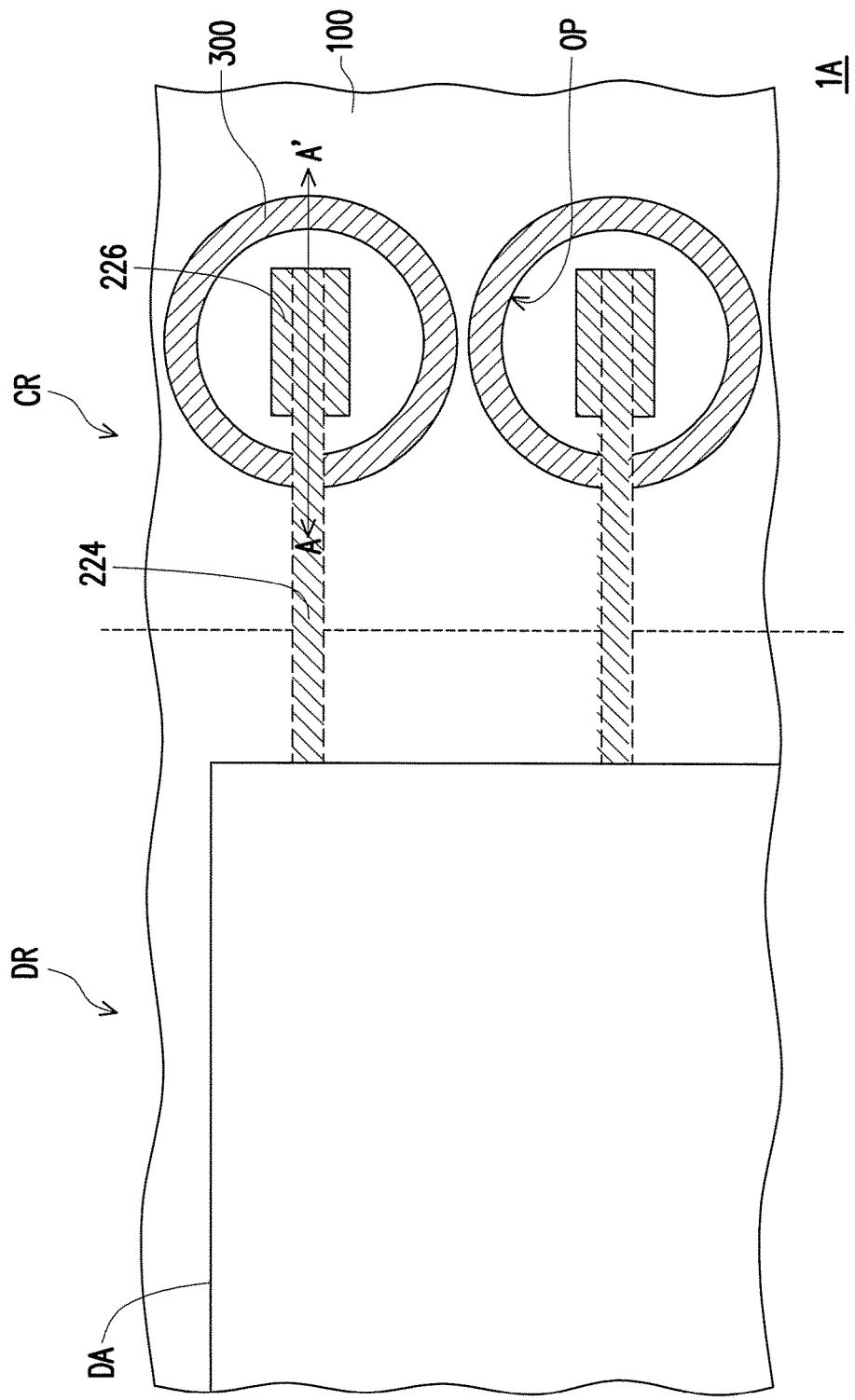
FIG. 2A is a schematic top view of an array substrate according to an embodiment of the invention.
Figure 2B:
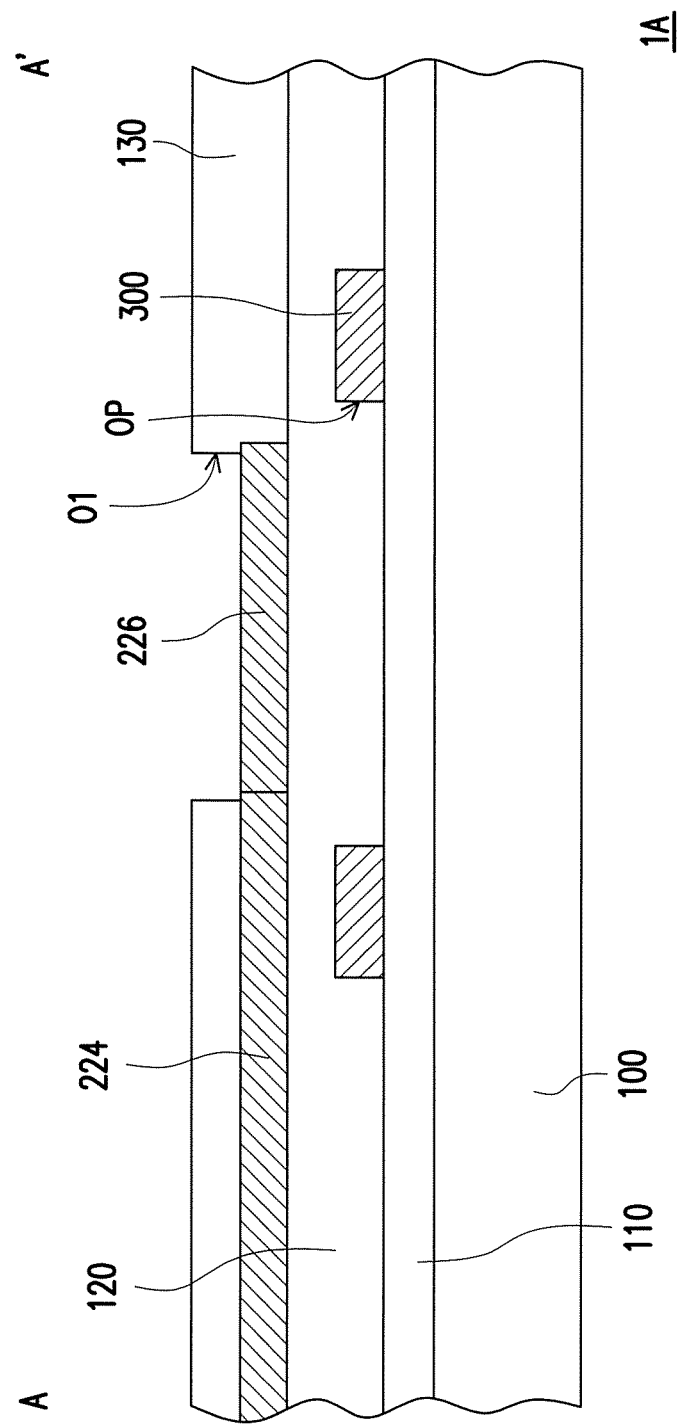
FIG. 2B is a schematic cross-sectional view taken along line AA' of FIG. 2A.

FIG. 2A is a schematic top view of an array substrate according to an embodiment of the invention. FIG. 2B is a schematic cross-sectional view taken along a line AA' of FIG. 2A. It should be noted that the reference numerals and a part of the contents in the embodiment of FIG. 1 are also used to describe the embodiments of FIG. 2A and FIG. 2B, in which the same reference numerals are used to represent identical or similar elements, and thus descriptions of the same technical contents are omitted. Please refer to the descriptions of the previous embodiment for the omitted contents, which will not be repeated hereinafter.

Referring to FIG. 2A and FIG. 2B together, a support structure 300 of an array substrate 1A is disposed on a substrate 100, and an insulation layer 110 is sandwiched between the support structure 300 and the substrate 100. An insulation layer 120 is formed on the insulation layer 110, and in the present embodiment, at least a portion of the support structure 300 is embedded in the insulation layer 120. In the present embodiment, a shape of the support structure 300 includes an annular shape, and the support structure 300 has an opening OP.

A bonding pad 226 and a conductive layer 224 are formed on the insulation layer 120. The bonding pad 226 and the conductive layer 224, for example, include identical conductive material(s). The bonding pad 226 and the conductive layer 224 may be formed simultaneously. In some embodiments, the support structure 300 may also include a conductive material, and the insulation layer 120 is sandwiched between the conductive layer 224 and the support structure 300. In the present embodiment, the bonding pad 226 is disposed corresponding to the opening OP of the support structure 300.

An insulation layer 130 is formed on the insulation layer 120. The insulation layer 130 at least covers a portion of the conductive layer 224, and the insulation layer 130 has an opening O1 exposing the bonding pad 226.

Based on the above, in the array substrate 1A provided by at least one embodiment of the invention, the support structure 300 is disposed at a position close to the bonding pad 226. Deformation of a bonding area CR of the array substrate 1A generated in a manufacturing process may be reduced by the support structure 300, and that the bonding pad 226 is not deviated from a predetermined position. As such, yield rates of the products are significantly enhanced.

Figure 3A:
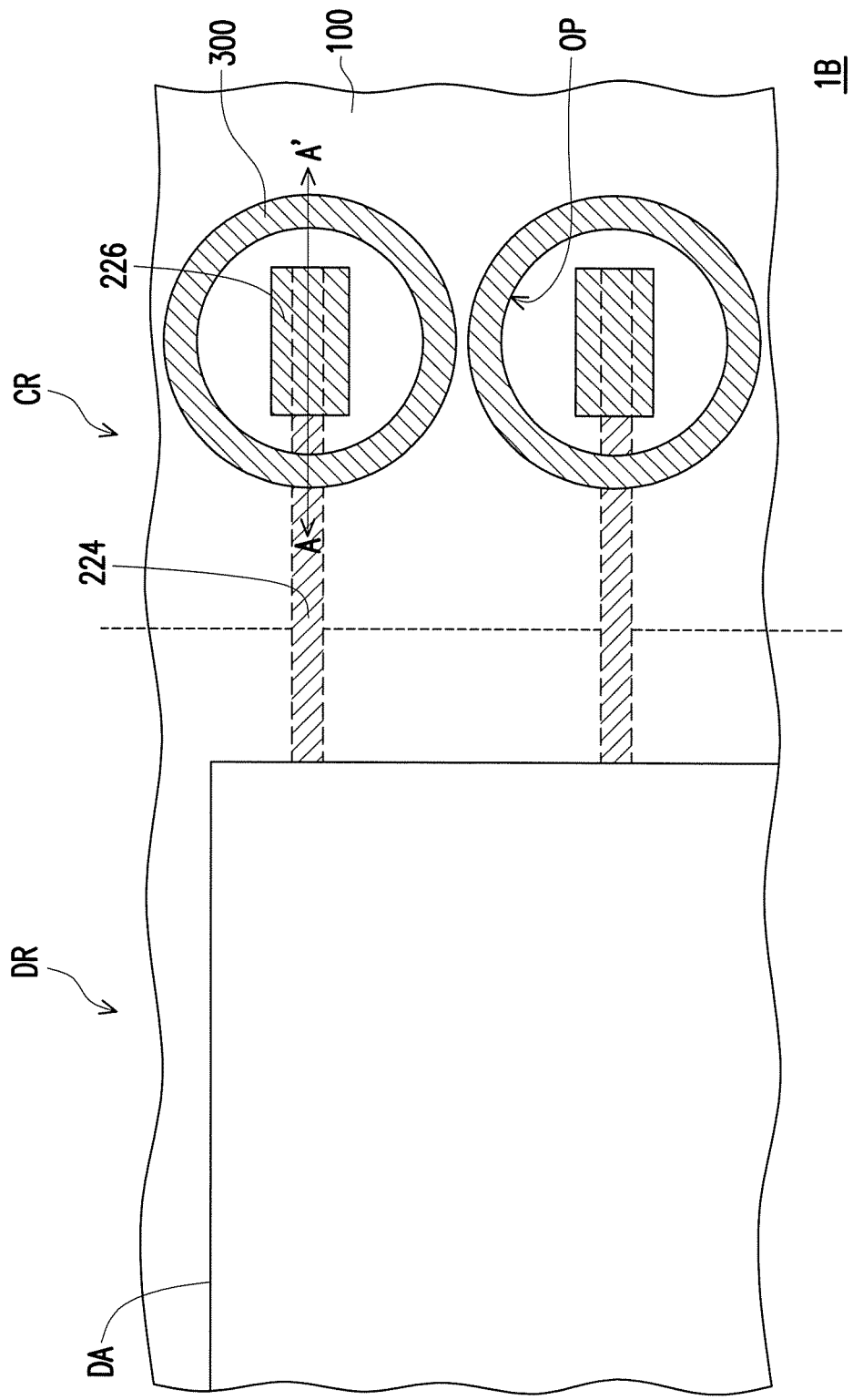
FIG. 3A is a schematic top view of an array substrate according to an embodiment of the invention.
Figure 3B:
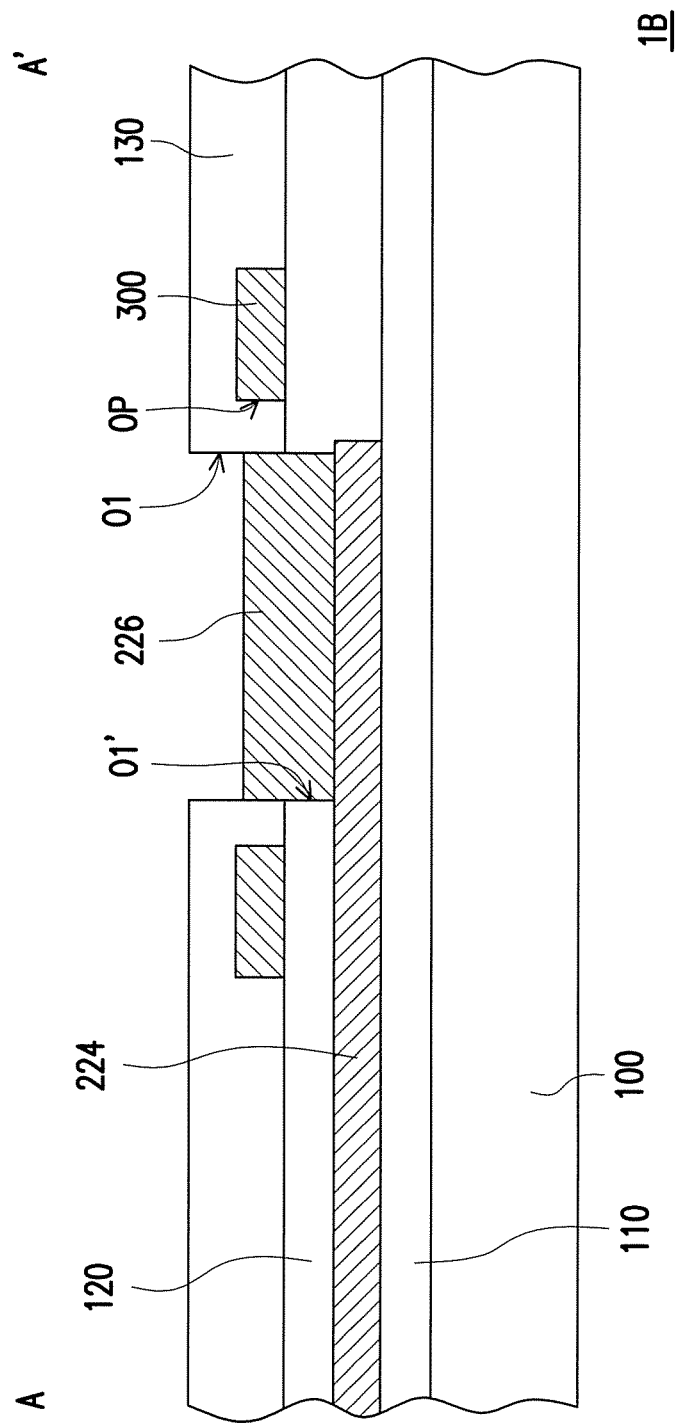
FIG. 3B is a schematic cross-sectional view taken along line AA' of FIG. 3A.

FIG. 3A is a schematic top view of an array substrate according to an embodiment of the invention. FIG. 3B is a schematic cross-sectional view taken along line AA' of FIG. 3A. It should be noted that the reference numerals and a part of the contents in the embodiments of FIG. 2A and FIG. 2B are also used to describe the embodiments of FIG. 3A and FIG. 3B, in which the same reference numerals are used to represent identical or similar elements, and thus descriptions of the same technical contents are omitted. Please refer to the descriptions of the previous embodiment for the omitted contents, which will not be repeated hereinafter.

Referring to FIG. 3A and FIG. 3B together, an insulation layer 110 is formed on the substrate 100. A conductive layer 224 is formed on the insulation layer 110. An insulation layer 120 is formed on the insulation layer 110 and at least covers a portion of the conductive layer 224. The insulation layer 120 has an opening O1' exposing a portion of the conductive layer 224. A bonding pad 226 is formed on the conductive layer 224, and the bonding pad 226 is located in the opening O1' of the insulation layer 120. In the present embodiment, the bonding pad 226 and the conductive layer 224, for example, are formed by different processes.

A support structure 300 of an array substrate 1B is formed on the insulation layer 120. In the present embodiment, a shape of the support structure 300 includes an annular shape, and the support structure 300 has an opening OP. The bonding pad 226 is disposed corresponding to the opening OP of the support structure 300. In some embodiments, the bonding pad 226 and the support structure 300 may be formed simultaneously and include an identical material. In the present embodiment, an upper surface of the bonding pad 226 and an upper surface of the support structure 300 are at same level as shown in FIG. 3B, but the invention is not limited thereto. In other embodiments, the upper surface of the bonding pad 226 and the upper surface of the support structure 300 are not at same level.

An insulation layer 130 is formed on the insulation layer 120. At least a portion of the support structure 300 is embedded in the insulation layer 130. The insulation layer 130 has an opening O1 exposing the bonding pad 226.

Based on the above, in the array substrate 1B provided by at least one embodiment of the invention, the support structure 300 is disposed at a position close to the bonding pad 226. Deformation of a bonding area CR of the array substrate 1B generated in a manufacturing process may be reduced by the support structure 300, and that the bonding pad 226 is not deviated from a predetermined position. As such, yield rates of the products are significantly enhanced.

Figure 4A:
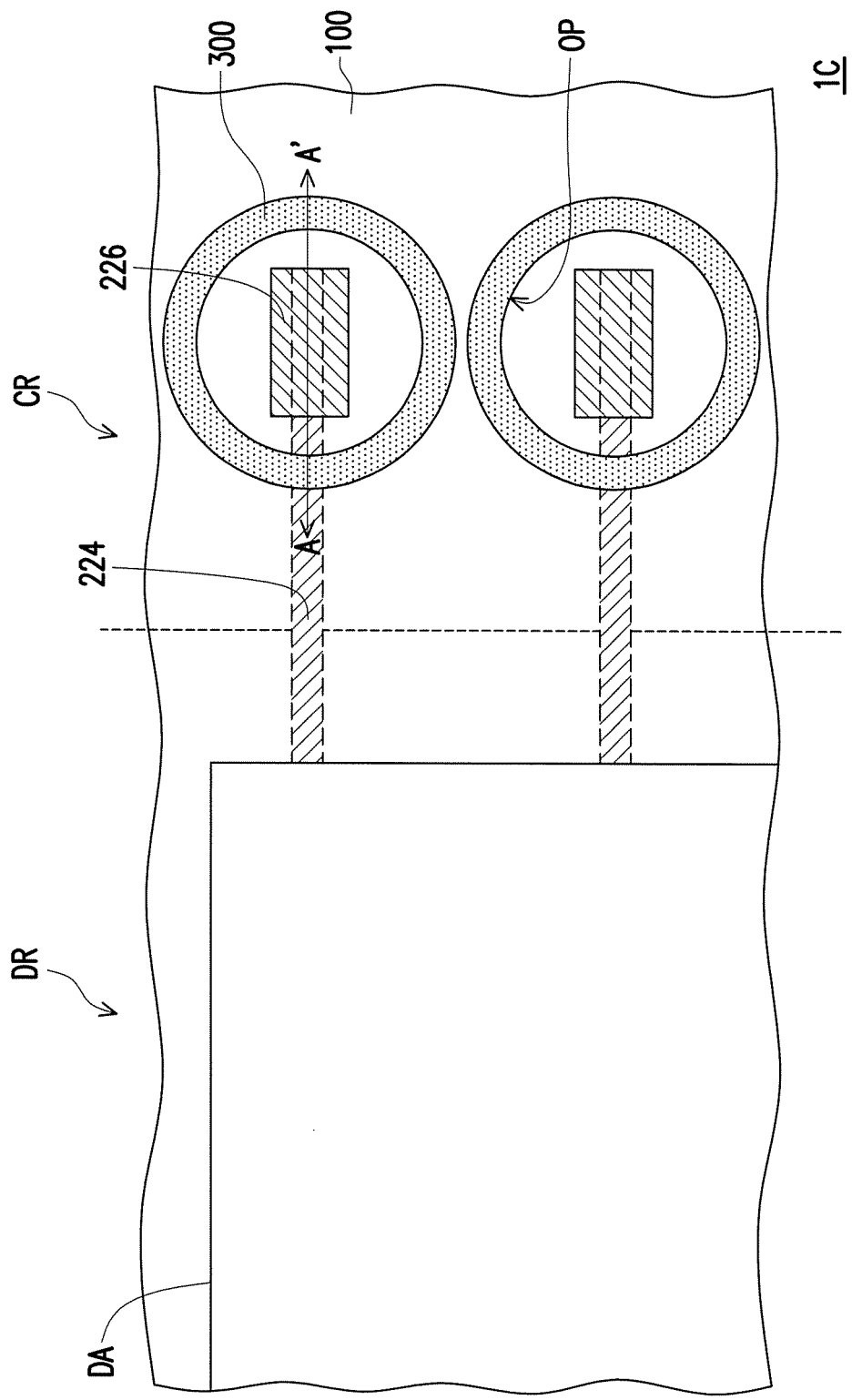
FIG. 4A is a schematic top view of an array substrate according to an embodiment of the invention.
Figure 4B:
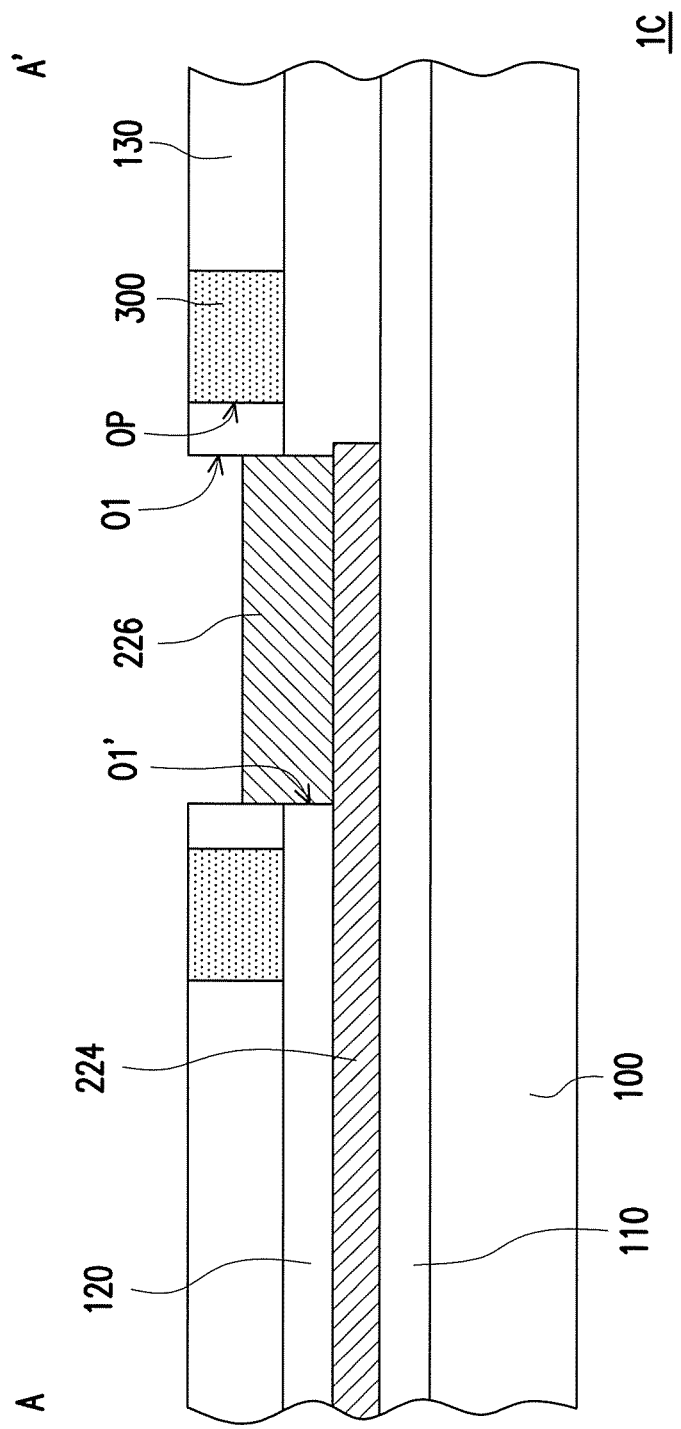
FIG. 4B is a schematic cross-sectional view taken along line AA' of FIG. 4A.

FIG. 4A is a schematic top view of an array substrate according to an embodiment of the invention. FIG. 4B is a schematic cross-sectional view taken along line AA' of FIG. 4A. It should be noted that the reference numerals and a part of the contents in the embodiments of FIG. 3A and FIG. 3B are also used to describe the embodiments of FIG. 4A and FIG. 4B, in which the same reference numerals are used to represent identical or similar elements, and thus descriptions of the same technical contents are omitted. Please refer to the descriptions of the previous embodiment for the omitted contents, which will not be repeated hereinafter.

Referring to FIG. 4A and FIG. 4B together, an insulation layer 110 is formed on the substrate 100. A conductive layer 224 is formed on the insulation layer 110. An insulation layer 120 is formed on the insulation layer 110 and at least covers a portion of the conductive layer 224. The insulation layer 120 has an opening O1' exposing a portion of the conductive layer 224. A bonding pad 226 is formed on the conductive layer 224, and the bonding pad 226 is located in the opening O1' of the insulation layer 120. In the present embodiment, the bonding pad 226 and the conductive layer 224, for example, are formed by different processes.

A support structure 300 of an array substrate 1C is formed on the insulation layer 120. In the present embodiment, the support structure 300 and the bonding pad 226, for example, are formed by different processes. In the present embodiment, a shape of the support structure 300 includes an annular shape, and the support structure 300 has an opening OP. The bonding pad 226 is disposed corresponding to the opening OP of the support structure 300.

An insulation layer 130 is formed on the insulation layer 120. At least a portion of the support structure 300 is embedded in the insulation layer 130. In the present embodiment, the insulation layer 130 exposes an upper surface of the support structure 300, but the invention is not limited thereto. In other embodiments, the insulation layer 130 covers the upper surface of the support structure 300. The insulation layer 130 has an opening O1 exposing the bonding pad 226.

Based on the above, in the array substrate 1C provided by at least one embodiment of the invention, the support structure 300 is disposed at a position close to the bonding pad 226. Deformation of a bonding area CR of the array substrate 1C generated in a manufacturing process may be reduced by the support structure 300, and that the bonding pad 226 is not deviated from a predetermined position. As such, yield rates of the products are significantly enhanced.

Figure 5:
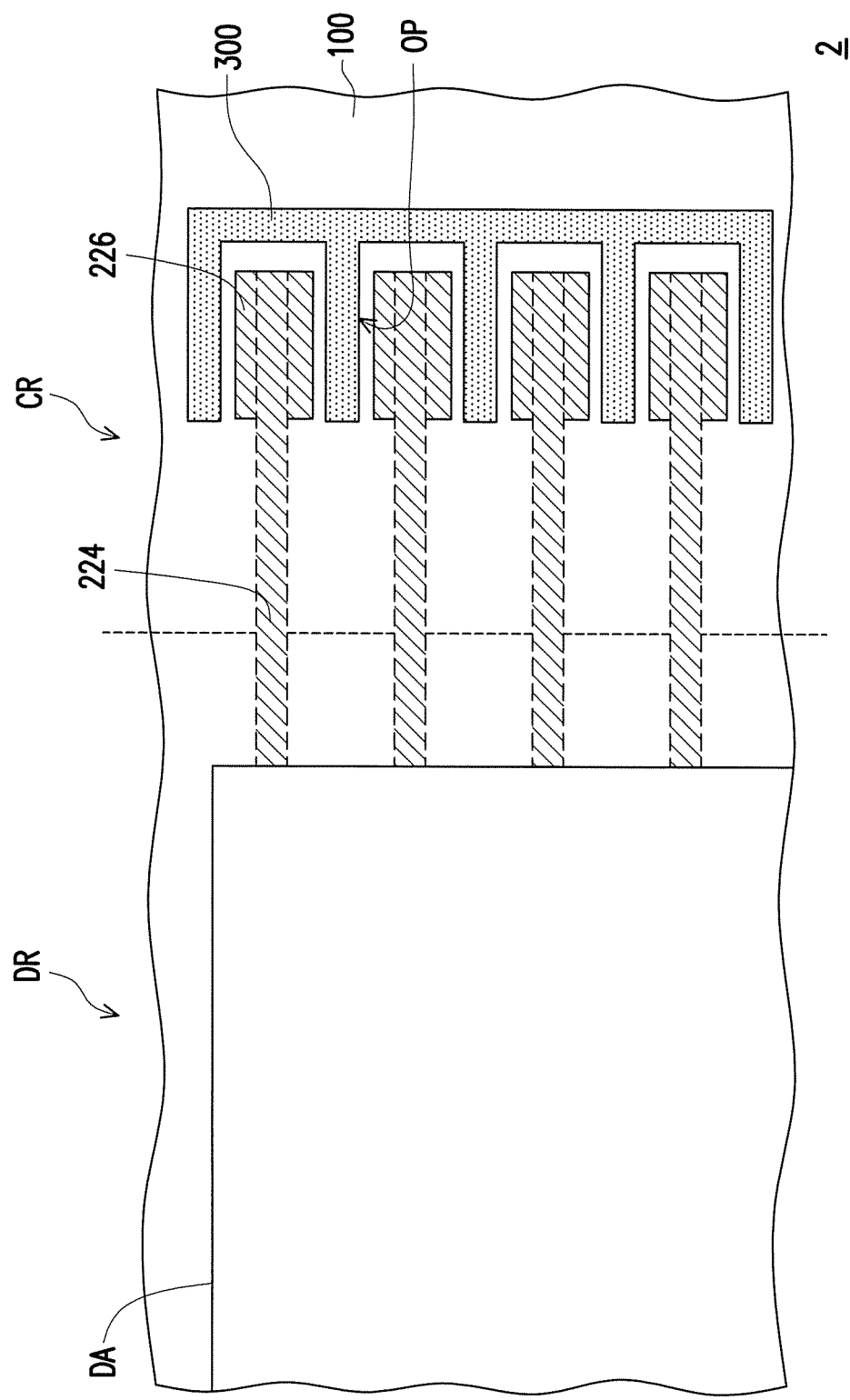
FIG. 5 is a schematic top view of an array substrate according to an embodiment of the invention.

FIG. 5 is a schematic top view of an array substrate according to an embodiment of the invention. It should be noted that the reference numerals and a part of the contents in the embodiment of FIG. 1 are also used to describe the embodiment of FIG. 5, in which the same reference numerals are used to represent identical or similar elements, and thus descriptions of the same technical contents are omitted. Please refer to the descriptions of the previous embodiment for the omitted contents, which will not be repeated hereinafter.

In the present embodiment, a bonding area CR of an array substrate 2 includes a support structure 300. In the present embodiment, the support structure 300 is disposed corresponding to a plurality of bonding pads 226. In the present embodiment, the support structure 300 has a plurality of openings OP, and each of the bonding pads 226 is located in the corresponding opening OP. In the present embodiment, an upper surface of the support structure 300 is shaped as a shape of E-letter shapes connected in series as shown in FIG. 5, but the invention is not limited thereto. In other embodiments, the upper surface of the support structure 300 is shaped, including, other geometric shapes with openings. In the present embodiment, a space between the adjacent two bonding pads 226 corresponds only to one identical portion of the support structure 300, such that the space between the two bonding pads 226 may be reduced, and that a size of the array substrate 2 is further decreased.

Based on the above, in the array substrate 2 provided by at least one embodiment of the invention, the support structure 300 is disposed at a position close to the bonding pads 226. Deformation of the bonding area CR of the array substrate 2 generated in a manufacturing process may be reduced by the support structure 300, and that the bonding pads 226 are not deviated from predetermined positions. As such, yield rates of the products are significantly enhanced.

Figure 6:
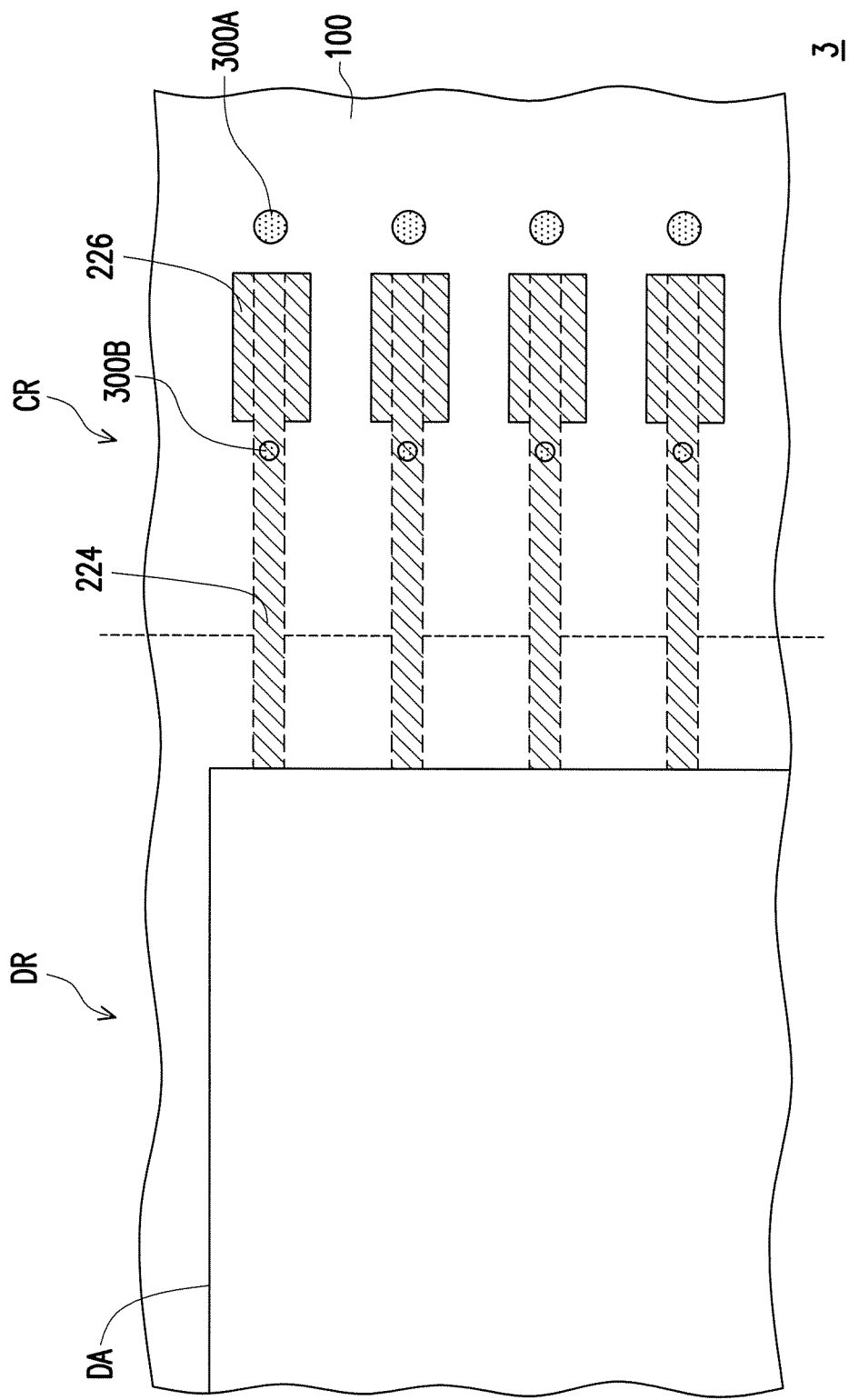
FIG. 6 is a schematic top view of an array substrate according to an embodiment of the invention.

FIG. 6 is a schematic top view of an array substrate according to an embodiment of the invention. It should be noted that the reference numerals and a part of the contents in the embodiment of FIG. 5 are also used to describe the embodiment of FIG. 6, in which the same reference numerals are used to represent identical or similar elements, and thus descriptions of the same technical contents are omitted. Please refer to the descriptions of the previous embodiment for the omitted contents, which will not be repeated hereinafter.

In the present embodiment, in a bonding area CR of an array substrate 3, a plurality of support structures 300A and a plurality of auxiliary structures 300B are included. Each of the support structures 300A and each of the auxiliary structures 300B are disposed corresponding to a bonding pad 226. In the present embodiment, each of the support structures 300A and each of the auxiliary structures 300B are respectively close to two sides of the corresponding bonding pad 226. In the present embodiment, the auxiliary structures 300B are located between the bonding pads 226 and a device array DA, and the bonding pads 226 are located between the support structures 300A and the auxiliary structures 300B. In the present embodiment, upper surfaces of the support structures 300A and upper surfaces of the auxiliary structures 300B have an identical shape, for example, a circle, but the invention is not limited thereto. In other embodiments, the upper surfaces of the support structure 300A and the upper surfaces of the auxiliary structures 300B are shaped as, including, a triangle, a rectangle, a polygon, an ellipse, or other polygonal geometric shapes. In some embodiments, the upper surfaces of the support structures 300A and the upper surfaces of the auxiliary structures 300B have different shapes. In the present embodiment, the array substrate 3 includes the auxiliary structures 300B, but the invention is not limited thereto. In other embodiments, the array substrate 3 does not include the auxiliary structures 300B.

Based on the above, in the array substrate 3 provided by at least one embodiment of the invention, the support structures 300A and the auxiliary structures 300B are disposed at positions close to the bonding pads 226. Deformation of the bonding area CR of the array substrate 3 generated in a manufacturing process may be reduced by the support structures 300A and the auxiliary structures 300B, and that the bonding pads 226 are not deviated from predetermined positions. As such, yield rates of the products are significantly enhanced.

Figure 7:
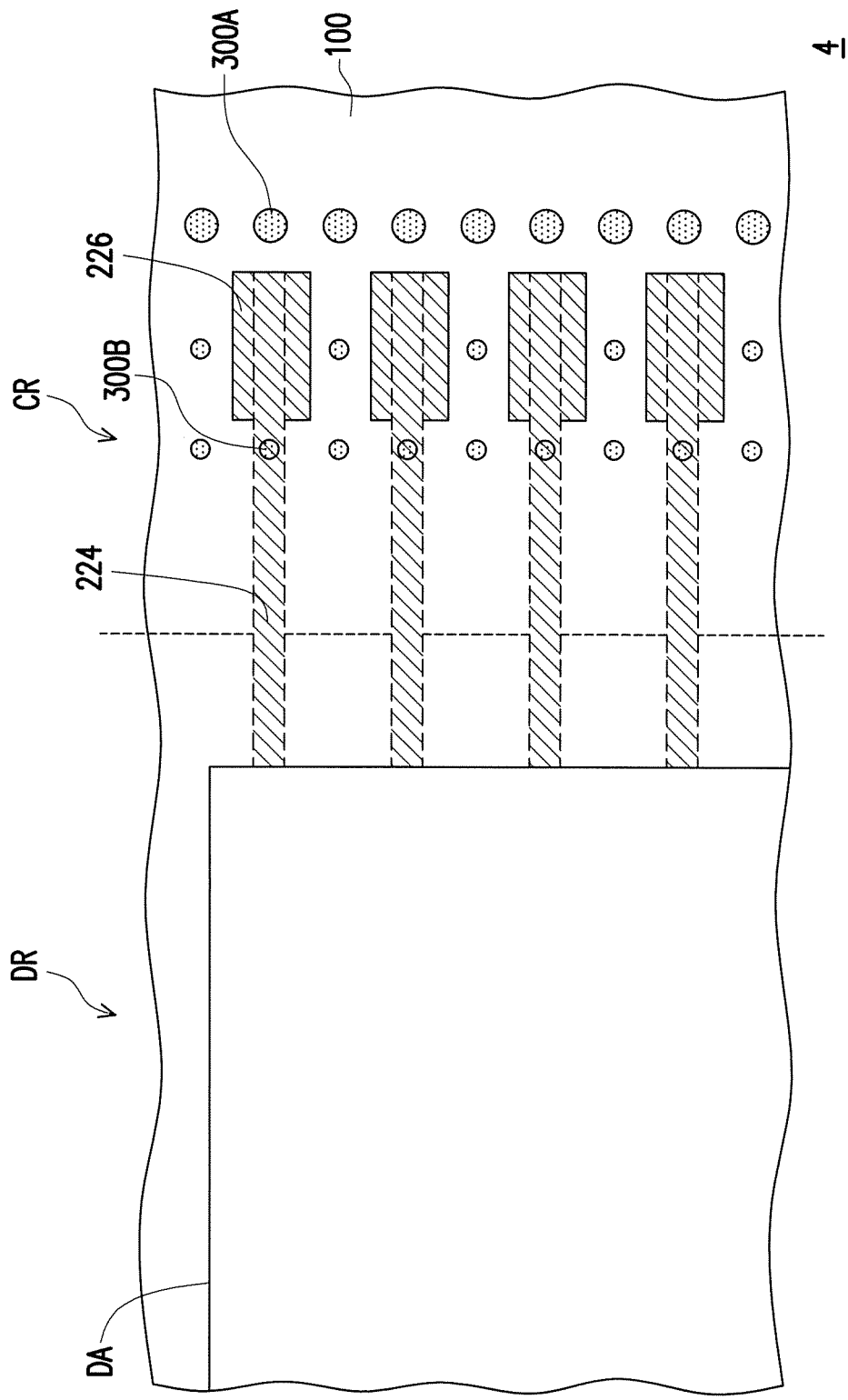
FIG. 7 is a schematic top view of an array substrate according to an embodiment of the invention.

FIG. 7 is a schematic top view of an array substrate according to an embodiment of the invention. It should be noted that the reference numerals and a part of the contents in the embodiment of FIG. 6 are also used to describe the embodiment of FIG. 7, in which the same reference numerals are used to represent identical or similar elements, and thus descriptions of the same technical contents are omitted. Please refer to the descriptions of the previous embodiment for the omitted contents, which will not be repeated hereinafter.

In the present embodiment, each of support structures 300A of an array substrate 4 is close to a side of each of bonding pads 226 away from a device array DA, and a plurality of auxiliary structures 300B are respectively located between two adjacent bonding pads 226 and between the bonding pads 226 and the device array DA.

In the present embodiment, the support structures 300A and the auxiliary structures 300B are distributed around the bonding pads 226 together, and moreover, each side of the bonding pads faces the support structures 300A or the auxiliary structures 300B. In some embodiments, a gap between the adjacent support structures 300A, between the adjacent auxiliary structures 300B, or between the adjacent support structure 300A and the auxiliary structure 300B, for example, is between 5 μm and 1000 μm, 5 μm and 500 μm, 5 μm and 250 μm, 5 μm and 150 μm, or 5 μm and 50 μm.

Based on the above, in the array substrate 4 provided by at least one embodiment of the invention, the support structures 300A and the auxiliary structures 300B are disposed at positions close to the bonding pads 226. Deformation of a bonding area CR of the array substrate 4 generated in a manufacturing process may be reduced by the support structures 300A and the auxiliary structures 300B, and that the bonding pads 226 are not deviated from predetermined positions. As such, yield rates of the products are significantly enhanced.

Figure 8:
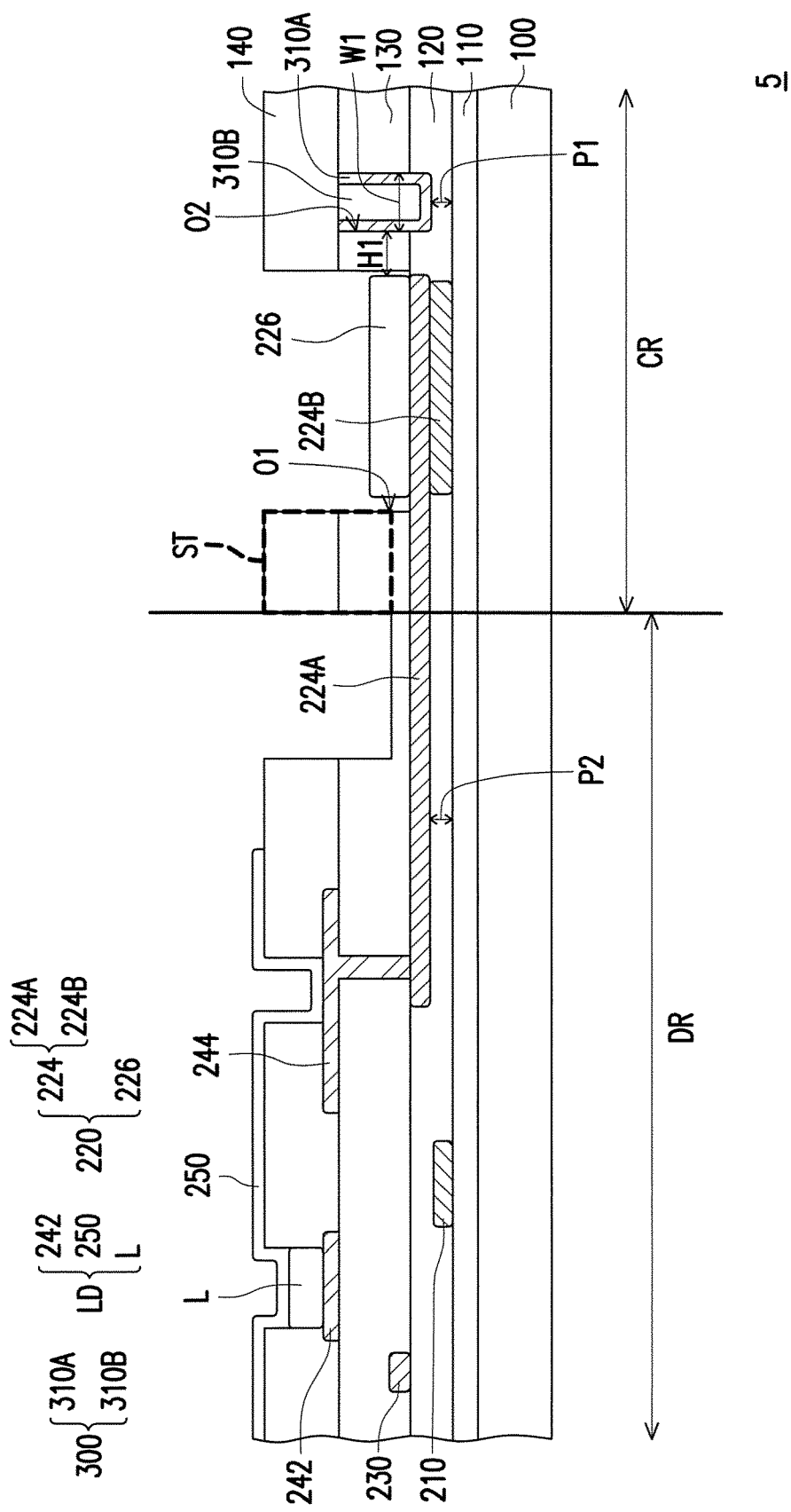
FIG. 8 is a schematic cross-sectional view of an array substrate according to an embodiment of the invention.

FIG. 8 is a schematic cross-sectional view of an array substrate according to an embodiment of the invention. It should be noted that the reference numerals and a part of the contents in the embodiment of FIG. 7 are also used to describe the embodiment of FIG. 8, in which the same reference numerals are used to represent identical or similar elements, and thus descriptions of the same technical contents are omitted. Please refer to the descriptions of the previous embodiment for the omitted contents, which will not be repeated hereinafter.

In the present embodiment, an array substrate 5 includes a substrate 100, an insulation layer 110, an insulation layer 120, an insulation layer 130, an insulation layer 140, a signal line 210, a transduction structure 220, a signal line 230, a signal line 244, a light emitting device LD, and a support structure 300.

In the present embodiment, the insulation layer 110 is located on the substrate 100. In an embodiment, the insulation layer 110 includes a gate insulation layer. A thickness of the insulation layer 110, for example, is between 0.05 μm and 2 μm. A material of the insulation layer 120 includes oxide or nitride. The insulation layer 120 is located on the insulation layer 110. In an embodiment, the insulation layer 120, for example, is an interlayer dielectric (ILD) layer. A thickness of the insulation layer 120, for example, is between 0.05 μm and 0.6 μm. A material of the insulation layer 120 includes oxide and nitride. The insulation layer 130 is located on the insulation layer 120. The insulation layer 140 is located on the insulation layer 130.

In some embodiments, a device array DA of the array substrate 5 is located in an array area DR, and the device array DA, for example, includes a plurality of switching devices (not shown). The respective switching device, for example, is a thin film transistor including a gate, a semiconductor channel, a source, and a drain. In some embodiments, the source is electrically connected to the signal line 230, and the gate is electrically connected to the signal line 210. The signal line 230, for example, is a data line, and the signal line 210, for example, is a scan line. In some embodiments, the source is electrically connected to the signal line 210, and the gate is electrically connected to the signal line 230. The signal line 210, for example, is a data line, and the signal line 230, for example, is a scan line.

In an embodiment, the device array DA, for example, includes a plurality of the light emitting devices LD. The light emitting devices LD are located on the insulation layer 130. In an embodiment, the light emitting device LD, for example, is an organic electroluminescent device and includes an electrode 242, a displaying medium L, and an electrode 250. The display medium L is located between the electrode 242 and the electrode 250, and the electrode 250 is located on the insulation layer 140. In an embodiment, the electrode 242 and the electrode 250 may adopt a conductive material such as metal or metal oxide. If the electrode 242 and the electrode 250 both adopt a transparent conductive material, the light emitting device LD formed is double-sided light emitting devices. If one of the electrode 242 and the electrode 250 adopts the transparent conductive material and the other one does not, the light emitting device LD formed is an emitting device of a bottom side light emitting type or a top side light emitting type. The display medium L, for example, includes a small molecule electro-luminescent material or a polymer electro-luminescent material. In addition, the light emitting device LD may be categorized into an active organic light emitting device and a passive organic light emitting device substrated on a manner in which the light emitting device LD is driven. If the light emitting device LD is an active organic light emitting device, the electrode 242 is electrically connected to an active device array. If the light emitting device LD is a passive organic light emitting device, the electrode 242 and the electrode 250 are respectively formed by stripe electrode patterns. According to a preferred embodiment, the light emitting device LD may further include an electron transporting layer, an electron injection layer, a hole transporting layer, and a hole injection layer (not shown).

In an embodiment, the electrode 250 of the light emitting device LD is electrically connected to the transduction structure 220 through the signal line 244. In an embodiment, the signal line 244 and the electrode 242 belong to a same patterned film layer.

The transduction structure 220 includes a conductive layer 224 and a bonding pad 226. The conductive layer 224 extends from the bonding area CR towards the device array DA (the device array DA includes, for example, the light emitting device LD). The conductive layer 224 includes a first layer 224B and a second layer 224A, and the first layer 224B is located between the second layer 224A and the insulation layer 110. In the present embodiment, the conductive layer 224 extends from the bonding area CR towards the device array DA. For instance, the second layer 224A of the conductive layer 224 extends from the bonding area CR into the array area DR and is electrically connected to the signal line 244. In some embodiments, the second layer 224A may not extend from the bonding area CR into the array area DR. A vertical distance P2 is provided between a portion of the second layer 224A which is not located in the bonding area CR (e.g., located in the array area DR) and an upper surface of the insulation layer 110. The vertical distance P2, for example, is between 0 μm and 0.5 μm. In an embodiment, the second layer 224A of the conductive layer 224, for example, is formed in a trench of the insulation layer 120. As such, a lower surface of the second layer 224A is lower than a lower surface of the signal line 230. In an embodiment, the second layer 224A of the conductive layer 224 and the signal line 230 may belong to a same patterned film layer. For instance, the second layer 224A and the signal line 230 are both formed on the upper surface of the insulation layer 120. In this case, a vertical distance between the second layer 224A and the upper surface of the insulation layer 110 is a thickness of the insulation layer 120.

In the present embodiment, the signal line 244 is electrically connected to the transduction structure 220, but the invention is not limited thereto. In other embodiments, the signal line 210 or the signal line 230 is electrically connected to the transduction structure 220.

In the bonding area CR, the second layer 224A of the conductive layer 224 is electrically connected to the first layer 224B and the bonding pad 226, wherein the second layer 224A is located between the first layer 224B and the bonding pad 226. The first layer 224B is located on the insulation layer 110. In an embodiment, the first layer 224B and the signal line 210 belong to a same patterned film layer. In an embodiment, a thickness of the first layer 224B is greater than a thickness of the signal line 210. The bonding pad 226 is located in the bonding area CR, and at least a portion of the bonding pad 226 is located in an opening O1 of the insulation layer 130. In some embodiments, a width of the bonding pad 226 may be greater than, less than, or equal to a width of the opening O1. When the bonding pad 226 is greater than the opening O1, a portion of the bonding pad 226 may be in contact with a top surface of the insulation layer 130 or a top surface of the insulation layer 140, meaning that, a portion of the bonding pad 226 is not located in the opening O1. The bonding pad 226 is electrically connected to the device array DA through the second layer 224A. The array substrate 5, for example, is electrically connected to other electronic devices through the bonding pad 226. In an embodiment, pins of other electronic devices, for example, are electrically connected to the bonding pad 226 of the array substrate 5 through a conductive glue.

In the present embodiment, the array substrate 5 includes a support pad ST. The support pad ST, for example, may be used to support a photomask during a period in which the array substrate 5 is manufactured, and the support pad ST, for example, may be located in the bonding area CR. In the present embodiment, the support pad ST is a multi-layer structure and includes a portion of the insulation layer 130 and a portion of the insulation layer 140.

In the present embodiment, the support structure 300 is located in the bonding area CR. In an embodiment, a width WI of the support structure 300 is between 3 μm and 100 μm. A horizontal distance H1 between the support structure 300 and the bonding pad 226 is between 5 μm and 1000 μm. In the present embodiment, at least a portion of the support structure 300 is embedded in the insulation layer 120 and the insulation layer 130. In the present embodiment, the support structure 300 includes a first portion 310A and a second portion 310B made of different materials. The first portion 310A is formed in an opening O2 of the insulation layer 120 and the insulation layer 130 as shown in FIG. 8. In the present embodiment, the first portion 310A of the support structure 300 is conformal with the opening O2. The second portion 310B of the support structure 300 is located in the first portion 310A, and the second portion 310B is not in contact with the insulation layer 110. In an embodiment, a material of the first portion 310A of the support structure 300 includes metal oxide. In an embodiment, a thickness of the first portion 310A is approximately 50 μm to 300 μm. In an embodiment, the second portion 310B includes an air void. In an embodiment, the first portion 310A, the signal line 244, and the electrode 242 belong to a same patterned film layer, for example. As such, no additional process is required to manufacture the support structure 300.

In the present embodiment, a vertical distance P1 is provided between the support structure 300 and the upper surface of the insulation layer 110. The vertical distance P1, for example, is between 0.05 μm and 1 μm. A portion of the support structure 300 is embedded in the insulation layer 120, and a portion of the insulation layer 120 is remained between the support structure 300 and the insulation layer 110. Therefore, the support structure 300 can effectively break a stress in the insulation layer 120, and that the array substrate 5 is less susceptible to deformation. A portion of the insulation layer 120 is remained between the support structure 300 and the insulation layer 110, such that in the following dry or wet process, the substrate 100 may be protected by the portion of the insulation layer 120.

In the present embodiment, when other electronic devices are bonded to the array substrate 5, the pins of other electronic devices are not electrically connected to the support structure 300 because an upper surface of the support structure 300 is covered by the insulation layer 140, so that normal operation of the electronic devices is maintained. Nevertheless, the invention is not limited thereto. In some embodiments, the support structure 300 may not be covered by the insulation layer 140, as such, the array substrate 5 may have a thinner thickness.

Based on the above, in the array substrate 5 provided by at least one embodiment of the invention, the support structure 300 is disposed at a position close to the bonding pad 226. Deformation of the bonding area CR of the array substrate 5 generated in a manufacturing process may be reduced by the support structure 300, and that the bonding pad 226 is not deviated from a predetermined position. As such, yield rates of the products are significantly enhanced. In addition, in at least one embodiment of the invention, the deformation of the bonding area CR of the array substrate 5 generated in the manufacturing process is reduced through arrangement of the support structure 300 without adjusting the material of the device array in the array substrate 5 nor adjusting the thickness of each of the film layers in the device array DA. As such, the problem of deformation of the array substrate 5 is resolved without affecting electrical property of the array substrate 5.

Figure 9:
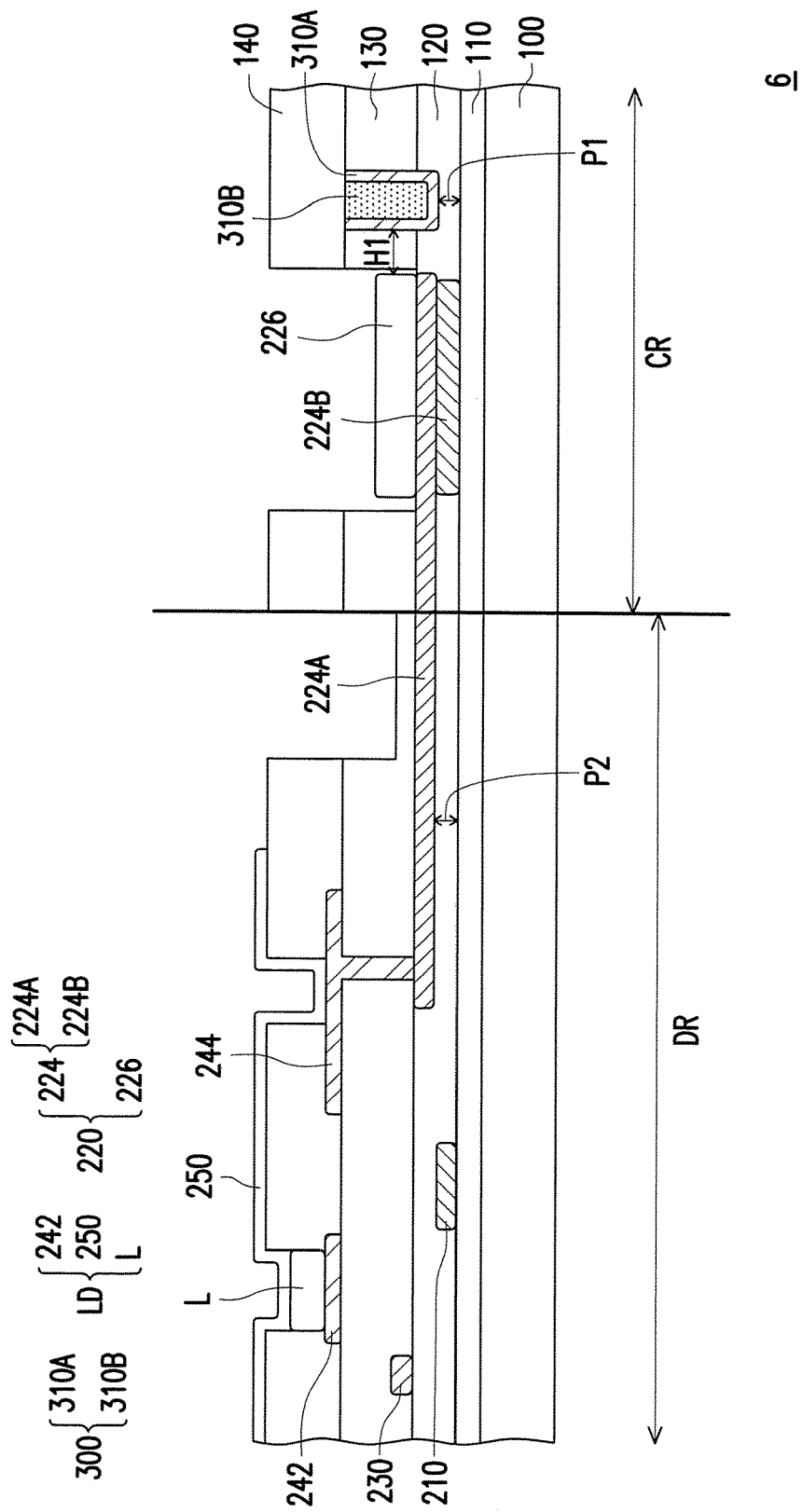
FIG. 9 is a schematic cross-sectional view of an array substrate according to an embodiment of the invention.

FIG. 9 is a schematic cross-sectional view of an array substrate according to an embodiment of the invention. It should be noted that the reference numerals and a part of the contents in the embodiment of FIG. 8 are also used to describe the embodiment of FIG. 9, in which the same reference numerals are used to represent identical or similar elements, and thus descriptions of the same technical contents are omitted. Please refer to the descriptions of the previous embodiment for the omitted contents, which will not be repeated hereinafter.

In the present embodiment, an array substrate 6 includes a substrate 100, an insulation layer 110, an insulation layer 120, an insulation layer 130, an insulation layer 140, a signal line 210, a transduction structure 220, a signal line 230, a signal line 244, a light emitting device LD, and a support structure 300.

In the present embodiment, a bonding pad 226 of the transduction structure 220 is located in a bonding area CR, and the bonding pad 226 is electrically connected to a device array DA. A horizontal distance H1 between the support structure 300 and the bonding pad 226 is between 5 µm and 1000 µm.

In the present embodiment, the support structure 300 includes a first portion 310A and a second portion 310B made of different materials. In an embodiment, the material of the first portion 310A of the support structure 300 includes metal oxide. In an embodiment, the second portion 310B of the support structure 300 is located in the first portion 310A, and the second portion 310B is not in contact with the insulation layer 110. In an embodiment, the material of the second portion 310B, for example, includes metal, silicon oxide, nitric oxide, photoresistant, polymethylmethacrylate (PMMA), hexamethyldisiloxane (HDMSO), ultraviolet curing sealant, or heat curing sealant. In an embodiment, the material of the second portion 310B, for example, is identical to a material of the insulation layer 140. In an embodiment, the first portion 310A and the second portion 310B include a rigid material.

Based on the above, in the array substrate 6 provided by at least one embodiment of the invention, the support structure 300 is disposed at a position close to the bonding pad 226. Deformation of the bonding area CR of the array substrate 6 generated in a manufacturing process may be reduced by the support structure 300, and that the bonding pad 226 is not deviated from a predetermined position. As such, yield rates of the products are significantly enhanced. In addition, in at least one embodiment of the invention, the deformation of the bonding area CR of the array substrate 6 generated in the manufacturing process is reduced through arrangement of the support structure 300 without adjusting the material of the device array in the array substrate 6 nor adjusting the thickness of each of the film layers in the device array. As such, the problem of deformation of the array substrate 6 is resolved without affecting electrical property of the array substrate 6.

Figure 10:
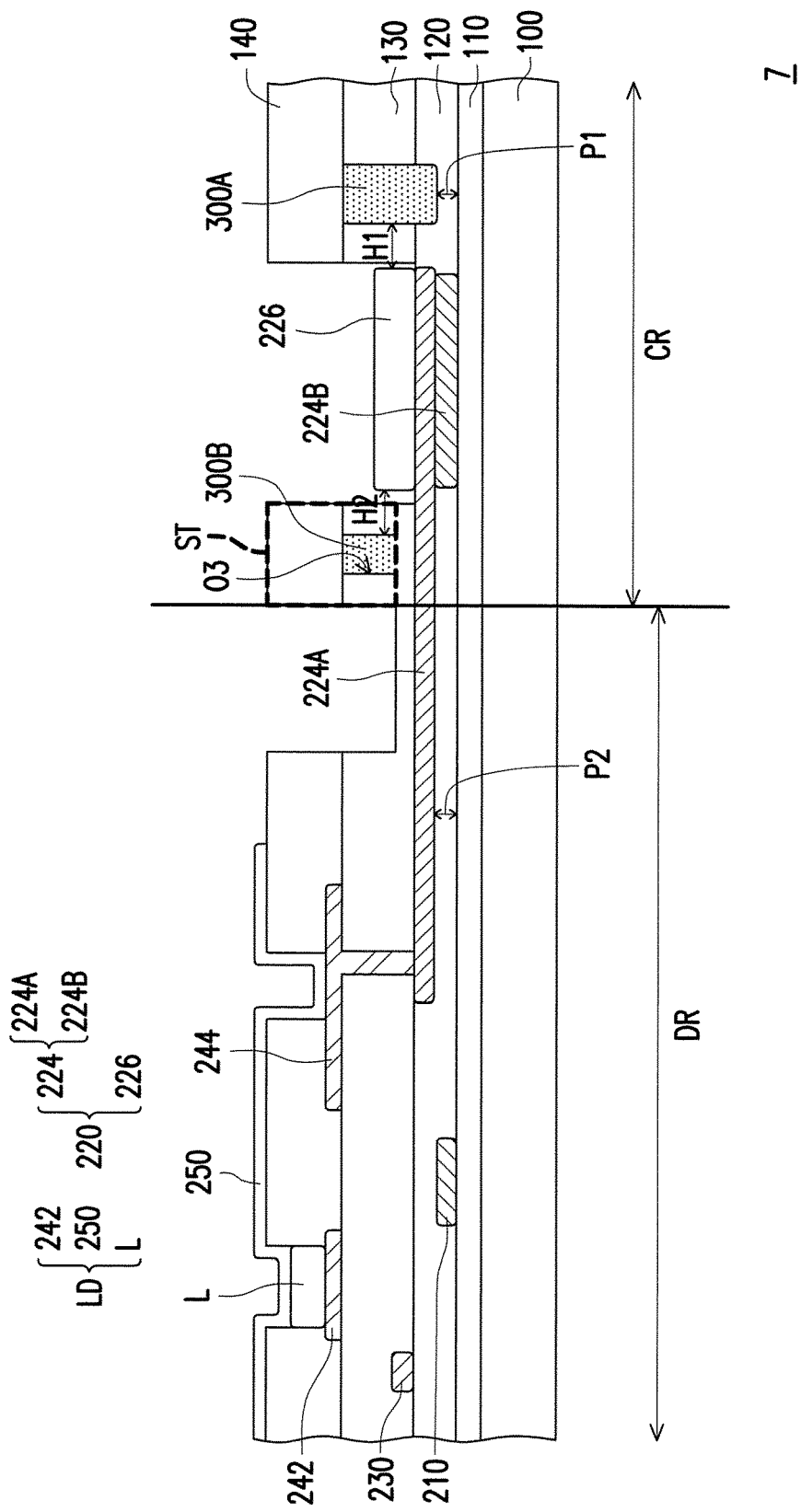
FIG. 10 is a schematic cross-sectional view of an array substrate according to an embodiment of the invention.

FIG. 10 is a schematic cross-sectional view of an array substrate according to an embodiment of the invention. It should be noted that the reference numerals and a part of the contents in the embodiment of FIG. 9 are also used to describe the embodiment of FIG. 10, in which the same reference numerals are used to represent identical or similar elements, and thus descriptions of the same technical contents are omitted. Please refer to the descriptions of the previous embodiment for the omitted contents, which will not be repeated hereinafter.

In the present embodiment, an array substrate 7 includes a substrate 100, an insulation layer 110, an insulation layer 120, an insulation layer 130, an insulation layer 140, a signal line 210, a transduction structure 220, a signal line 230, a signal line 244, a light emitting device LD, a support structure 300A, and an auxiliary structure 300B.

In the present embodiment, a bonding pad 226 of the transduction structure 220 is located in a bonding area CR, and the bonding pad 226 is electrically connected to a device array DA. The support structure 300A is located in the bonding area CR. A horizontal distance H1 between the support structure 300A and the bonding pad 226 is between 5 µm and 1000 µm. In the present embodiment, the support structure 300A is a single-layer structure. In an embodiment, a material of the support structure 300A, for example, includes metal, silicon oxide, nitric oxide, photoresistant, polymethylmethacrylate (PMMA), hexamethyldisiloxane (HDMSO), ultraviolet curing sealant, or heat curing sealant. In an embodiment, the support structure 300A includes a rigid material.

The auxiliary structure 300B is located in an opening O3 of the bonding area CR, and the opening O3, for example, is located in a support pad ST. At least a portion of the auxiliary structure 300B is embedded into the insulation layer 130. A portion of the insulation layer 130 is remained below the opening O3, as such, the capability of the insulation layer 130 to protect the transduction structure 220 is prevented from being lowered. A horizontal distance H2 between the auxiliary structure 300B and the bonding pad 226 is between 5 µm and 1000 µm. In the present embodiment, the support structure 300A and the auxiliary structure 300B may surround at least a portion of the bonding pad 226 together, so as to form a U shape, a circle, a polygon, or other suitable shapes. But the invention is not limited thereto. In some embodiments, a plurality of the support structures 300A and a plurality of the auxiliary structures 300B may be used to be separately arranged at intervals, so as to form a U shape, a circle, a polygon, or other suitable shapes together. In an embodiment, a material of the auxiliary structure 300B is, for example, identical to the material of the support structure 300A. In an embodiment, the support structure 300A and the auxiliary structure 300B, for example, are formed simultaneously. In an embodiment, the auxiliary structure 300B and the support structure 300A respectively include first portions and second portions made of different materials.

In the present embodiment, the support structure 300A and the auxiliary structure 300B are formed after a displaying medium L is formed. As such, particles generated when the support structure 300A and the auxiliary structure 300B are formed are not formed at a predetermined position where the displaying medium L is disposed; thereby, undesired substances such as the particles generated when the support structure 300A/the auxiliary structure 300B are formed are prevented from polluting the displaying medium L. In an embodiment, the array substrate 7 may be a flexible substrate and is formed on a rigid carrier. The support structure 300A and the auxiliary structure 300B are formed before the array substrate 7 is removed from the rigid carrier, so as to prevent the array substrate 7 from being deformed after being removed from the rigid carrier.

Based on the above, in the array substrate 7 provided by at least one embodiment of the invention, the support structure 300A and the auxiliary structure 300B are disposed at positions close to the bonding pad 226. Deformation of the bonding area CR of the array substrate 7 generated in a manufacturing process may be reduced by the support structures 300A and the auxiliary structures 300B, and that the bonding pad 226 is not deviated from a predetermined position. As such, yield rates of the products are significantly enhanced. In at least one embodiment of the invention, the deformation of the bonding area CR of the array substrate 7 generated in the manufacturing process is reduced through arrangement of the support structure 300A and the auxiliary structure 300B without adjusting the material of the device array in the array substrate 7 nor adjusting the thickness of each of the film layers in the device array. As such, the problem of deformation of the array substrate 7 is resolved without affecting electrical property of the array substrate 7.

Figure 11:
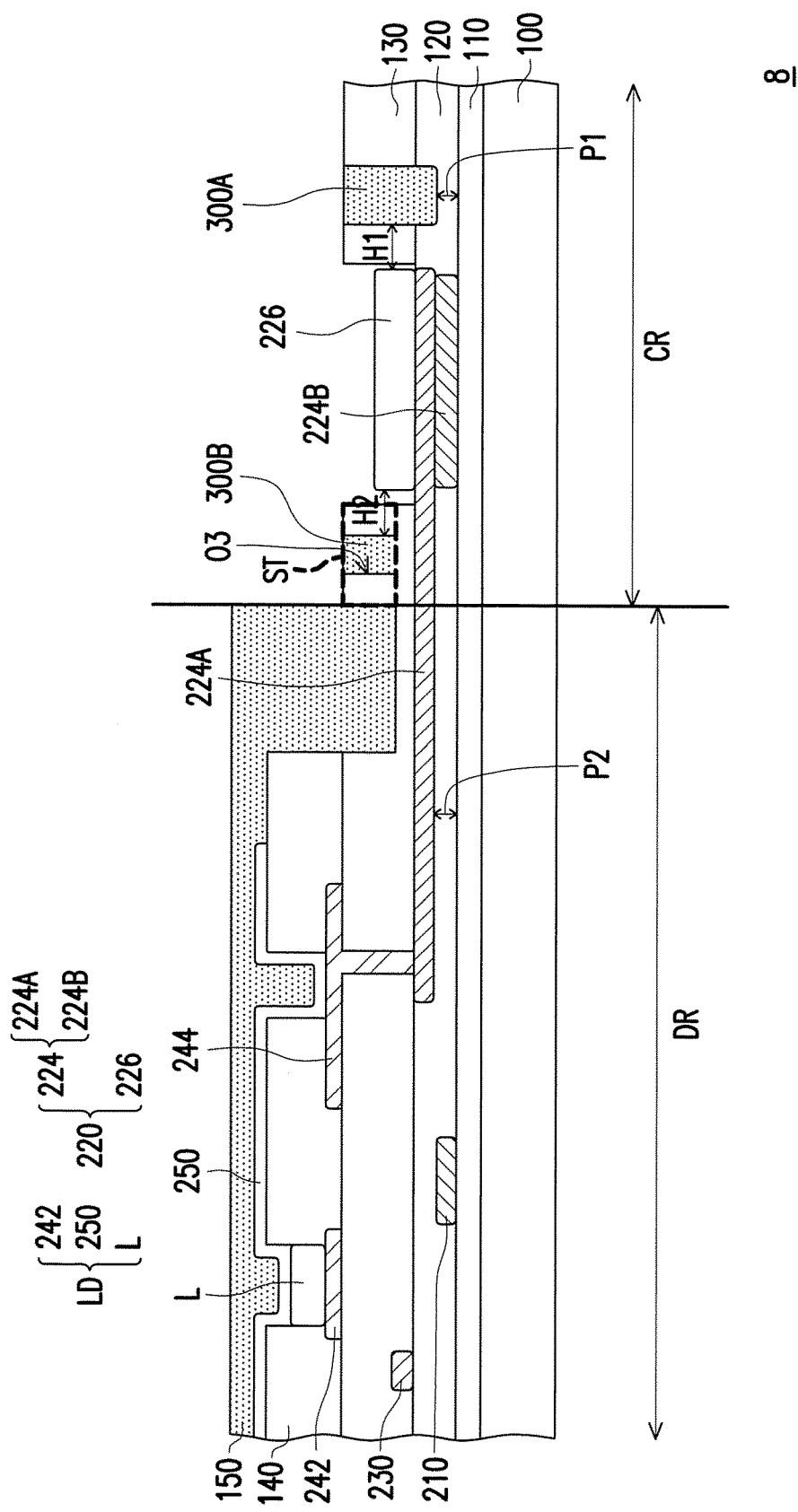
FIG. 11 is a schematic cross-sectional view of an array substrate according to an embodiment of the invention.

FIG. 11 is a schematic cross-sectional view of an array substrate according to an embodiment of the invention. It should be noted that the reference numerals and a part of the contents in the embodiment of FIG. 10 are also used to describe the embodiment of FIG. 11, in which the same reference numerals are used to represent identical or similar elements, and thus descriptions of the same technical contents are omitted. Please refer to the descriptions of the previous embodiment for the omitted contents, which will not be repeated hereinafter.

In the present embodiment, an array substrate 8 includes a substrate 100, an insulation layer 110, an insulation layer 120, an insulation layer 130, an insulation layer 140, a protection layer 150, a signal line 210, a transduction structure 220, a signal line 230, a signal line 244, a light emitting device LD, a support structure 300A, and an auxiliary structure 300B.

In the present embodiment, after the light emitting device LD is formed, the protection layer 150 is formed on the light emitting device LD. The protection layer 150, for example, exposes a bonding area CR of the array substrate 8.

In the present embodiment, a bonding pad 226 of the transduction structure 220 is located in the bonding area CR, and the bonding pad 226 is electrically connected to a device array DA. The support structure 300A is located in the bonding area CR. A horizontal distance H1 between the support structure 300A and the bonding pad 226 is between 5 µm and 1000 µm. In an embodiment, a material of the support structure 300A, for example, includes metal, silicon oxide, nitric oxide, photoresistant, polymethylmethacrylate (PMMA), hexamethyldisiloxane (HDMSO), ultraviolet curing sealant, or heat curing sealant. In an embodiment, the support structure 300A includes a rigid material.

The auxiliary structure 300B is located in an opening O3 of the bonding area CR, and the opening O3, for example, is located in a support pad ST. In the present embodiment, the support pad ST is a single-layer structure and includes a portion of the insulation layer 130. In the present embodiment, at least a portion of the auxiliary structure 300B is embedded into the insulation layer 130. A portion of the insulation layer 130 is remained below the opening O3, as such, the capability of the insulation layer 130 to protect the transduction structure 220 is prevented from being lowered. A horizontal distance H2 between the auxiliary structure 300B and the bonding pad 226 is between 5 µm and 1000 µm. In the present embodiment, the support structure 300A and the auxiliary structure 300B may surround at least a portion of the bonding pad 226 together, so as to form a U shape, a circle, a polygon, or other suitable shapes. But the invention is not limited thereto. A plurality of the support structures 300A and a plurality of the auxiliary structures 300B may be used to be separately arranged at intervals, so as to form a U shape, a circle, a polygon, or other suitable shapes together. In an embodiment, a material of the auxiliary structure 300B is, for example, identical to the material of the support structure 300A. In an embodiment, the support structure 300A and the auxiliary structure 300B, for example, are formed simultaneously. In an embodiment, the auxiliary structure 300B and the support structure 300A respectively include first portions and second portions made of different materials.

In the present embodiment, the support structure 300A and the auxiliary structure 300B are not covered by the insulation layer 140, and the support structure 300A and the auxiliary structure 300B may be formed simultaneously with the protection layer 150 and may be made of a material identical to that of the protection layer 150.

In an array area DR, the protection layer 150 may cover at least a portion of a side surface of the insulation layer 140 and may be embedded in the insulation layer 130, but the invention is not limited thereto.

Based on the above, in the array substrate 8 provided by at least one embodiment of the invention, the support structure 300A and the auxiliary structure 300B are disposed at positions close to the bonding pad 226. Deformation of the bonding area CR of the array substrate 8 generated in a manufacturing process may be reduced by the support structure 300A and the auxiliary structure 300B, and that the bonding pad 226 is not deviated from a predetermined position. As such, yield rates of the products are significantly enhanced. In addition, in at least one embodiment of the invention, the deformation of the bonding area CR of the array substrate 8 generated in the manufacturing process is reduced through arrangement of the support structure 300A and the auxiliary structure 300B without adjusting the material of the device array in the array substrate 8 nor adjusting the thickness of each of the film layers in the device array. As such, the problem of deformation of the array substrate 8 is resolved without affecting electrical property of the array substrate 8.

Figure 12:
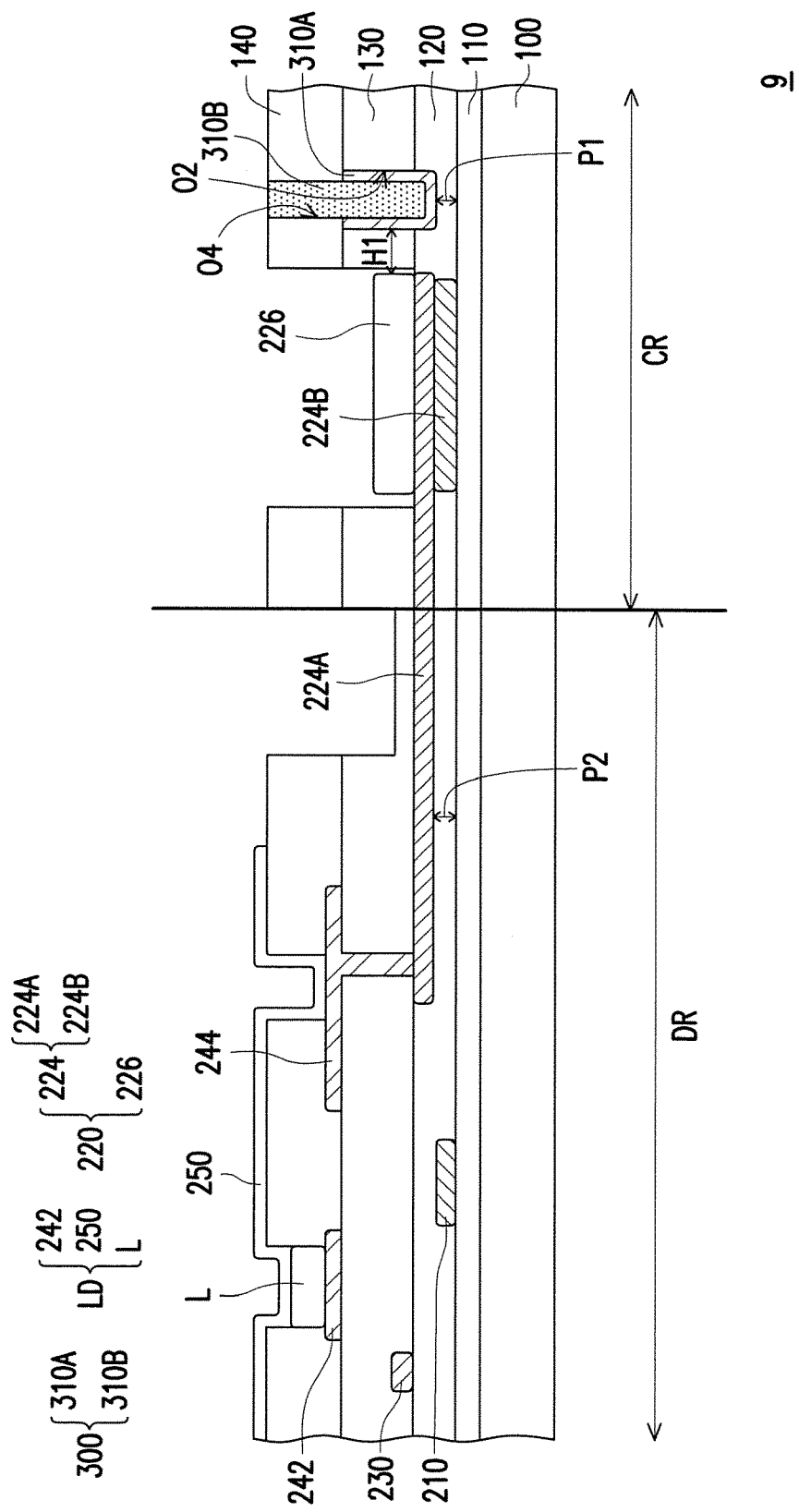
FIG. 12 is a schematic cross-sectional view of an array substrate according to an embodiment of the invention.

FIG. 12 is a schematic cross-sectional view of an array substrate according to an embodiment of the invention. It should be noted that the reference numerals and a part of the contents in the embodiment of FIG. 9 are also used to describe the embodiment of FIG. 12, in which the same reference numerals are used to represent identical or similar elements, and thus descriptions of the same technical contents are omitted. Please refer to the descriptions of the previous embodiment for the omitted contents, which will not be repeated hereinafter.

In the present embodiment, an array substrate 9 includes a substrate 100, an insulation layer 110, an insulation layer 120, an insulation layer 130, an insulation layer 140, a signal line 210, a transduction structure 220, a signal line 230, a signal line 244, a light emitting device LD, and a support structure 300.

In the present embodiment, a bonding pad 226 of the transduction structure 220 is located in a bonding area CR, and the bonding pad 226 is electrically connected to a device array DA. A horizontal distance H1 between the support structure 300 and the bonding pad 226 is between 5 μm and 1000 μm.

In the present embodiment, the support structure 300 includes a first portion 310A and a second portion 310B made of different materials. In the present embodiment, the first portion 310A of the support structure 300 is embedded in the insulation layer 120 and the insulation layer 130 and is not embedded in the insulation layer 140. In the present embodiment, the second portion 310B of the support structure 300 is embedded in the insulation layer 120, the insulation layer 130, and the insulation layer 140.

In an embodiment, after the insulation layer 130 is formed, an opening O2 is formed in the insulation layer 120 and the insulation layer 130. Next, the first portion 310A is formed in the opening O2 and is conformal with an inner surface of the opening O2. After the first portion 310A of the support structure 300 is formed, the insulation layer 140 is formed on the first portion 310A. Next, an opening O4 corresponding to the opening O2 is formed on the insulation layer 140, and the second portion 310B of the support structure 300 fills the opening O4. An upper surface of the second portion 310B of the support structure 300 and an upper surface of the insulation layer 140 are at same level as shown in FIG. 12. In other embodiments, after the insulation layer 130 is formed on the insulation layer 120, the opening O2 is formed in the insulation layer 120 and the insulation layer 130. Afterwards, a first portion material layer is formed to fill the opening O2, and next, the insulation layer 140 is formed thereon. Moreover, the opening O4 is formed which at least penetrates through the insulation layer 140 and does not penetrate through a portion of the first portion material layer located in the opening O2 for forming the first portion 310A. The second portion 310B of the support structure 300 then fills the opening O4.

In the present embodiment, the second portion 310B of the support structure 300 is formed only after a displaying medium L is formed, as such, undesired substances such as particles generated when the second portion 310B is formed are prevented from polluting the displaying medium L.

Based on the above, in the array substrate 9 provided by at least one embodiment of the invention, the support structure 300 is disposed at a position close to the bonding pad 226. Deformation of the bonding area CR of the array substrate 9 generated in a manufacturing process may be reduced by the support structure 300, and that the bonding pad 226 is not deviated from a predetermined position. As such, yield rates of the products are significantly enhanced. In addition, in at least one embodiment of the invention, the deformation of the bonding area CR of the array substrate 9 generated in the manufacturing process is reduced through arrangement of the support structure 300 without adjusting the material of the device array in the array substrate 9 nor adjusting the thickness of each of the film layers in the device array. As such, the problem of deformation of the array substrate 9 is resolved without affecting electrical property of the array substrate 9.

Figure 13:
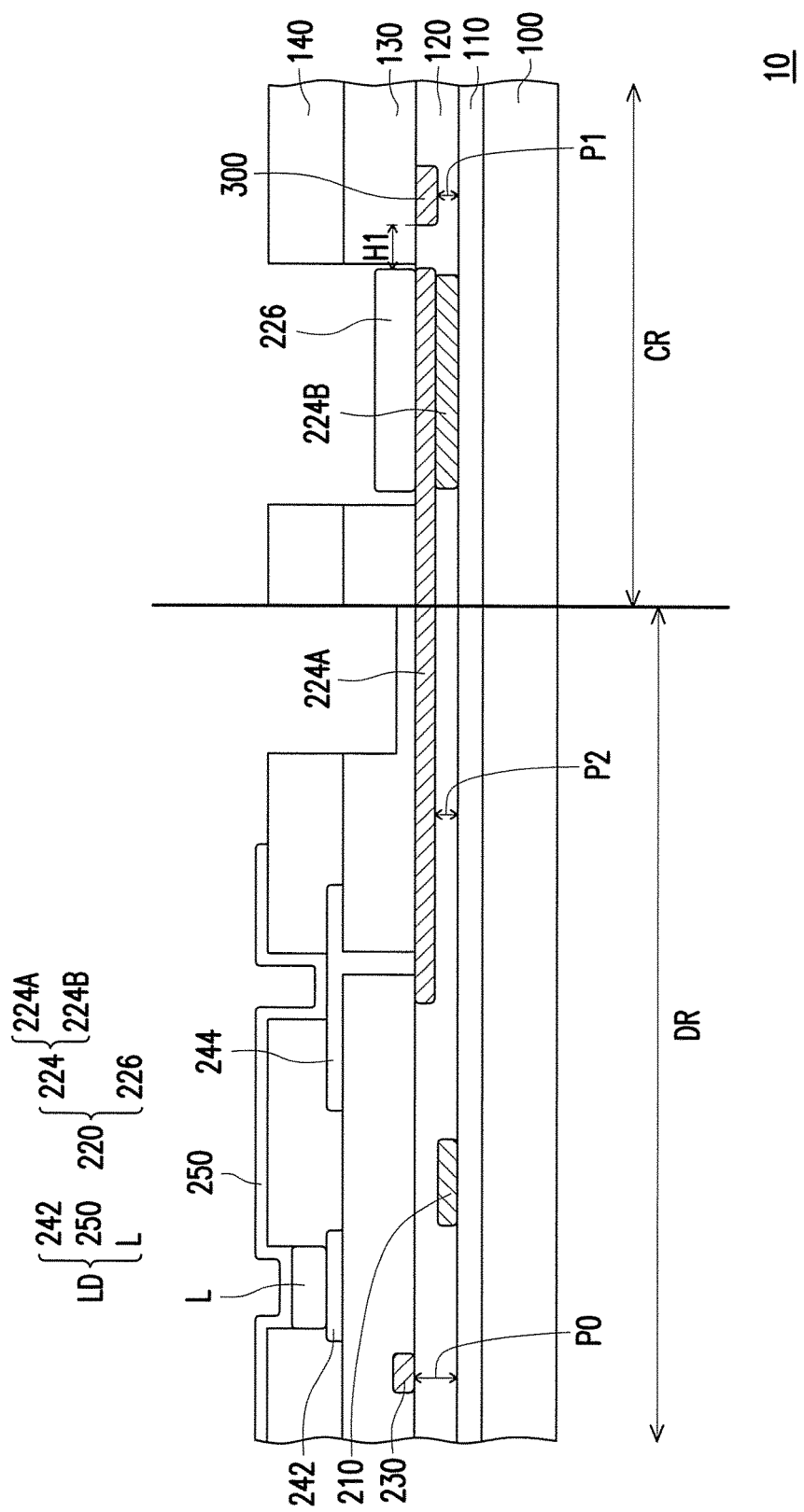
FIG. 13 is a schematic cross-sectional view of an array substrate according to an embodiment of the invention.

FIG. 13 is a schematic cross-sectional view of an array substrate according to an embodiment of the invention. It should be noted that the reference numerals and a part of the contents in the embodiment of FIG. 9 are also used to describe the embodiment of FIG. 13, in which the same reference numerals are used to represent identical or similar elements, and thus descriptions of the same technical contents are omitted. Please refer to the descriptions of the previous embodiment for the omitted contents, which will not be repeated hereinafter.

In the present embodiment, an array substrate 10 includes a substrate 100, an insulation layer 110, an insulation layer 120, an insulation layer 130, an insulation layer 140, a signal line 210, a transduction structure 220, a signal line 230, a signal line 244, a light emitting device LD, and a support structure 300.

In the present embodiment, a bonding pad 226 of the transduction structure 220 is located in a bonding area CR, and the bonding pad 226 is electrically connected to a device array DA. A horizontal distance H1 between the support structure 300 and the bonding pad 226 is between 5 μm and 1000 μm.

In the present embodiment, the support structure 300 is located between the insulation layer 110 and the insulation layer 130. In an embodiment, the support structure 300, the signal line 230, and a second layer 224A of the conductive layer 224 belong to a same patterned film layer, and a material of the support structure 300 includes metal. In the present embodiment, the support structure 300 is embedded in the insulation layer 120.

In an embodiment, the signal line 230 is located on an upper surface of the insulation layer 120, and a vertical distance P0 between the signal line 230 and the insulation layer 110 is approximately equal to a thickness of the insulation layer 120. In an embodiment, the second layer 224A of the conductive layer 224 and the support structure 300 are both formed in a trench of the insulation layer 120, as such, a lower surface of the second layer 224A and a lower surface of the support structure 300 are lower than a lower surface of the signal line 230. In an embodiment, a vertical distance P2 is provided between the second layer 224A and an upper surface of the insulation layer 110. The vertical distance P2, for example, is between 0 μm and 0.6 μm. In an embodiment, a vertical distance P1 is provided between the support structure 300 and the insulation layer 110. The vertical distance P1, for example, is between 0 μm and 0.6 μm. In some embodiments, a relationship among the vertical distances may be P0>P2>P1.

Based on the above, in the array substrate 10 provided by at least one embodiment of the invention, the support structure 300 is disposed at a position close to the bonding pad 226. Deformation of the bonding area CR of the array substrate 10 generated in a manufacturing process may be reduced by the support structure 300, and that the bonding pad 226 is not deviated from a predetermined position. As such, yield rates of the products are significantly enhanced. In addition, in at least one embodiment of the invention, the deformation of the bonding area CR of the array substrate 10 generated in the manufacturing process is reduced through arrangement of the support structure 300 without adjusting the material of the device array in the array substrate 10 nor adjusting the thickness of each of the film layers in the device array. As such, the problem of deformation of the array substrate 10 is resolved without affecting electrical property of the array substrate 10.

Figure 14:
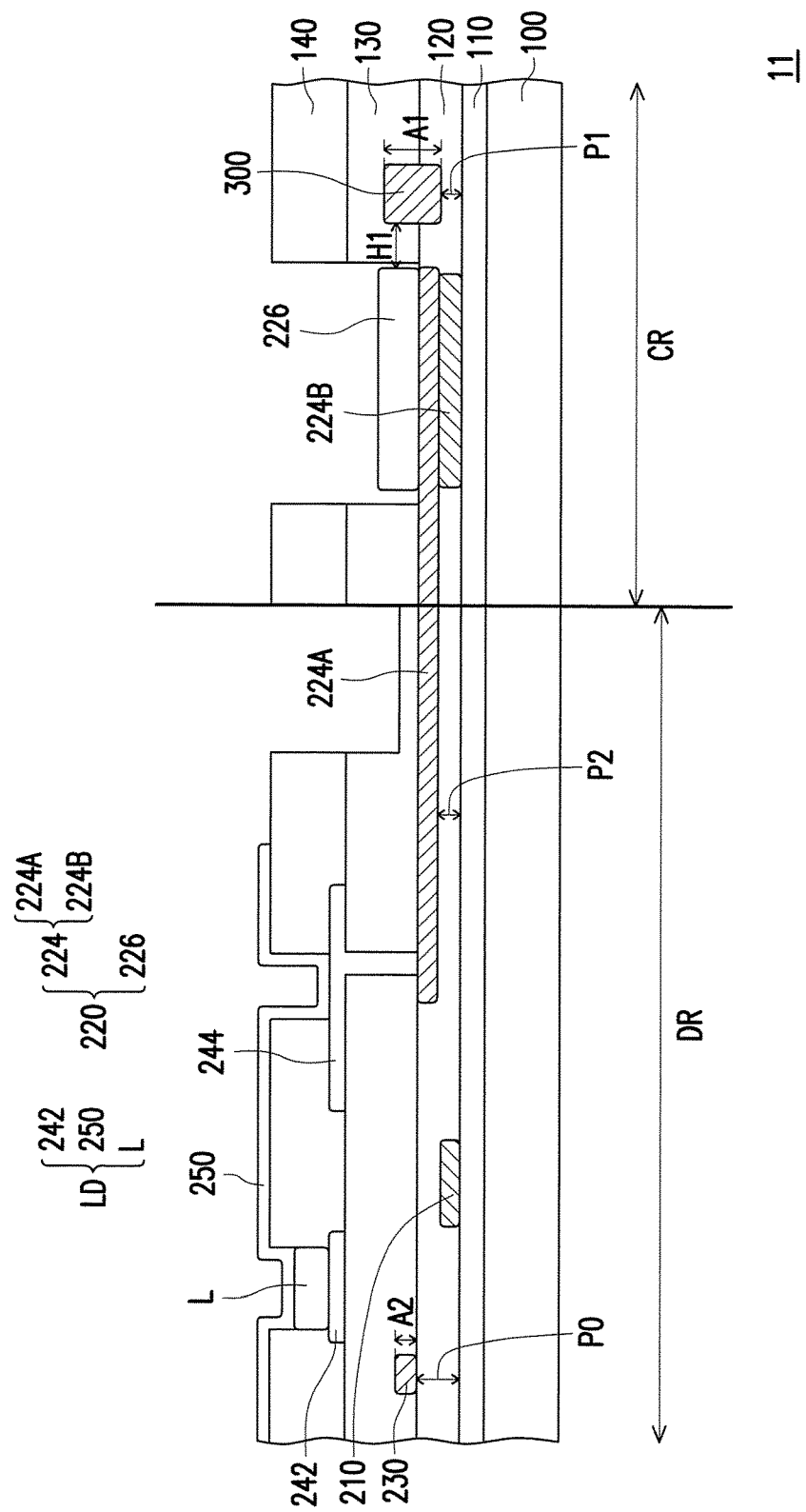
FIG. 14 is a schematic cross-sectional view of an array substrate according to an embodiment of the invention.

FIG. 14 is a schematic cross-sectional view of an array substrate according to an embodiment of the invention. It should be noted that the reference numerals and a part of the contents in the embodiment of FIG. 13 are also used to describe the embodiment of FIG. 14, in which the same reference numerals are used to represent identical or similar elements, and thus descriptions of the same technical contents are omitted. Please refer to the descriptions of the previous embodiment for the omitted contents, which will not be repeated hereinafter.

In the present embodiment, an array substrate 11 includes a substrate 100, an insulation layer 110, an insulation layer 120, an insulation layer 130, an insulation layer 140, a signal line 210, a transduction structure 220, a signal line 230, a signal line 244, a light emitting device LD, and a support structure 300.

In the present embodiment, a bonding pad 226 of the transduction structure 220 is located in a bonding area CR, and the bonding pad 226 is electrically connected to a device array DA. A horizontal distance H1 between the support structure 300 and the bonding pad 226 is between 5 μm and 1000 μm.

In the present embodiment, the support structure 300 is embedded in the insulation layer 120 and the insulation layer 130. In the present embodiment, a thickness A1 of the support structure 300 is between 0.05 μm and 0.6 μm. A thickness A2 of the signal line 230 is between 0.05 μm and 0.6 μm. In the present embodiment, the thickness A1 of the support structure 224B is greater than the thickness A2 of the signal line 230. In an embodiment, a bottom surface of the support structure 300 is lower than a bottom surface of the signal line 230, and a top surface of the support structure 300 is higher than a top surface of the signal line 230. In an embodiment, the bottom surface of the support structure 300 is lower than a bottom surface of a second layer 224A of a conductive layer 224, and the top surface of the support structure 300 is higher than a top surface of the second layer 224A.

Based on the above, in the array substrate 11 provided by at least one embodiment of the invention, the support structure 300 is disposed at a position close to the bonding pad 226. Deformation of the bonding area CR of the array substrate 11 generated in a manufacturing process may be reduced by the support structure 300, and that the bonding pad 226 is not deviated from a predetermined position. As such, yield rates of the products are significantly enhanced. In addition, in at least one embodiment of the invention, the deformation of the bonding area CR of the array substrate 11 generated in the manufacturing process is reduced through arrangement of the support structure 300 without adjusting the material of the device array in the array substrate 11 nor adjusting the thickness of each of the film layers in the device array. As such, the problem of deformation of the array substrate 11 is resolved without affecting electrical property of the array substrate 11.

Figure 15:
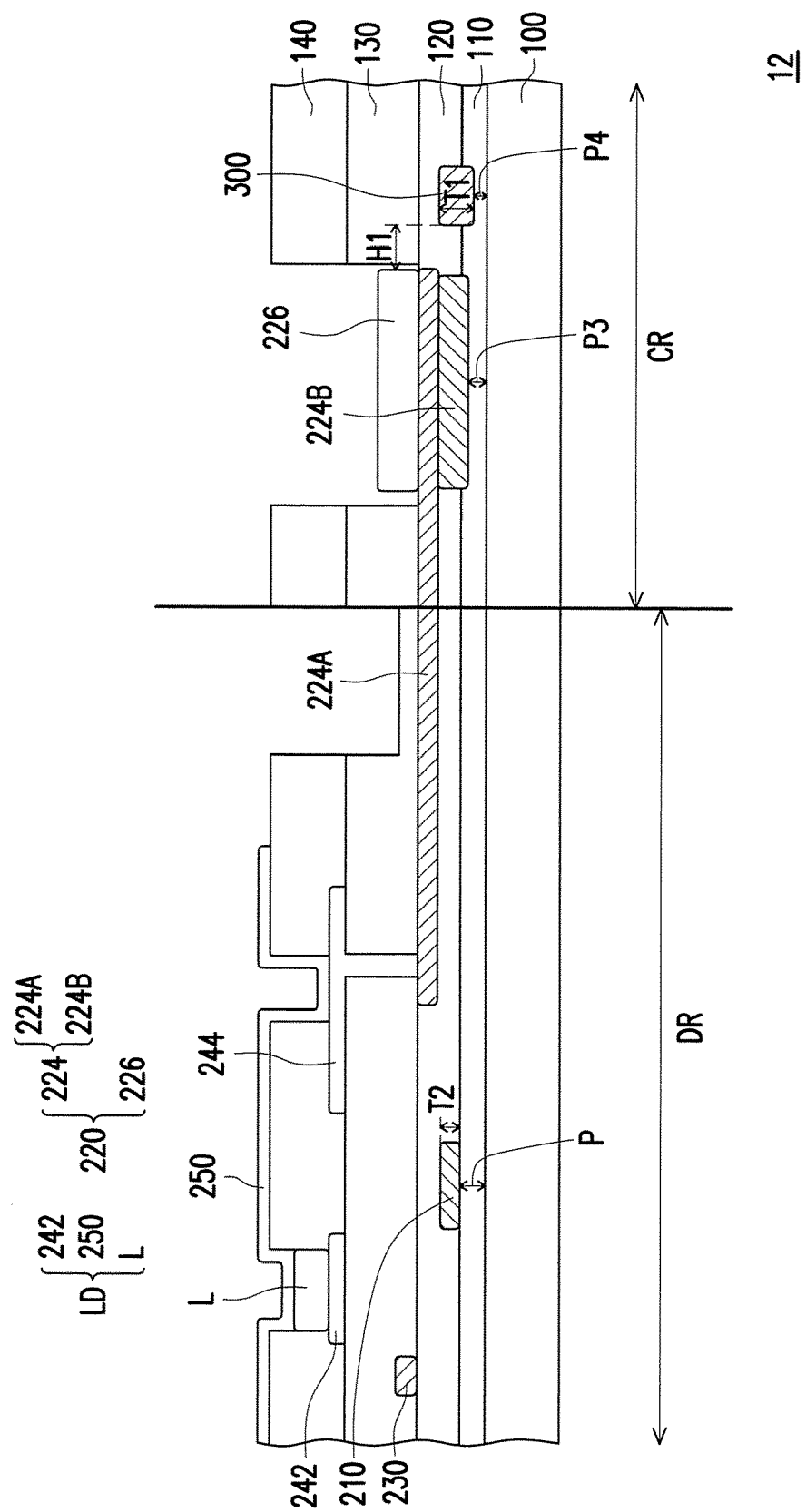
FIG. 15 is a schematic cross-sectional view of an array substrate according to an embodiment of the invention.

FIG. 15 is a schematic cross-sectional view of an array substrate according to an embodiment of the invention. It should be noted that the reference numerals and a part of the contents in the embodiment of FIG. 14 are also used to describe the embodiment of FIG. 15, in which the same reference numerals are used to represent identical or similar elements, and thus descriptions of the same technical contents are omitted. Please refer to the descriptions of the previous embodiment for the omitted contents, which will not be repeated hereinafter.

In the present embodiment, an array substrate 12 includes a substrate 100, an insulation layer 110, an insulation layer 120, an insulation layer 130, an insulation layer 140, a signal line 210, a transduction structure 220, a signal line 230, a signal line 244, a light emitting device LD, and a support structure 300.

In the present embodiment, a bonding pad 226 of the transduction structure 220 is located in a bonding area CR, and the bonding pad 226 is electrically connected to a device array DA. A horizontal distance H1 between the support structure 300 and the bonding pad 226 is between 5 μm and 1000 μm.

In the present embodiment, the support structure 300 is located between the substrate 100 and the insulation layer 130. In the present embodiment, the support structure 300 is embedded in the insulation layer 110 and the insulation layer 120. In an embodiment, the signal line 210, a first layer 224B of a conductive layer 224, and the support structure 300 belong to a same patterned film layer. A material of the support structure 300 includes metal. A thickness T1 of the support structure 300 is between 0.05 μm and 0.6 μm. A thickness T2 of the signal line 210 is between 0.05 μm and 0.6 μm. In the present embodiment, the thickness T1 of the support structure 300 is greater than the thickness T2 of the signal line 210.

In an embodiment, the signal line 210 is located on an upper surface of the insulation layer 110, and a vertical distance P between the signal line 210 and the substrate 100 is approximately equal to a thickness of the insulation layer 110. In an embodiment, the first layer 224B of the transduction structure 220 and the support structure 300 are both formed in a trench of the insulation layer 110 or embedded into the insulation layer 110, as such, a lower surface of the first layer 224B and a lower surface of the support structure 300 are lower than a lower surface of the signal line 210. In an embodiment, the first layer 224B of the conductive layer 224 located in the bonding area CR is embedded in the insulation layer 110 and the insulation layer 120. A vertical distance P3 is provided between the first layer 224B and an upper surface of the substrate 100, and the vertical distance P3, for example, is between 0 μm and 1 μm. In an embodiment, a vertical distance P4 is provided between the support structure 300 and the upper surface of the substrate 100, and the vertical distance P4, for example, is between 0 μm and 1 μm. A portion of the support structure 300 is embedded in the insulation layer 110, and a portion of the insulation layer 110 is remained between the support structure 300 and the substrate 100. Therefore, the support structure 300 can effectively break a stress in the insulation layer 110, and that the array substrate 12 is less susceptible to deformation.

Based on the above, in the array substrate 12 provided by at least one embodiment of the invention, the support structure 300 is disposed at a position close to the bonding pad 226. Deformation of the bonding area CR of the array substrate 12 generated in a manufacturing process may be reduced by the support structure 300, and that the bonding pad 226 is not deviated from a predetermined position. As such, yield rates of the products are significantly enhanced. In addition, in at least one embodiment of the invention, the deformation of the bonding area CR of the array substrate 12 generated in the manufacturing process is reduced through arrangement of the support structure 300 without adjusting the material of the device array in the array substrate 12 nor adjusting the thickness of each of the film layers in the device array. As such, the problem of deformation of the array substrate 12 is resolved without affecting electrical property of the array substrate 12.

Figure 16:
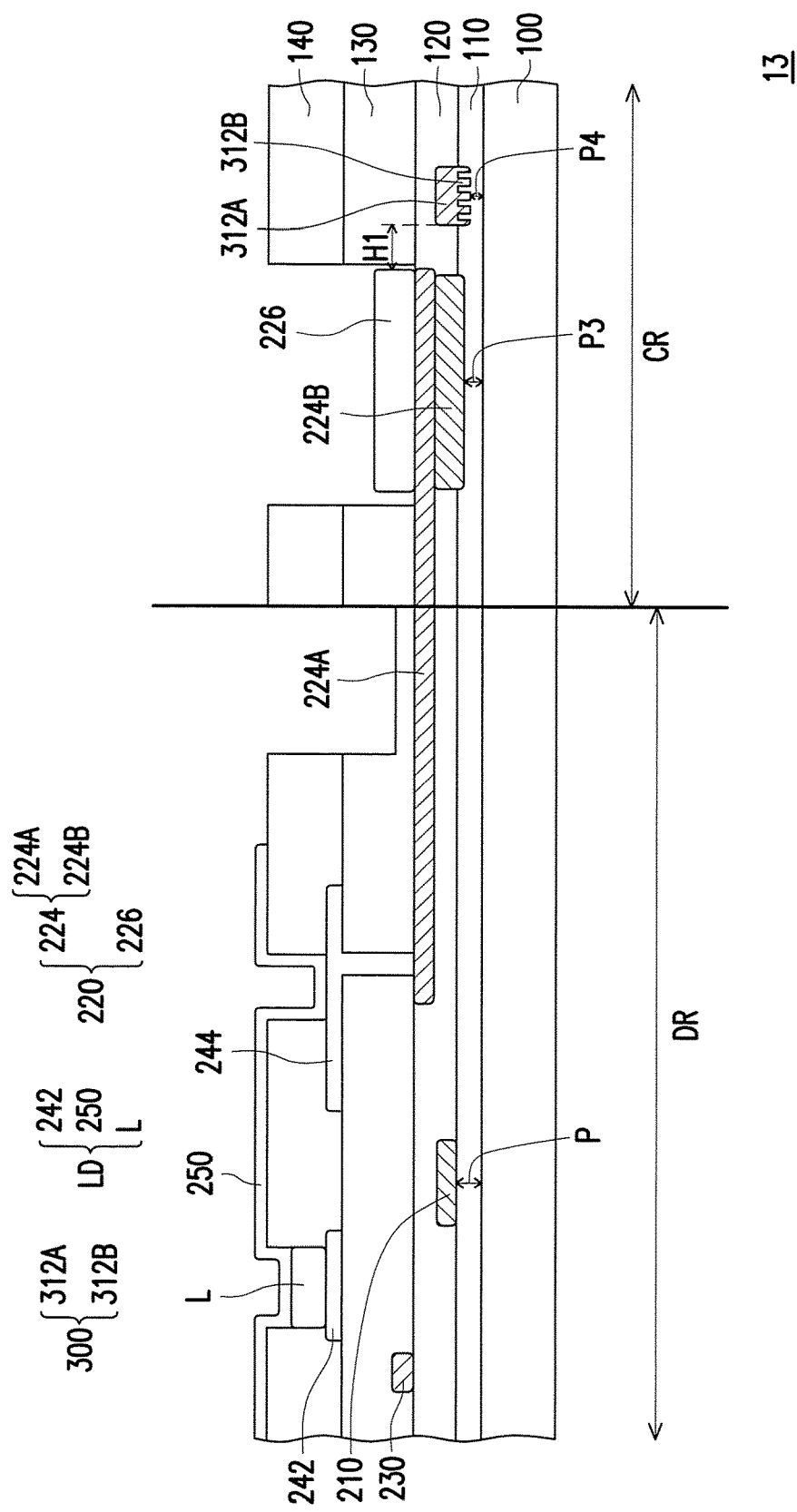
FIG. 16 is a schematic cross-sectional view of an array substrate according to an embodiment of the invention.

FIG. 16 is a schematic cross-sectional view of an array substrate according to an embodiment of the invention. It should be noted that the reference numerals and a part of the contents in the embodiment of FIG. 15 are also used to describe the embodiment of FIG. 16, in which the same reference numerals are used to represent identical or similar elements, and thus descriptions of the same technical contents are omitted. Please refer to the descriptions of the previous embodiment for the omitted contents, which will not be repeated hereinafter.

In the present embodiment, an array substrate 13 includes a substrate 100, an insulation layer 110, an insulation layer 120, an insulation layer 130, an insulation layer 140, a signal line 210, a transduction structure 220, a signal line 230, a signal line 244, a light emitting device LD, and a support structure 300.

In the present embodiment, a bonding pad 226 of the transduction structure 220 is located in a bonding area CR, and the bonding pad 226 is electrically connected to a device array DA. A horizontal distance H1 between the support structure 300 and the bonding pad 226 is between 5 μm and 1000 μm.

In the present embodiment, the support structure 300 is located between the substrate 100 and the insulation layer 130. In the present embodiment, the support structure 300 is embedded in the insulation layer 110 and the insulation layer 120. In an embodiment, the signal line 210, a first layer 224B of a conductive layer 224, and the support structure 300 belong to a same patterned film layer. A material of the support structure 300 includes metal.

In the present embodiment, the support structure 300 includes a main body portion 312A embedded in the insulation layer 120 and a plurality of fork-like portions 312B extending from the main body portion 312A towards the insulation layer 110. The fork-like portions 312B are embedded in the insulating layer 110. In an embodiment, the fork-like portions 312B, for example, are alternatively arranged with a portion of the insulation layer 110. In the present embodiment, a contact area between the support structure 300 and the insulation layer 110 is increased through arrangement of the fork-like portions 312B, as such, a relative position between the support structure 300 and the insulation layer 110 is fixed, and thus the array substrate 13 is further prevented from being deformed.

Based on the above, in the array substrate 13 provided by at least one embodiment of the invention, the support structure 300 is disposed at a position close to the bonding pad 226. Deformation of the bonding area CR of the array substrate 13 generated in a manufacturing process may be reduced by the support structure 300, and that the bonding pad 226 is not deviated from a predetermined position. As such, yield rates of the products are significantly enhanced. In addition, in at least one embodiment of the invention, the deformation of the bonding area CR of the array substrate 13 generated in the manufacturing process is reduced through arrangement of the support structure 300 without adjusting the material of the device array in the array substrate 13 nor adjusting the thickness of each of the film layers in the device array. As such, the problem of deformation of the array substrate 13 is resolved without affecting electrical property of the array substrate 13.

Figure 17A:
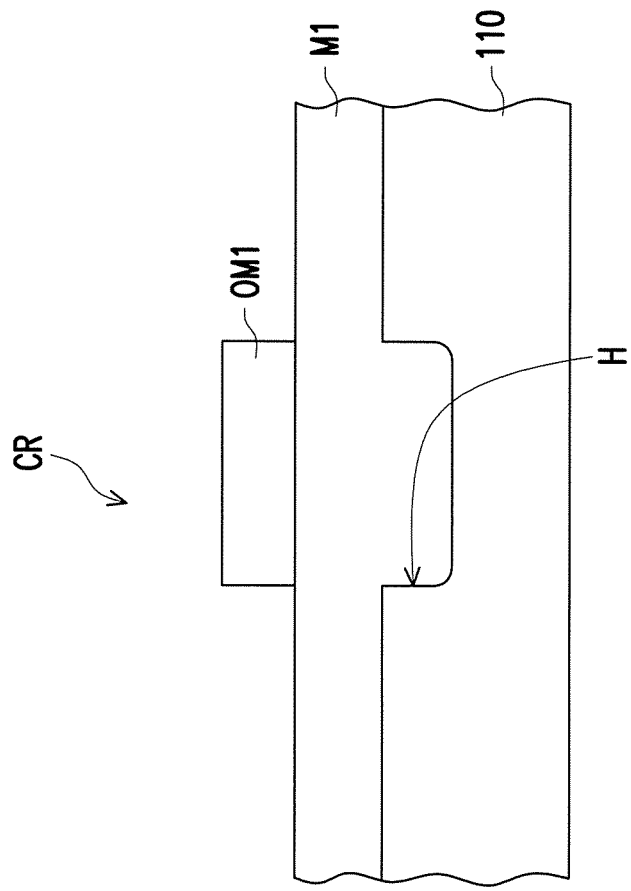
FIG. 17A to FIG. 17C are schematic cross-sectional views of a manufacturing process of a support structure and a signal line according to an embodiment of the invention.
Figure 17A:
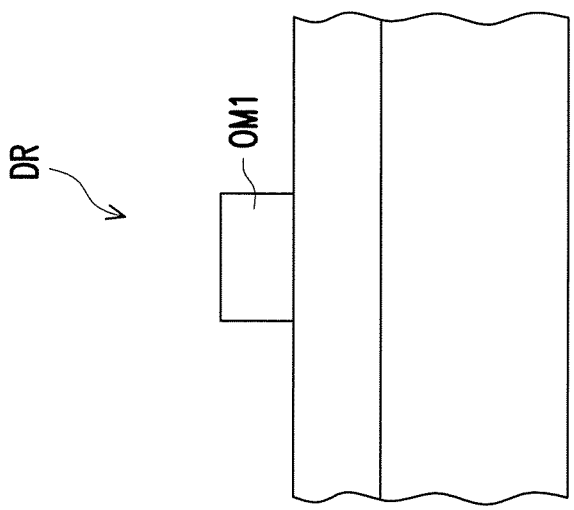
Figure 17B:
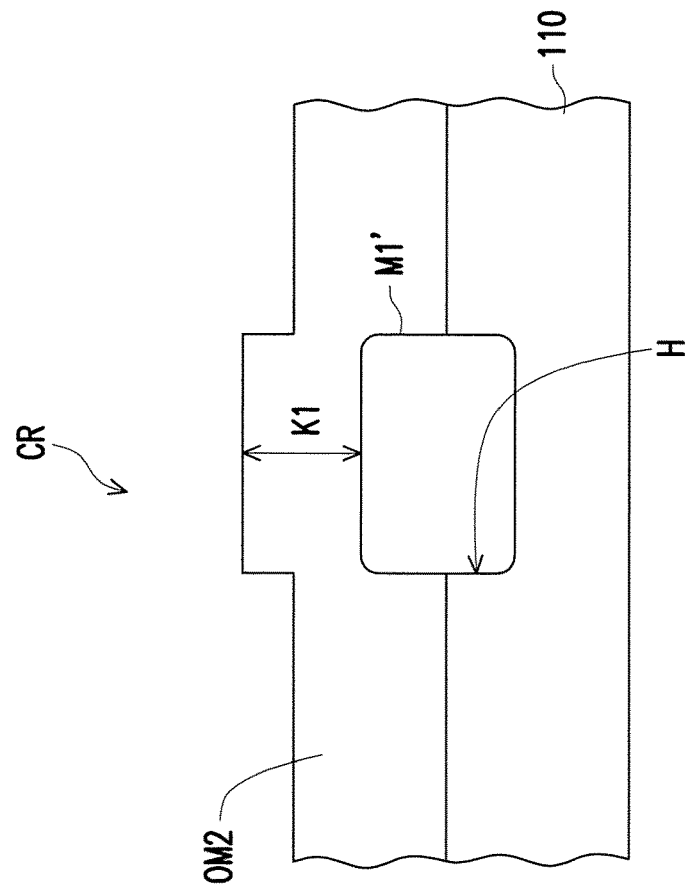
Figure 17B:
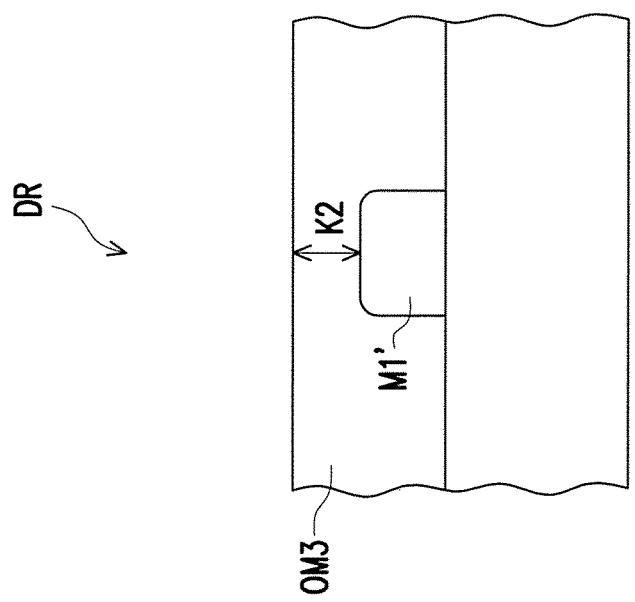
Figure 17C:
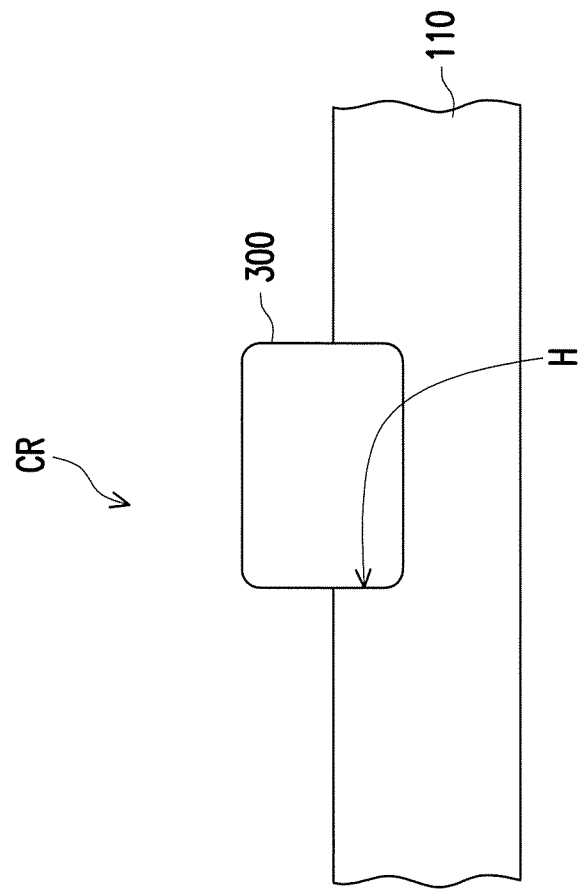
Figure 17C:
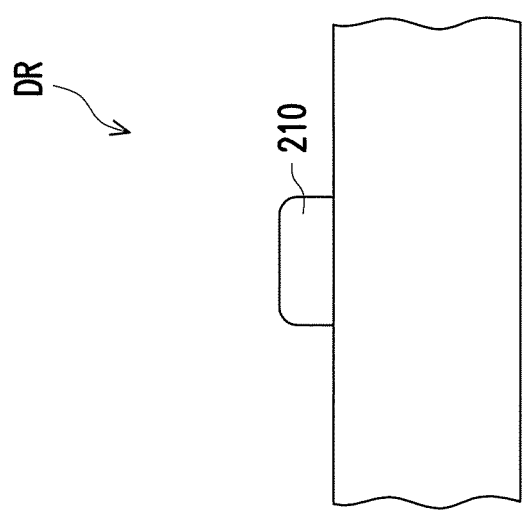

FIG. 17A to FIG. 17C are schematic cross-sectional views of a manufacturing process of a support structure and a signal line according to an embodiment of the invention. It should be noted that the reference numerals and a part of the contents in the embodiment of FIG. 15 are also used to describe the embodiments of FIG. 17A to FIG. 17C, in which the same reference numerals are used to represent identical or similar elements, and thus descriptions of the same technical contents are omitted. Please refer to the descriptions of the previous embodiment for the omitted contents, which will not be repeated hereinafter.

Referring to FIG. 17A, in the present embodiment, after a trench H is formed in an insulation layer 110, a conductive material layer M1 is formed on the insulation layer 110. The conductive material layer M1 covers the insulation layer 110, and a portion of the conductive material layer M1 fills the trench H. Although in the present embodiment, an upper surface of the conductive material layer M1 is a planar surface, the invention is not limited thereto. In some embodiments, a portion of the upper surface of the conductive material layer M1 is recessed at the trench H, as such, an upper surface of the conductive material layer M1 in the trench H is lower than an upper surface of the conductive material layer M1 outside the trench H.

In some embodiments, the conductive material layer M1 may include a single-layer structure or a multi-layer structure, for instance, may include a single-layer structure or a multi-layer structure composed of titanium, aluminum, molybdenum, copper, gold, silver, other conductive materials, or a combination thereof.

An photoresistant OM1 is provided on the conductive material layer M1. The photoresistant OM1 has a plurality of openings, and the openings in an array area DR, for example, correspond to positions other than a position where the signal line 210 is to be formed, and the openings in a bonding area CR, for example, correspond to positions other than a position where a support structure 300 is to be formed. Next, the conductive material layer M1 is etched, so as to transfer a pattern of the photoresistant OM1 onto the conductive material layer M1.

Referring to FIG. 17B, the pattern of the photoresistant OM1 is transferred onto the conductive material layer M1, so as to form a conductive material layer M1'. The conductive material layer M1' in the array area DR, for example, corresponds to the position where the signal line 210 is to be formed, and the conductive material layer M1' in the bonding area CR, for example, corresponds to the position where the support structure 300 is to be formed. Next, a photoresistant OM2 and a photoresistant OM3 are provided on the conductive material layer M1'. Photoresistant OM2 and a photoresistant OM3 may belong to a same patterned layer. A thickness K1 of the photoresistant OM2 corresponding to the position where the support structure 300 is to be formed is greater than a thickness K2 of the photoresistant OM3 corresponding to the position where the signal line 210 is to be formed. Next, the conductive material layer M1' is etched, so as to transfer patterns of the photoresistant OM2 and the photoresistant OM3.

Referring to FIG. 17C, since the thickness K1 is greater than the thickness K2, an upper surface of the support structure 300 corresponding to the photoresistant OM2 is higher than an upper surface of the signal line 210 corresponding to the photoresistant OM3. In addition, since at least a portion of the support structure 300 is formed in the trench H of the insulation layer 110, a lower surface of the support structure 300 corresponding to the trench H is lower than a lower surface of the signal line 210.

Although the support structure 300 and the signal line 210 belong to a same patterned film layer as shown in FIG. 17A to FIG. 17C, the invention is not limited thereto. In some embodiments, (e.g., the embodiment of FIG. 13 and FIG. 14), the support structure 300 and the signal line 230 belong to a same patterned film layer.

Based on the above, in at least one embodiment of the invention, the support structure 300 and the signal line 210 are formed simultaneously, and no additional process is required to form the support structure 300. In addition, as the support structure 300 may have a thicker thickness, the support structure 300 can thus preferably break a stress in the insulation layer, and that the array substrate is less susceptible to deformation. As such, yield rates of the products are significantly enhanced. In addition, in at least one embodiment of the invention, the deformation of the bonding area CR of the array substrate generated in the manufacturing process is reduced through arrangement of the support structure 300 without adjusting the material of the device array in the array substrate nor adjusting the thickness of each of the film layers in the device array. As such, the problem of deformation of the array substrate is resolved without affecting electrical property of the array substrate.

Figure 18A:
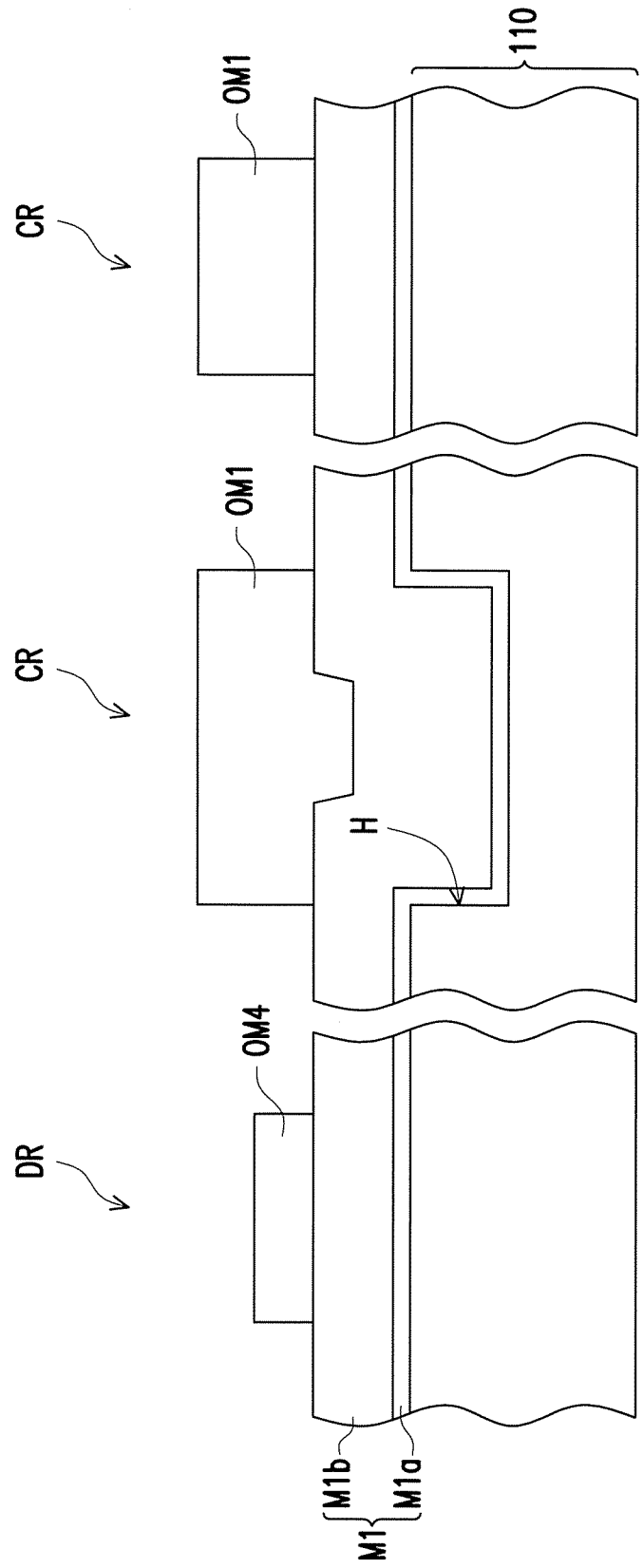
FIG. 18A to FIG. 18C are schematic cross-sectional views of a manufacturing process of a support structure, an auxiliary structure, and a signal line according to an embodiment of the invention.
Figure 18B:
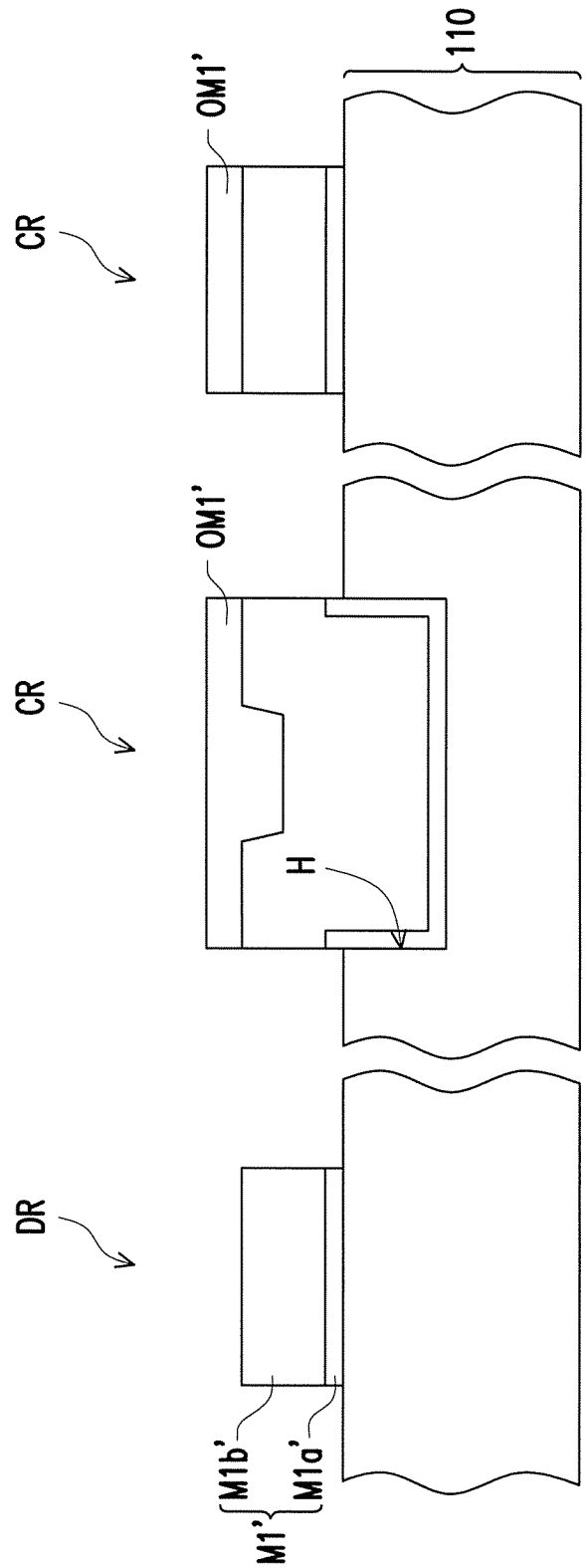
Figure 18C:
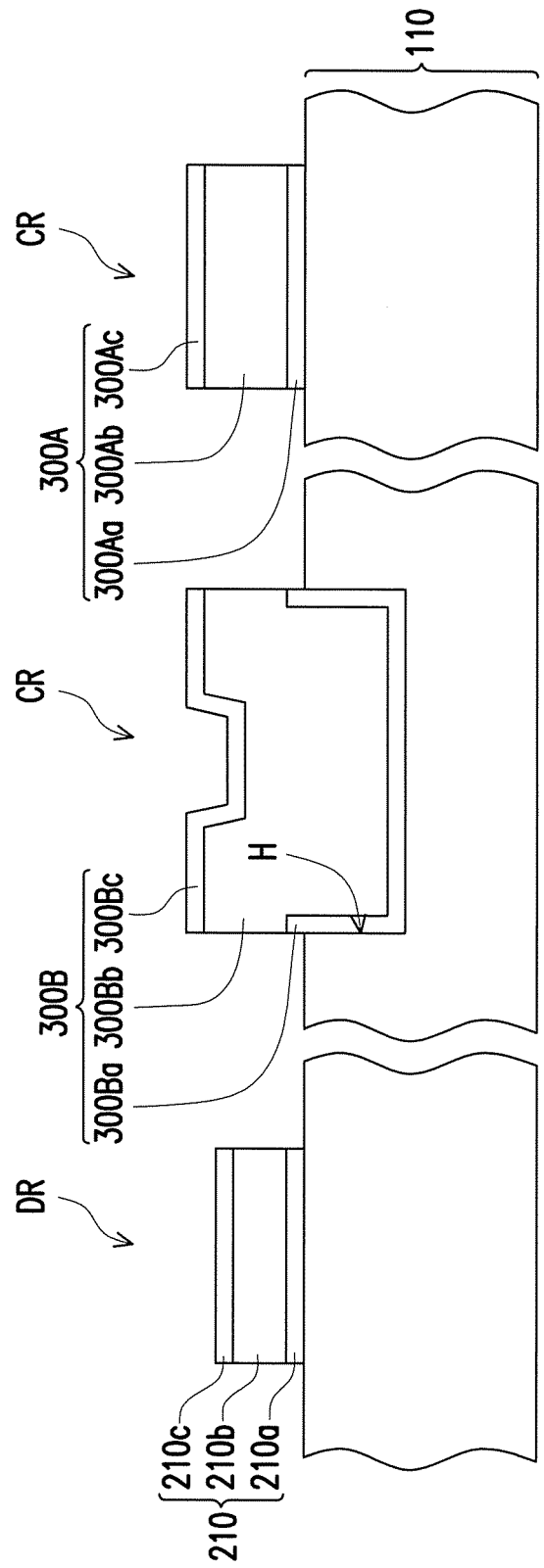

FIG. 18A to FIG. 18C are schematic cross-sectional views of a manufacturing process of a support structure, an auxiliary structure, and a signal line according to an embodiment of the invention. It should be noted that the reference numerals and a part of the contents in the embodiment of FIG. 17A to FIG. 17C are also used to describe the embodiments of FIG. 18A to FIG. 18C, in which the same reference numerals are used to represent identical or similar elements, and thus descriptions of the same technical contents are omitted. Please refer to the descriptions of the previous embodiment for the omitted contents, which will not be repeated hereinafter.

In the present embodiment, when the support structure 300A is formed, a signal line 210 and/or an auxiliary structure 300B with two thicknesses different from a thickness of the support structure 300A may be simultaneously formed.

Referring to FIG. 18A, in the present embodiment, after a trench H is formed in an insulation layer 110, a conductive material layer M1 is formed on the insulation layer 110. The conductive material layer M1 covers the insulation layer 110, and a portion of the conductive material layer M1 fills the trench H. In the present embodiment, a portion of an upper surface of the conductive material layer M1 is recessed at the trench H, as such, an upper surface of the conductive material layer M1 located in the trench H is lower than an upper surface of the conductive material layer M1 located outside the trench H. Nevertheless, the invention is not limited thereto. In some embodiments, the upper surface of the conductive material layer M1 is a planar surface.

In the present embodiment, the conductive material layer M1 includes a multi-layer structure, for example, includes a first conductive layer M1$a$ and a second conductive layer M1$b$. In some embodiments, a material of the first conductive layer M1$a$ is different from a material of the second conductive layer M1$b$. In some embodiments, the material of the first conductive layer M1$a$, for example, includes titanium, molybdenum, or other conductive materials, and the material of the second conductive layer M1$b$, for example, includes aluminum or other conductive materials.

A photoresistant OM1 and a photoresistant OM4 are provided on the conductive material layer M1. The photoresistant OM1 and the photoresistant OM4, for example, are defined together through half-tone mask or other similar processes. In some embodiments, a thickness of the photoresistant OM4 is less than a thickness of the photoresistant OM1. In the present embodiment, the photoresistant OM4 is formed in an array area DR, and the photoresistant OM1 is formed in a bonding area CR, but the invention is not limited thereto. The photoresistant OM4 may be formed in the bonding area CR, and the photoresistant OM1 may be formed in the array area DR, or alternatively, the bonding area CR and the array area DR may simultaneously have both the photoresistant OM1 and the photoresistant OM4.

The photoresistant OM1 and the photoresistant OM4 have a plurality of openings, and the openings in the array area DR, for example, correspond to positions other than a position where the signal line 210 is to be formed, and the openings in the bonding area CR, for example, correspond to positions other than positions where a support structure 300A and an auxiliary structure 300B are to be formed. Next, the conductive material layer M1 is etched, so as to transfer patterns of the photoresistant OM1 and the photoresistant OM4 onto the conductive material layer M1.

Referring to FIG. 18B, the patterns of the photoresistant OM1 and the photoresistant OM4 of FIG. 18A are transferred to the conductive material layer M1, so as to form a conductive material layer M1'. The conductive material layer M1', for example, includes a first conductive layer M1$a$' and a second conductive layer M1$b$'. The conductive material layer M1' in the array area DR, for example, corresponds to the position where the signal line 210 is to be formed, and the conductive material layer M1' in the bonding area CR, for example, corresponds to the positions where the support structure 300A and the auxiliary structure 300B are to be formed.

An ashing process or an etching process is used to remove the photoresistant OM4 and a portion of the photoresistant OM1. The ashing process, for example, uses oxygen plasma to remove the photoresistant OM4 and the portion of the photoresistant OM1. The thickness of the photoresistant OM4 is less than the thickness of the photoresistant OM1, and thereby, after the photoresistant OM4 is entirely removed, a portion of the photoresistant OM1 still remains. Then, the etching of the conductive material layer M1' is proceed with a remaining photoresistant OM1' (FIG. 18B) serving as a mask.

Referring to FIG. 18B and FIG. 18C, a portion of the conductive material layer M1' which is not masked by the photoresistant OM1' forms a first layer 210$a$ and a second layer 210$b$ of the signal line 210. A portion of the conductive material layer M1' which is masked by the photoresistant OM1' forms a first layer 300Aa and a second layer 300Ab of the support structure 300A and a first layer 300Ba and a second layer 300Bb of the auxiliary structure 300B. Since the second layer 210$b$ of the signal line 210 is not masked by the photoresistant OM1', a thickness of the second layer 210$b$ of the signal line 210 is less than a thickness of the second layer 300Ab of the support structure 300A and/or a thickness of the second layer 300Bb of the auxiliary structure 300B.

After the remaining photoresistant OM1' is removed through the ashing process or the etching process, as shown in FIG. 18C, a third layer 210$c$ of the signal line 210, a third layer 300Ac of the support structure 300A, and a third layer 300Bc of the auxiliary structure 300B are formed on the second layer 210$b$ of the signal line 210, the second layer 300Ab of the support structure 300A, and the second layer 300Bb of the auxiliary structure 300B, so as to complete the signal line 210, the support structure 300A, and the auxiliary structure 300B of the present embodiment. The third layer 210$c$ of the signal line 210, the third layer 300Ac of the support structure 300A, and the third layer 300Bc of the auxiliary structure 300B belong to a same patterned film layer. The method of forming the third layers 210$c$/300Ac/300Bc includes, for example, depositing a layer of conductive material layer (not shown) and then patterning the conductive material layer. In some embodiments, a material of the third layers 210$c$/300Ac/300Bc and a material of the first layers 210$a$/300Aa/300Ba are identical.

Although in the present embodiment, after the remaining photoresistant OM1' is removed, the third layers 210c/300Ac/300Bc are subsequently formed, the invention is not limited thereto. In some embodiments, after the remaining photoresistant OM1' is formed, the third layers 210c/300Ac/300Bc are not subsequently formed.

In the present embodiment, since the auxiliary structure 300B is formed in the trench H of the insulation layer 110 as shown in FIG. 18C, a lower surface of the auxiliary structure 300B corresponding to the trench H is lower than a lower surface of the support structure 300A and a lower surface of the signal line 210. Nevertheless, the invention is not limited thereto. In other embodiments, the support structure 300A is formed in the trench H, and a thickness of the support structure 300A is greater than a thickness of the auxiliary structure 300B.

Although the support structure 300A, the auxiliary structure 300B and the signal line 210 belong to a same patterned film layer(s) formed on the insulation layer 110 in FIG. 18A to FIG. 18C, the invention is not limited thereto. In some embodiments, the support structure 300A, the auxiliary structure 300B and the signal line 230 are formed on the insulation layer 120.

Based on the above, in at least one embodiment of the invention, the support structure 300A, the auxiliary structure 300B, and the signal line 210 are formed simultaneously, and no additional process is required to form the support structure 300A and the auxiliary structure 300B. In addition, as the support structure 300A and the auxiliary structure 300B may have thicker thicknesses, the support structure 300A and the auxiliary structure 300B can thus preferably break a stress in the insulation layer, and that the array substrate is less susceptible to deformation. As such, yield rates of the products are significantly enhanced. In addition, in at least one embodiment of the invention, the deformation of the bonding area CR of the array substrate generated in the manufacturing process is reduced through arrangement of the support structure 300A and the auxiliary structure 300B without adjusting the material of the device array in the array substrate nor adjusting the thickness of each of the film layers in the device array. As such, the problem of deformation of the array substrate is resolved without affecting electrical property of the array substrate.

Figure 19:
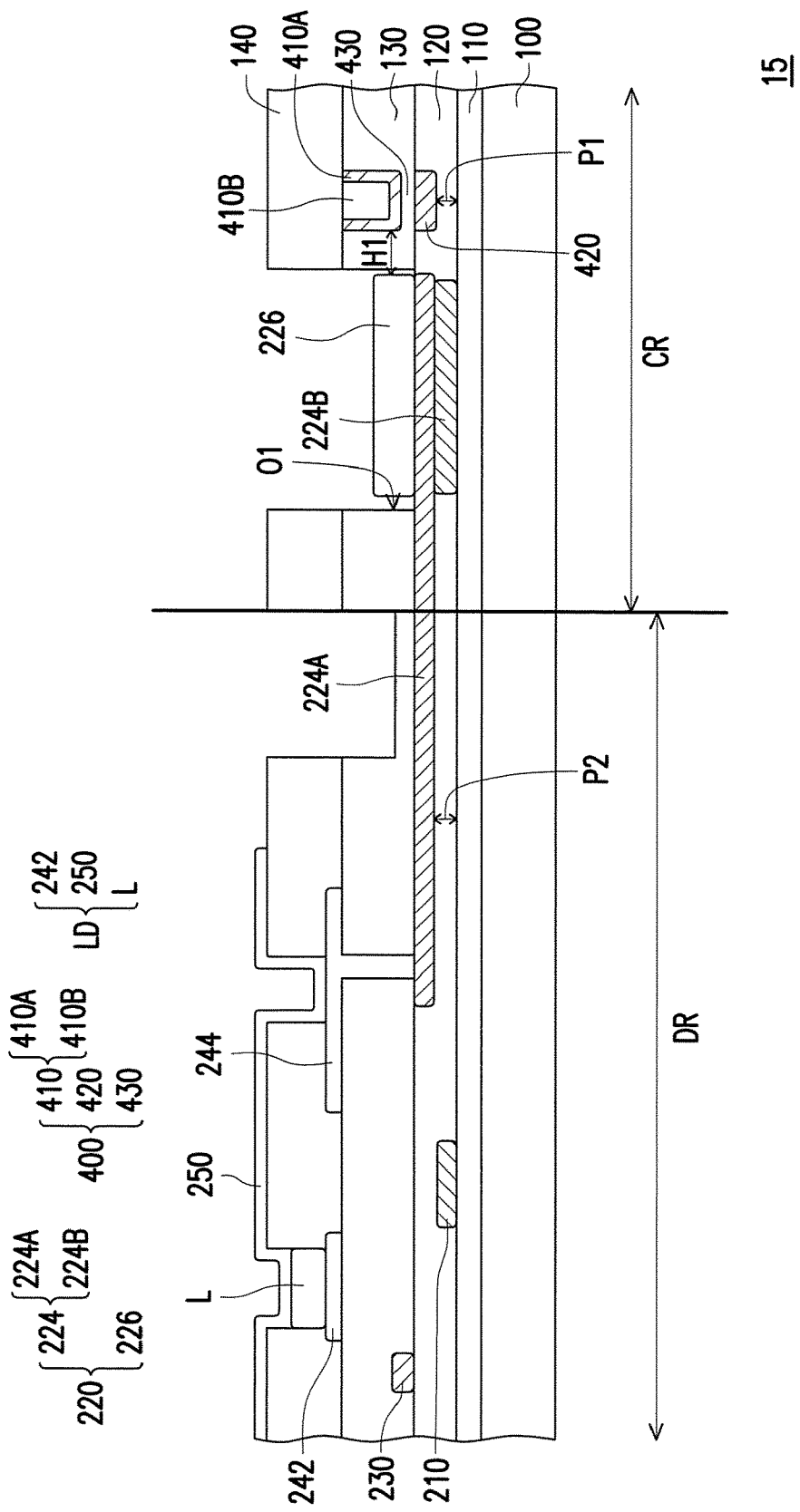
FIG. 19 is a schematic cross-sectional view of an array substrate according to an embodiment of the invention.

FIG. 19 is a schematic cross-sectional view of an array substrate according to an embodiment of the invention. It should be noted that the reference numerals and a part of the contents in the embodiment of FIG. 8 are also used to describe the embodiment of FIG. 19, in which the same reference numerals are used to represent identical or similar elements, and thus descriptions of the same technical contents are omitted. Please refer to the descriptions of the previous embodiment for the omitted contents, which will not be repeated hereinafter.

In the present embodiment, an array substrate 15 includes a substrate 100, an insulation layer 110, an insulation layer 120, an insulation layer 130, an insulation layer 140, a signal line 210, a transduction structure 220, a signal line 230, a signal line 244, a light emitting device LD, and a support structure 400.

In the present embodiment, a bonding pad 226 of the transduction structure 220 is located in a bonding area CR, and the bonding pad 226 is electrically connected to a device array DA. A horizontal distance H1 between the support structure 400 and the bonding pad 226 is between 5 μm and 1000 μm.

In the present embodiment, the support structure 400 includes a first portion 410, a second portion 420, and a third portion 430. In the present embodiment, the first portion 410 of the support structure 400 includes an outer layer 410A and an inner layer 410B. A material of the outer layer 410A of the first portion 410 includes metal oxide. In the present embodiment, the inner layer 410B of the first portion 410 is located inside the outer layer 410A so that the outer layer 410A is located between the insulation layer 130 and the inner layer 410B, and the inner layer 410B is not in contact with the insulation layer 110. In the present embodiment, the inner layer 410B of the first portion 410 includes an air void.

The second portion 420 is located between the insulation layer 110 and the first portion 410. In an embodiment, the second portion 420 of the support structure 400, the signal line 230, and a second layer 224A of the conductive layer 224 belong to a same patterned film layer, and a material of the second portion 420 includes metal. A vertical distance P1 is provided between the second portion 420 of the support structure 400 and an upper surface of the insulation layer 110. The vertical distance P1, for example, is between 0 μm and 1 μm.

The third portion 430 is located between the second portion 420 and the first portion 410 and is connected to the outer layer 410A and the second portion 420. In an embodiment, a material of the third portion 430 is identical to a material of the insulation layer 130. In the present embodiment, the third portion 430 of the support structure 400 and the insulation layer 130 are connected and defined from same layer, in other words, the first portion 410 and the second portion 420 of the support structure 400 are divided by the insulation layer 130. In an embodiment, the first portion 410 and the second portion 420 of the support structure 400 are both made of a rigid material, and the third portion 430 between the first portion 410 and the second portion 420 may act as a stress buffering layer. Although in the present embodiment, the support structure 400 includes the third portion 430 located between the first portion 410 and the second portion 420, the invention is not limited thereto. In other embodiments, the support structure 400 does not include the third portion 430, and the first portion 410 is in direct contact with the second portion 420.

Based on the above, in the array substrate 15 provided by at least one embodiment of the invention, the support structure 400 is disposed at a position close to the bonding pad 226. Deformation of the bonding area CR of the array substrate 15 generated in a manufacturing process may be reduced by the support structure 400, and that the bonding pad 226 is not deviated from a predetermined position. As such, yield rates of the products are significantly enhanced. In addition, in at least one embodiment of the invention, the deformation of the bonding area CR of the array substrate 15 generated in the manufacturing process is reduced through arrangement of the support structure 400 without adjusting the material of the device array in the array substrate 15 nor adjusting the thickness of each of the film layers in the device array. As such, the problem of deformation of the array substrate 15 is resolved without affecting electrical property of the array substrate 15.

Figure 20:
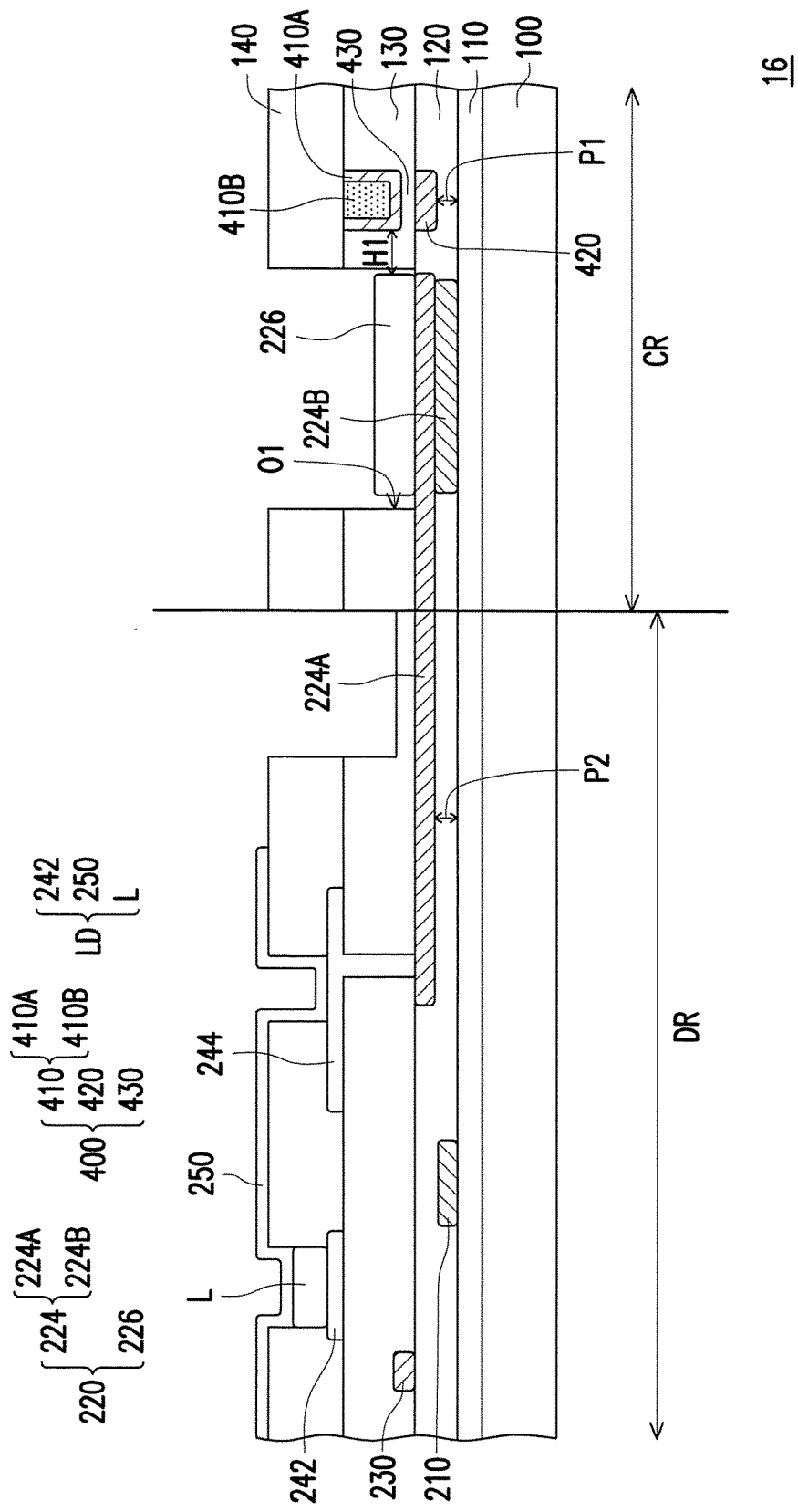
FIG. 20 is a schematic cross-sectional view of an array substrate according to an embodiment of the invention.

FIG. 20 is a schematic cross-sectional view of an array substrate according to an embodiment of the invention. It should be noted that the reference numerals and a part of the contents in the embodiment of FIG. 19 are also used to describe the embodiment of FIG. 20, in which the same reference numerals are used to represent identical or similar elements, and thus descriptions of the same technical contents are omitted. Please refer to the descriptions of the previous embodiment for the omitted contents, which will not be repeated hereinafter.

In the present embodiment, an array substrate 16 includes a substrate 100, an insulation layer 110, an insulation layer 120, an insulation layer 130, an insulation layer 140, a signal line 210, a transduction structure 220, a signal line 230, a signal line 244, a light emitting device LD, and a support structure 400.

In the present embodiment, a bonding pad 226 of the transduction structure 220 is located in a bonding area CR, and the bonding pad 226 is electrically connected to a device array DA. A horizontal distance H1 between the support structure 400 and the bonding pad 226 is between 5 μm and 1000 μm.

In the present embodiment, the support structure 400 includes a first portion 410, a second portion 420, and a third portion 430. In the present embodiment, the first portion 410 of the support structure 400 includes an outer layer 410A and an inner layer 410B. A material of the outer layer 410A of the first portion 410 includes metal oxide. In the present embodiment, a material of the inner layer 410B, for example, includes metal, silicon oxide, nitric oxide, photoresistant, polymlethylmethacrylate (PMMA), hexamethyldisiloxane (HDMSO), ultraviolet curing sealant, or heat curing sealant. In an embodiment, the inner layer 410B, for example, includes a material of the insulation layer 140. In an embodiment, the outer layer 410A and the inner layer 410B of the first portion 410 include a rigid material.

The third portion 430 is located between the second portion 420 and the first portion 410. In an embodiment, a material of the third portion 430 is identical to a material of the insulation layer 130. In the present embodiment, the third portion 430 of the support structure 400 and the insulation layer 130 are connected and defined from same layer, in other words, the first portion 410 and the second portion 420 of the support structure 400 are divided by the insulation layer 130. In an embodiment, the first portion 410 and the second portion 420 of the support structure 400 are both made of a rigid material, and the third portion 430 between the first portion 410 and the second portion 420 may act as a stress buffering layer. Although in the present embodiment, the support structure 400 includes the third portion 430 located between the first portion 410 and the second portion 420, the invention is not limited thereto. In other embodiments, the support structure 400 does not include the third portion 430, and the first portion 410 is in direct contact with the second portion 420.

The second portion 420 is located between the insulation layer 110 and the first portion 410. In an embodiment, the second portion 420 of the support structure 400, the signal line 230, and a second layer 224A of the conductive layer 224 belong to a same patterned film layer, and a material of the second portion 420 includes metal. A vertical distance P1 is provided between the second portion 420 of the support structure 400 and an upper surface of the insulation layer 110. The vertical distance P1, for example, is between 0 μm and 1 μm.

Based on the above, in the array substrate 16 provided by at least one embodiment of the invention, the support structure 400 is disposed at a position close to the bonding pad 226. Deformation of the bonding area CR of the array substrate 16 generated in a manufacturing process may be reduced by the support structure 400, and that the bonding pad 226 is not deviated from a predetermined position. As such, yield rates of the products are significantly enhanced. In addition, in at least one embodiment of the invention, the deformation of the bonding area CR of the array substrate 16 generated in the manufacturing process is reduced through arrangement of the support structure 400 without adjusting the material of the device array in the array substrate 16 nor adjusting the thickness of each of the film layers in the device array. As such, the problem of deformation of the array substrate 16 is resolved without affecting electrical property of the array substrate 16.

Figure 21:
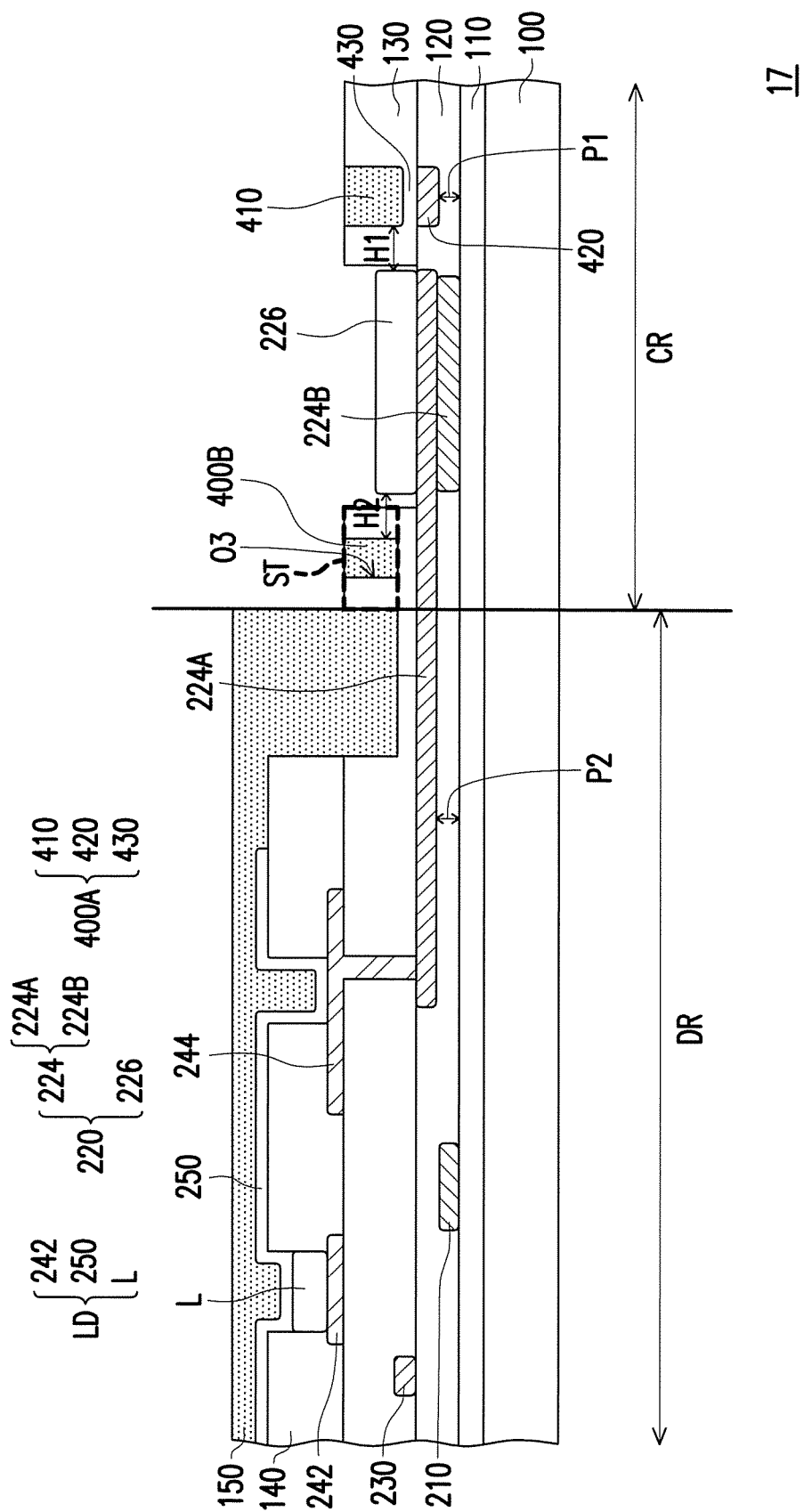
FIG. 21 is a schematic cross-sectional view of an array substrate according to an embodiment of the invention.

FIG. 21 is a schematic cross-sectional view of an array substrate according to an embodiment of the invention. It should be noted that the reference numerals and a part of the contents in the embodiment of FIG. 11 and FIG. 20 are also used to describe the embodiment of FIG. 21, in which the same reference numerals are used to represent identical or similar elements, and thus descriptions of the same technical contents are omitted. Please refer to the descriptions of the previous embodiment for the omitted contents, which will not be repeated hereinafter.

In the present embodiment, an array substrate 17 includes a substrate 100, an insulation layer 110, an insulation layer 120, an insulation layer 130, an insulation layer 140, a protection layer 150, a signal line 210, a transduction structure 220, a signal line 230, a signal line 244, a light emitting device LD, a support structure 400A, and an auxiliary structure 400B.

In the present embodiment, after the light emitting device LD is formed, the protection layer 150 is formed on the light emitting device. The protection layer 150, for example, exposes a bonding area CR of the array substrate 17.

In the present embodiment, a bonding pad 226 of the transduction structure 220 is located in the bonding area CR, and the bonding pad 226 is electrically connected to a device array DA. The support structure 400A is located in the bonding area CR. A horizontal distance H1 between the support structure 400A and the bonding pad 226 is between 5 μm and 1000 μm.

In an embodiment, the support structure 400A includes a first portion 410, a second portion 420, and a third portion 430. In the present embodiment, a material of the first portion 410 of the support structure 400A, for example, includes metal, silicon oxide, nitric oxide, photoresistant, polymethylmethacrylate (PMMA), hexamethyldisiloxane (HDMSO), ultraviolet curing sealant, or heat curing sealant. In an embodiment, the first portion 410 includes a rigid material.

In the present embodiment, the second portion 420 is located between the insulation layer 110 and the first portion 410. In an embodiment, the second portion 420 of the support structure 400A, the signal line 230, and a second layer 224A of the conductive layer 224 belong to a same patterned film layer, and a material of the second portion 420 includes metal. A vertical distance P1 is provided between the second portion 420 of the support structure 400A and an upper surface of the insulation layer 110. The vertical distance P1, for example, is between 0 μm and 1 μm.

The third portion 430 is located between the second portion 420 and the first portion 410. In an embodiment, a material of the third portion 430 is identical to a material of the insulation layer 130. In the present embodiment, the third portion 430 of the support structure 400A and the insulation layer 130 are connected and defined from same layer, in other words, the first portion 410 and the second portion 420 of the support structure 400A are divided by the insulation layer 130. In an embodiment, the first portion 410 and the second portion 420 of the support structure 400A are both made of a rigid material, and the third portion 430 between the first portion 410 and the second portion 420 may act as a stress buffering layer. Although in the present embodiment, the support structure 400A includes the third portion 430 located between the first portion 410 and the second portion 420, the invention is not limited thereto. In other embodiments, the support structure 400A does not include the third portion 430, and the first portion 410 is in direct contact with the second portion 420. In an embodiment, the first portion 410 and the protection layer 150 may be formed simultaneously and include a same material, but the invention is not limited thereto.

The auxiliary structure 400B is located in an opening O3 of the bonding area CR, and the opening O3, for example, is located in a support pad ST. In the present embodiment, the support pad ST is a single-layer structure and is a portion of the insulation layer 130. At least a portion of the auxiliary structure 400B is embedded into the insulation layer 130. A portion of the insulation layer 130 is remained below the opening O3, as such, the capability of the insulation layer 130 to protect the transduction structure 220 is prevented from being lowered. A horizontal distance H2 between the auxiliary structure 400B and the bonding pad 226 is between 5 μm and 1000 μm. In an embodiment, a material of the auxiliary structure 400B is, for example, identical to a material of the first portion 410 of the support structure 400A. In an embodiment, the first portion 410 of the support structure 400A and the auxiliary structure 400B, for example, are formed simultaneously. In an embodiment, the first portion 410 of the support structure 400A, the auxiliary structure 400B, and the protection layer 150, for example, are formed simultaneously.

In the present embodiment, the first portion 410 of the support structure 400A and the auxiliary structure 400B are not covered by the insulation layer 140. As such, the first portion 410 of the support structure 400A, the auxiliary structure 400B, for example, and together with the protection layer 150 may be formed simultaneously.

Based on the above, in the array substrate 17 provided by at least one embodiment of the invention, the support structure 400A and the auxiliary structure 400B are disposed at positions close to the bonding pad 226. Deformation of the bonding area CR of the array substrate 12 generated in a manufacturing process may be reduced by the support structure 400A and the auxiliary structure 400B, and that the bonding pad 226 is not deviated from a predetermined position. As such, yield rates of the products are significantly enhanced. In addition, in at least one embodiment of the invention, the deformation of the bonding area CR of the array substrate 17 generated in the manufacturing process is reduced through arrangement of the support structure 400A and the auxiliary structure 400B without adjusting the material of the device array in the array substrate 17 nor adjusting the thickness of each of the film layers in the device array. As such, the problem of deformation of the array substrate 17 is resolved without affecting electrical property of the array substrate 17.

Figure 22:
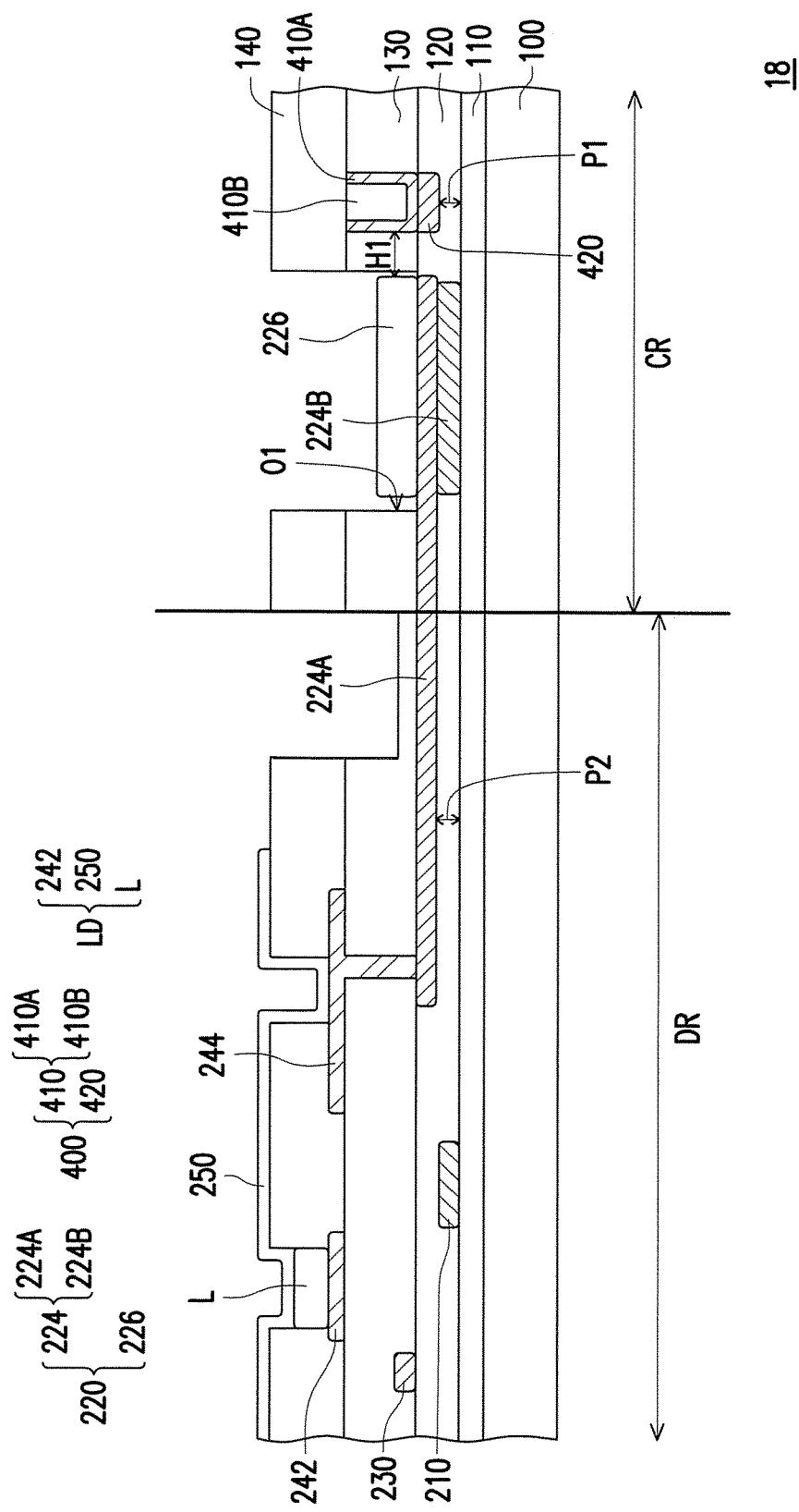
FIG. 22 is a schematic cross-sectional view of an array substrate according to an embodiment of the invention.

FIG. 22 is a schematic cross-sectional view of an array substrate according to an embodiment of the invention. It should be noted that the reference numerals and a part of the contents in the embodiment of FIG. 19 are also used to describe the embodiment of FIG. 22, in which the same reference numerals are used to represent identical or similar elements, and thus descriptions of the same technical contents are omitted. Please refer to the descriptions of the previous embodiment for the omitted contents, which will not be repeated hereinafter.

In the present embodiment, an array substrate 18 includes a substrate 100, an insulation layer 110, an insulation layer 120, an insulation layer 130, an insulation layer 140, a signal line 210, a transduction structure 220, a signal line 230, a signal line 244, a light emitting device LD, and a support structure 400.

In the present embodiment, a bonding pad 226 of the transduction structure 220 is located in a bonding area CR, and the bonding pad 226 is electrically connected to a device array DA. A horizontal distance H1 between the support structure 400 and the bonding pad 226 is between 5 μm and 1000 μm.

In the present embodiment, the support structure 400 includes a first portion 410 and a second portion 420. In the present embodiment, the first portion 410 of the support structure 400 includes an outer layer 410A and an inner layer 410B. In an embodiment, a material of the outer layer 410A of the first portion 410 includes metal oxide. In the present embodiment, the inner layer 410B of the first portion 410 is located inside the outer layer 410A, and the inner layer 410B is not in contact with the insulation layer 110. In the present embodiment, the inner layer 410B of the first portion 410 includes an air void.

The second portion 420 is located between the insulation layer 110 and the first portion 410. In an embodiment, the second portion 420 of the support structure 400, the signal line 230, and a second layer 224A of the conductive layer 224 belong to a same patterned film layer, and a material of the second portion 420 includes metal. A vertical distance P1 is provided between the second portion 420 of the support structure 400 and an upper surface of the insulation layer 110. The vertical distance P1, for example, is between 0 μm and 1 μm. In the present embodiment, the first portion 410 of the support structure 400 is in direct contact with the second portion 420.

Based on the above, in the array substrate 18 provided by at least one embodiment of the invention, the support structure 400 is disposed at a position close to the bonding pad 226. Deformation of the bonding area CR of the array substrate 18 generated in a manufacturing process may be reduced by the support structure 400, and that the bonding pad 226 is not deviated from a predetermined position. As such, yield rates of the products are significantly enhanced. In addition, in at least one embodiment of the invention, the deformation of the bonding area CR of the array substrate 18 generated in the manufacturing process is reduced through arrangement of the support structure 400 without adjusting the material of the device array in the array substrate 18 nor adjusting the thickness of each of the film layers in the device array. As such, the problem of deformation of the array substrate 18 is resolved without affecting electrical property of the array substrate 18.

Figure 23:
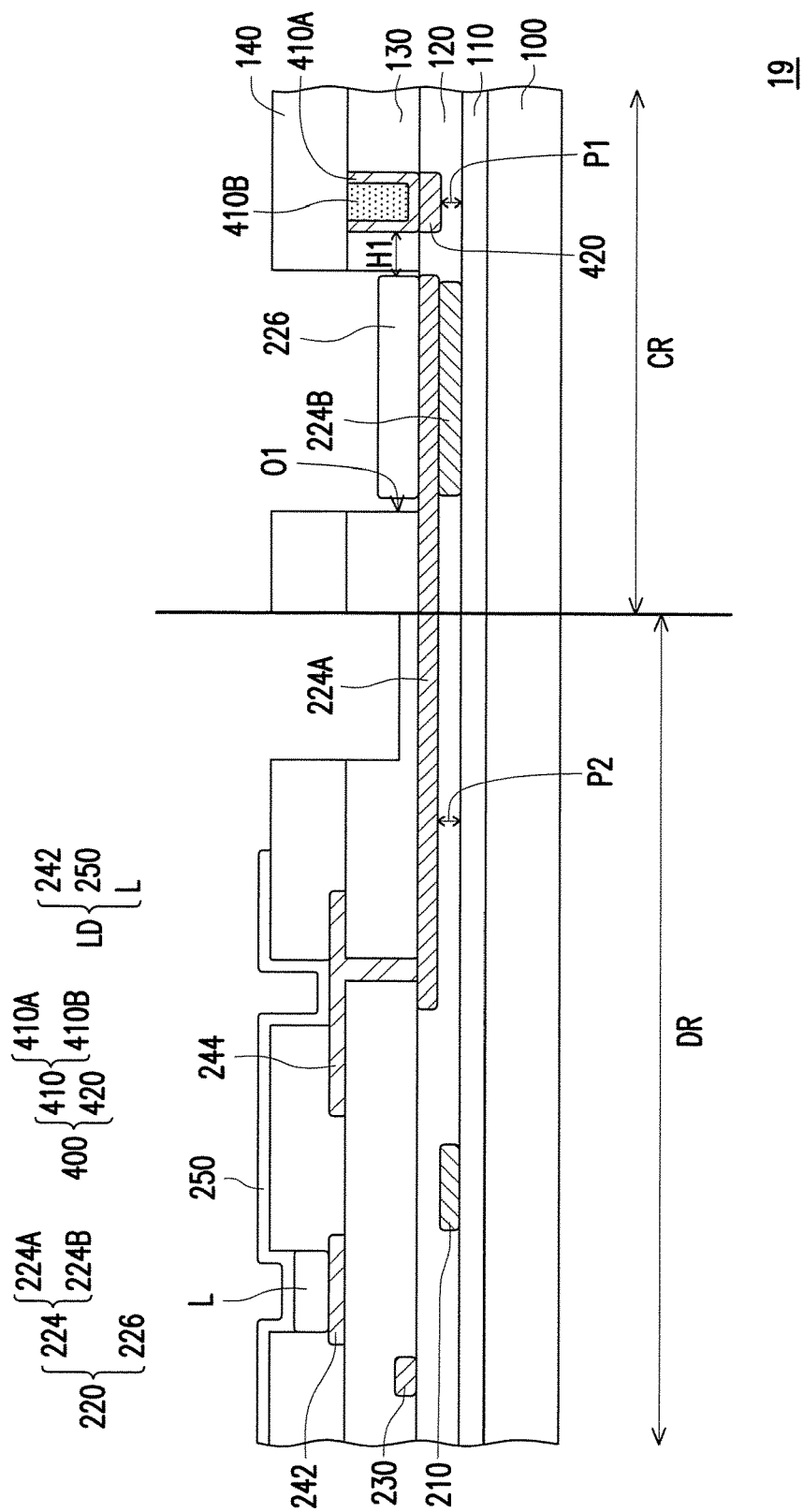
FIG. 23 is a schematic cross-sectional view of an array substrate according to an embodiment of the invention.

FIG. 23 is a schematic cross-sectional view of an array substrate according to an embodiment of the invention. It should be noted that the reference numerals and a part of the contents in the embodiment of FIG. 20 are also used to describe the embodiment of FIG. 23, in which the same reference numerals are used to represent identical or similar elements, and thus descriptions of the same technical contents are omitted. Please refer to the descriptions of the previous embodiment for the omitted contents, which will not be repeated hereinafter.

In the present embodiment, an array substrate 19 includes a substrate 100, an insulation layer 110, an insulation layer 120, an insulation layer 130, an insulation layer 140, a signal line 210, a transduction structure 220, a signal line 230, a signal line 244, a light emitting device LD, and a support structure 400.

In the present embodiment, a bonding pad 226 of the transduction structure 220 is located in a bonding area CR, and the bonding pad 226 is electrically connected to a device array DA. A horizontal distance H1 between the support structure 400 and the bonding pad 226 is between 5 μm and 1000 μm.

In the present embodiment, the support structure 400 includes a first portion 410 and a second portion 420. In the present embodiment, the first portion 410 of the support structure 400 includes an outer layer 410A and an inner layer 410B. In an embodiment, a material of the outer layer 410A of the first portion 410 includes metal oxide. In the present embodiment, a material of the inner layer 410B, for example, includes metal, silicon oxide, nitric oxide, photoresistant, polymethylmethacrylate (PMMA), hexamethyldisiloxane (HDMSO), ultraviolet curing sealant, or heat curing sealant. In an embodiment, the inner layer 410B, for example, includes a material of the insulation layer 140. In an embodiment, the outer layer 410A and the inner layer 410B of the first portion 410 include a rigid material.

The second portion 420 is located between the insulation layer 110 and the first portion 410. In an embodiment, the second portion 420 of the support structure 400, the signal line 230, and a second layer 224A of the conductive layer 224 belong to a same patterned film layer, and a material of the second portion 420 includes metal. A vertical distance P1 is provided between the second portion 420 of the support structure 400 and an upper surface of the insulation layer 110. The vertical distance P1, for example, is between 0 μm and 1 μm. In the present embodiment, the first portion 410 of the support structure 400 is in direct contact with the second portion 420.

Based on the above, in the array substrate 19 provided by at least one embodiment of the invention, the support structure 400 is disposed at a position close to the bonding pad 226. Deformation of the bonding area CR of the array substrate 19 generated in a manufacturing process may be reduced by the support structure 400, and that the bonding pad 226 is not deviated from a predetermined position. As such, yield rates of the products are significantly enhanced. In addition, in at least one embodiment of the invention, the deformation of the bonding area CR of the array substrate 19 generated in the manufacturing process is reduced through arrangement of the support structure 400 without adjusting the material of the device array in the array substrate 19 nor adjusting the thickness of each of the film layers in the device array. As such, the problem of deformation of the array substrate 19 is resolved without affecting electrical property of the array substrate 19.

Figure 24:
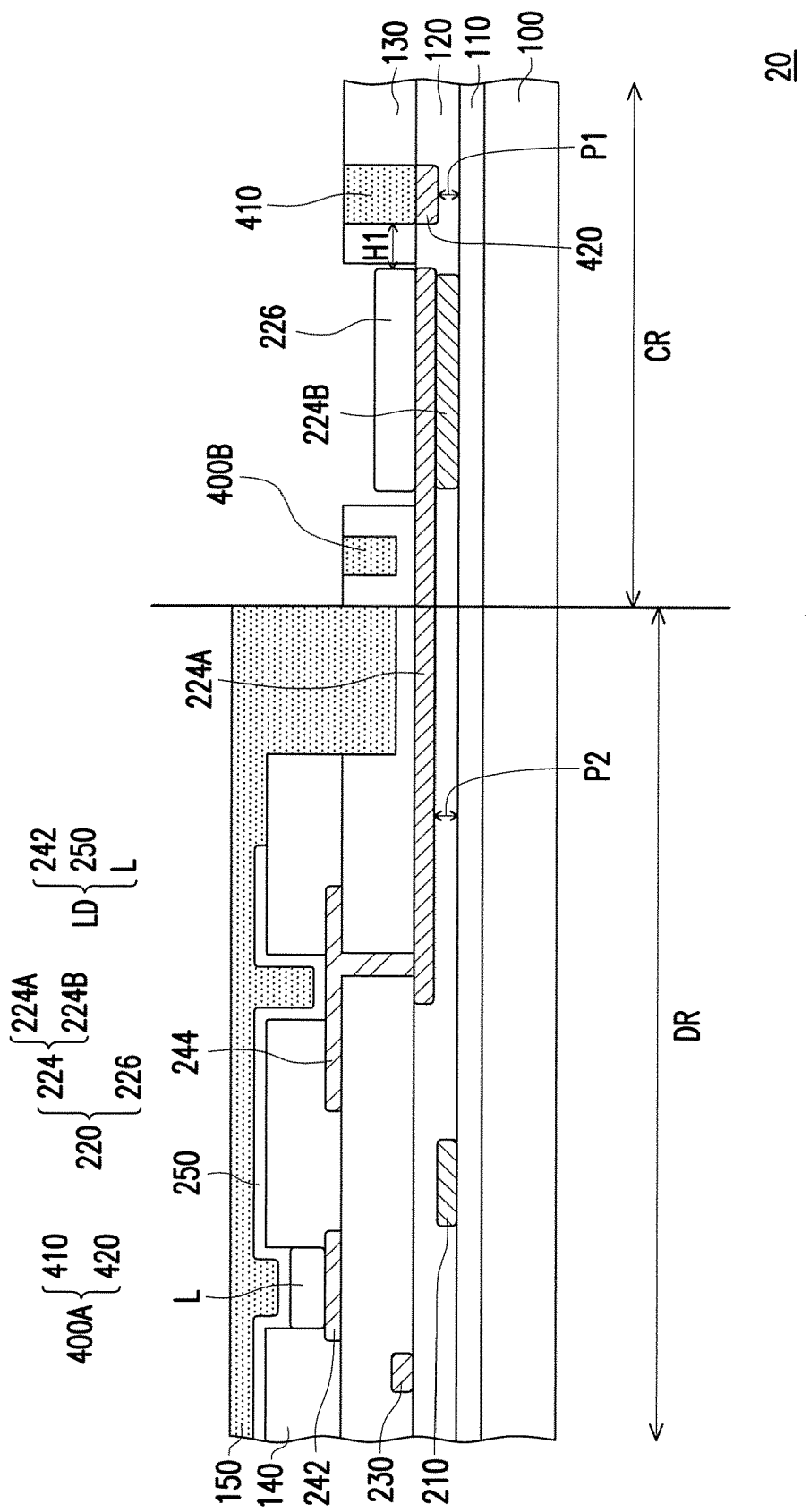
FIG. 24 is a schematic cross-sectional view of an array substrate according to an embodiment of the invention.

FIG. 24 is a schematic cross-sectional view of an array substrate according to an embodiment of the invention. It should be noted that the reference numerals and a part of the contents in the embodiment of FIG. 21 are also used to describe the embodiment of FIG. 24, in which the same reference numerals are used to represent identical or similar elements, and thus descriptions of the same technical contents are omitted. Please refer to the descriptions of the previous embodiment for the omitted contents, which will not be repeated hereinafter.

In the present embodiment, an array substrate 20 includes a substrate 100, an insulation layer 110, an insulation layer 120, an insulation layer 130, an insulation layer 140, a protection layer 150, a signal line 210, a transduction structure 220, a signal line 230, a signal line 244, a light emitting device LD, a support structure 400A, and an auxiliary structure 400B.

In the present embodiment, after the light emitting device LD is formed, the protection layer 150 is formed on the light emitting device LD. The protection layer 150, for example, exposes a bonding area CR of the array substrate 20.

In the present embodiment, a bonding pad 226 of the transduction structure 220 is located in the bonding area CR, and the bonding pad 226 is electrically connected to a device array DA. The support structure 400A is located in the bonding area CR. A horizontal distance H1 between the support structure 400A and the bonding pad 226 is between 5 μm and 1000 μm.

In the present embodiment, the support structure 400A includes a first portion 410 and a second portion 420. In the present embodiment, a material of the first portion 410 of the support structure 400A, for example, includes metal, silicon oxide, nitric oxide, photoresistant, polymethylmethacrylate (PMMA), hexamethyldisiloxane (HDMSO), ultraviolet curing sealant, or heat curing sealant. In an embodiment, the first portion 410 includes a rigid material.

In the present embodiment, the second portion 420 is located between the insulation layer 110 and the first portion 410. In an embodiment, the second portion 420 of the support structure 400A, the signal line 230, and a second layer 224A of the conductive layer 224 belong to a same patterned film layer, and a material of the second portion 420 includes metal. A vertical distance P1 is provided between the second portion 420 of the support structure 400A and an upper surface of the insulation layer 110. The vertical distance P1, for example, is between 0 μm and 1 μm. In the present embodiment, the first portion 410 of the support structure 400A is in direct contact with the second portion 420.

In the present embodiment, the first portion 410 of the support structure 400A and the auxiliary structure 400B are not covered by the insulation layer 140. As such, the first portion 410 of the support structure 400A, the auxiliary structure 400B, for example, and together with the protection layer 150 may be formed simultaneously and include a same material.

Based on the above, in the array substrate 20 provided by at least one embodiment of the invention, the support structure 400A and the auxiliary structure 400B are disposed at positions close to the bonding pad 226. Deformation of the bonding area CR of the array substrate 20 generated in a manufacturing process may be reduced by the support structure 400A and the auxiliary structure 400B, and that the bonding pad 226 is not deviated from a predetermined position. As such, yield rates of the products are significantly enhanced. In addition, in at least one embodiment of the invention, the deformation of the bonding area CR of the array substrate 20 generated in the manufacturing process is reduced through arrangement of the support structure 400A and the auxiliary structure 400B without adjusting the material of the device array in the array substrate 20 nor adjusting the thickness of each of the film layers in the device array. As such, the problem of deformation of the array substrate 20 is resolved without affecting electrical property of the array substrate 20.

Figure 25:
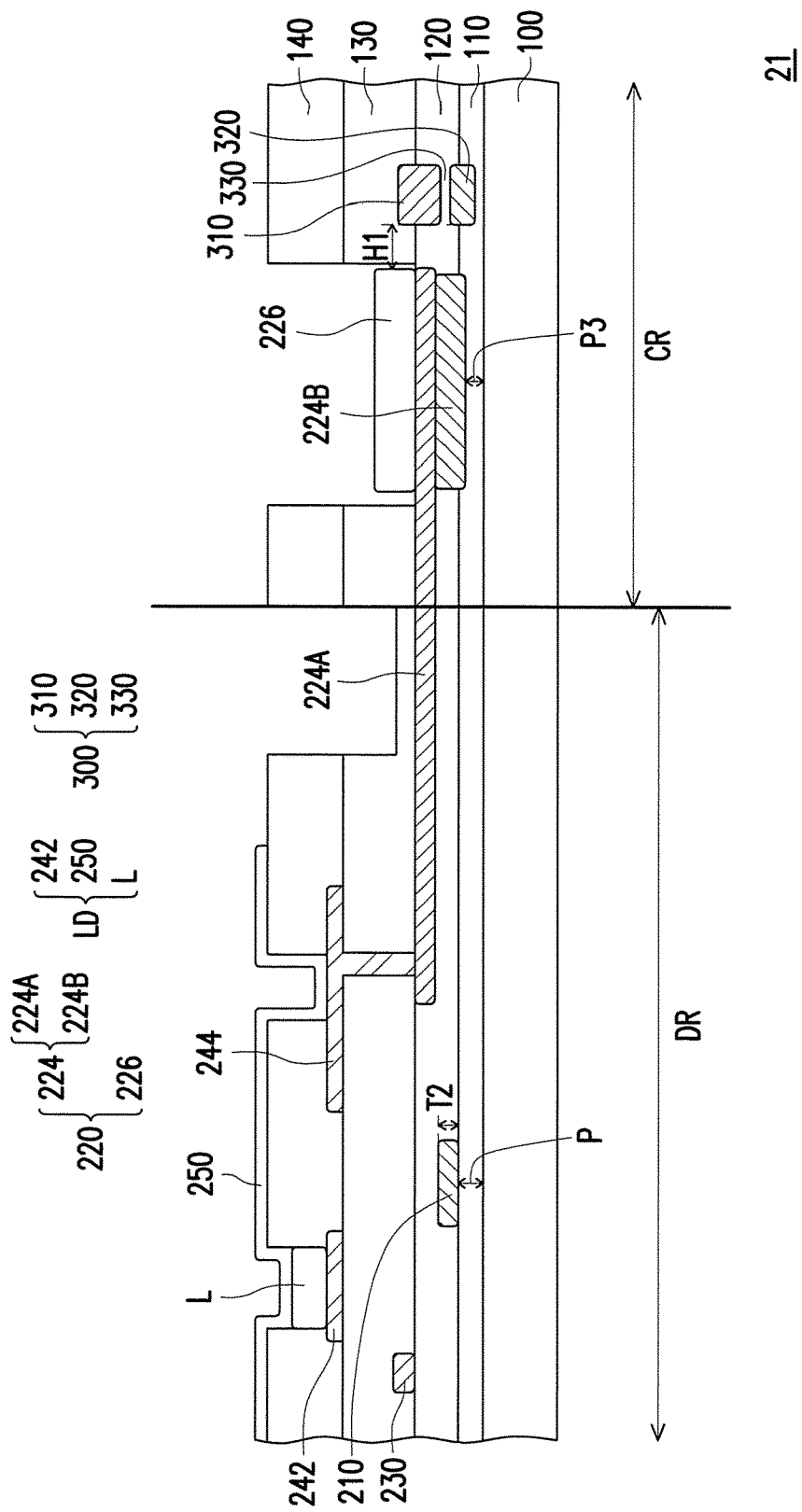
FIG. 25 is a schematic cross-sectional view of an array substrate according to an embodiment of the invention.

FIG. 25 is a schematic cross-sectional view of an array substrate according to an embodiment of the invention. It should be noted that the reference numerals and a part of the contents in the embodiment of FIG. 15 are also used to describe the embodiment of FIG. 25, in which the same reference numerals are used to represent identical or similar elements, and thus descriptions of the same technical contents are omitted. Please refer to the descriptions of the previous embodiment for the omitted contents, which will not be repeated hereinafter.

In the present embodiment, an array substrate 21 includes a substrate 100, an insulation layer 110, an insulation layer 120, an insulation layer 130, an insulation layer 140, a signal line 210, a transduction structure 220, a signal line 230, a signal line 244, a light emitting device LD, and a support structure 300.

In the present embodiment, the support structure 300 includes a first portion 310 and a second portion 320 alternately stacked and perpendicular to a direction of the substrate 100. The first portion 310 is embedded in the insulation layer 120 and the insulation layer 130. The second portion 320 is embedded in the insulation layer 110 and the insulation layer 120.

In the present embodiment, a material of the first portion and a material of the second portion 320 include metal. In an embodiment, the first portion 310, the signal line 230, and the second layer 224A of the conductive layer 224 belong to a same patterned film layer. In an embodiment, the second portion 320, the signal line 210, and a first layer 224B of the conductive layer 224 belong to a same patterned film layer. In an embodiment, a thickness of the first portion 310 is greater than a thickness of the signal line 230. In an embodiment, a thickness of the second portion 320 is greater than a thickness of the signal line 210.

In the present embodiment, the support structure 300 further includes the third portion 330 sandwiched between the first portion 310 and the second portion 320, and the third portion 330 may act as a stress buffering layer. In an embodiment, the third portion 330 and the insulation layer 120 are connected as one piece, in other words, the first portion 310 and the second portion 320 are divided by the insulation layer 120.

Based on the above, in the array substrate 21 provided by at least one embodiment of the invention, the support structure 300 is disposed at a position close to the bonding pad 226. Deformation of a bonding area CR of the array substrate 21 generated in a manufacturing process may be reduced by the support structure 300, and that the bonding pad 226 is not deviated from a predetermined position. As such, yield rates of the products are significantly enhanced. In addition, in at least one embodiment of the invention, the deformation of the bonding area CR of the array substrate 21 generated in the manufacturing process is reduced through arrangement of the support structure 300 without adjusting the material of the device array in the array substrate 21 nor adjusting the thickness of each of the film layers in the device array. As such, the problem of deformation of the array substrate 21 is resolved without affecting electrical property of the array substrate 21.

In the foregoing embodiment, the bonding pad 226 may be lower than a height of a peripheral structure, but the invention is not limited thereto. In other modification examples, the bonding pad 226 may be higher than the height of the peripheral structure.

Figure 26:
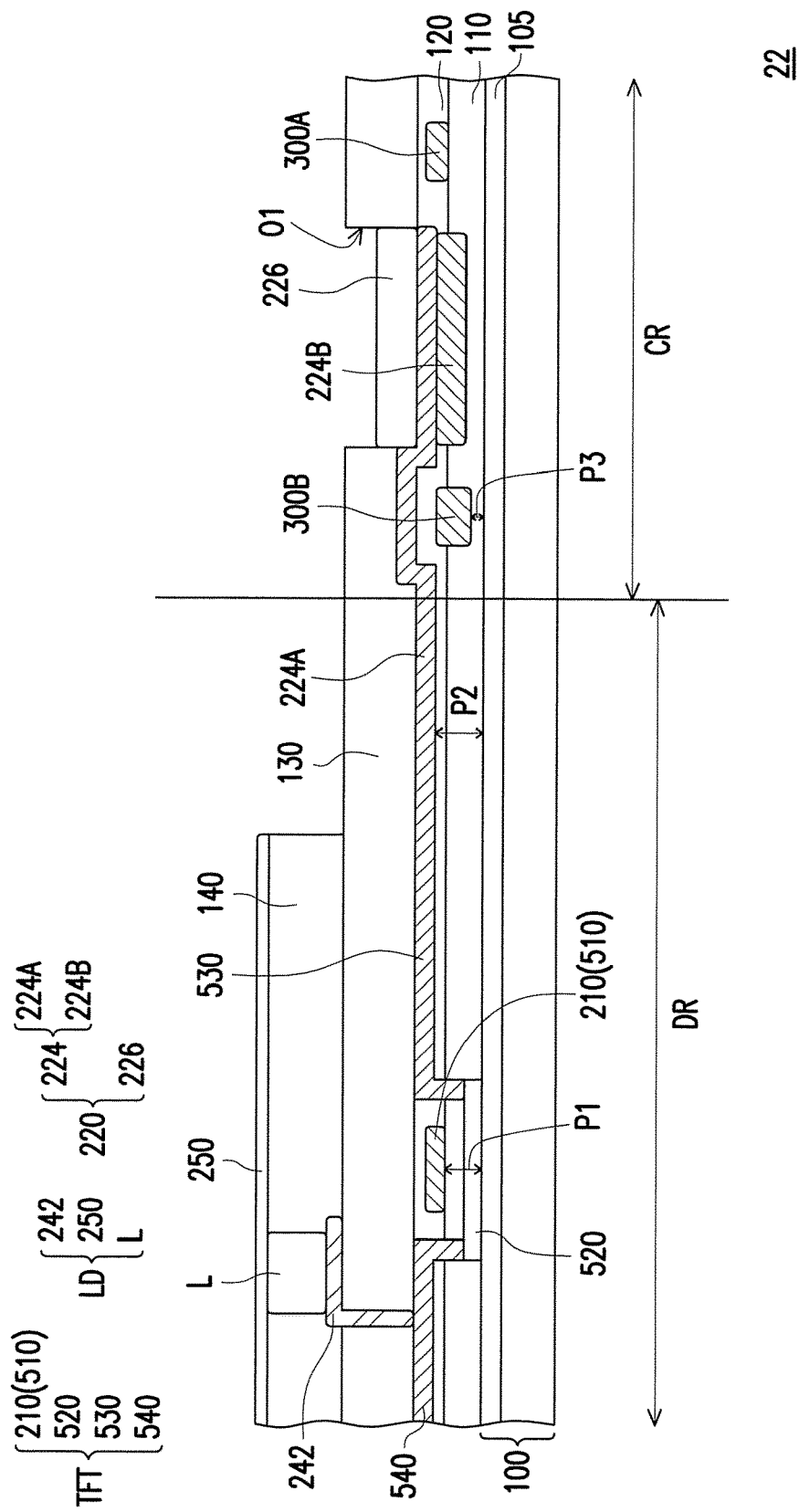
FIG. 26 is a schematic cross-sectional view of an array substrate according to an embodiment of the invention.

FIG. 26 is a schematic cross-sectional view of an array substrate according to an embodiment of the invention. It should be noted that the reference numerals and a part of the contents in the embodiment of FIG. 25 are also used to describe the embodiment of FIG. 26, in which the same reference numerals are used to represent identical or similar elements, and thus descriptions of the same technical contents are omitted. Please refer to the descriptions of the previous embodiment for the omitted contents, which will not be repeated hereinafter.

In the present embodiment, an array substrate 22 includes a substrate 100, an insulation layer 110, an insulation layer 120, an insulation layer 130, an insulation layer 140, a signal line 210, a transduction structure 220, a signal line 230, a signal line 244, a light emitting device LD, a support structure 300A, an auxiliary structure 300B, and an active device TFT.

The active device TFT includes a gate 510, a semiconductor channel layer 520, a source 530, and a drain 540.

The semiconductor channel layer 520 is located on the substrate 100. In the present embodiment, the substrate 100 may include an insulation layer 105, and the semiconductor channel layer 520 is located on the insulation layer 105. The insulation layer 110 is located on the semiconductor channel layer 520. The gate 510 is located on the insulation layer 110. The insulation layer 110 is sandwiched between the gate 510 and the semiconductor channel layer 520. A vertical distance P1 is provided between the gate 510 and the insulation layer 105. The gate 510 is electrically connected to the signal line 210. The insulation layer 120 covers the gate 510 and the signal line 210.

The source 530 and the drain 540 are located on the insulation layer 120. The source 530 and the drain 540 fill an opening of the insulation layer 110 and an opening of the insulation layer 120 and are electrically connected to the semiconductor channel layer 520, respectively. The source 530 is electrically connected to a second layer 224A of the conductive layer 224. A vertical distance P2 is provided between the second layer 224A and the insulation layer 105. The drain 540 is electrically connected to an electrode 242 of the light emitting device LD. In the present embodiment, a displaying medium L fills an opening (not marked) of the insulation layer 140, and the electrode 242 is electrically connected to the drain 540. In some embodiments, an electrode 250 (e.g., a cathode) of the light emitting device LD may be electrically connected to other conductive layers.

Although in the present embodiment, the source 530 of the active device TFT is electrically connected to the conductive layer 224, and the drain 540 is electrically connected to the light emitting device LD, the invention is not limited thereto. In other embodiments, the drain 540 of the active device TFT is electrically connected to the conductive layer 224.

In the present embodiment, the support structure 300A, the auxiliary structure 300B, the signal line 210, the gate 510, and the first layer 224B belong to a same patterned film layer and, for example, are formed through a process similar to that of FIG. 17A to FIG. 17C or FIG. 18A to FIG. 18C. In the present embodiment, a lower surface of the auxiliary structure 300B and a lower surface of first layer 224B may be lower than a lower surface of the support structure 300A and a lower surface of the signal line 210. The lower surface of auxiliary structure 300B is, for example, flushed with the lower surface of the first layer 224B, and a vertical distance P3 is provided between the auxiliary structure 300B and the insulation layer 105. In the present embodiment, the vertical distance P2 is greater than the vertical distance P1, and the vertical distance P1 is greater than the vertical distance P3.

An upper surface of the signal line 210 may be lower than an upper surface of the support structure 300A, an upper surface of the auxiliary structure 300B, and an upper surface of the second layer 224A. In an embodiment, a thickness of the signal line 210 is less than a thickness of the support structure 300A, the thickness of the support structure 300A is less than a thickness of the auxiliary structure 300B, and the thickness of the auxiliary structure 300B is approximately equal to a thickness of the second layer 224A.

Based on the above, in the array substrate 22 provided by at least one embodiment of the invention, the support structure 300A and the auxiliary structure 300B are disposed at positions close to the bonding pad 226. Deformation of a bonding area CR of the array substrate 22 generated in a manufacturing process may be reduced by the support structure 300A and the auxiliary structure 300B, and that the bonding pad 226 is not deviated from a predetermined position. As such, yield rates of the products are significantly enhanced. In addition, in at least one embodiment of the invention, the deformation of the bonding area CR of the array substrate 22 generated in the manufacturing process is reduced through arrangement of the support structure 300A and the auxiliary structure 300B without adjusting the material of the device array in the array substrate 22 nor adjusting the thickness of each of the film layers in the device array. As such, the problem of deformation of the array substrate 22 is resolved without affecting electrical property of the array substrate 22.

In the foregoing embodiment, the bonding pad 226 may be lower than a height of a peripheral structure, but the invention is not limited thereto. In other modification examples, the bonding pad 226 may be higher than the height of the peripheral structure.

In the array substrate provided by at least one embodiment of the invention, the support structure and/or the auxiliary structure 300B are disposed at positions close to the bonding pad. Deformation of the bonding area of the array substrate generated in the manufacturing process is reduced by the support structure and/or the auxiliary structure, and that the bonding pad is not deviated from a predetermined position. As such, yield rates of the products are significantly enhanced.

In at least one embodiment of the invention, the support structure and/or the auxiliary structure may effectively break the stress in the insulation layer, and that the array substrate is less susceptible to deformation. In at least one embodiment of the invention, the support structure and/or the auxiliary structure are formed after the displaying medium is formed, such that the particles are prevented from polluting the displaying medium.

In at least one embodiment of the invention, the array substrate may be a flexible substrate and is formed on a rigid carrier. The support structure and/or the auxiliary structure are formed before the array substrate is removed from the rigid carrier, so as to prevent the array substrate from being deformed after being removed from the rigid carrier.

In at least one embodiment of the invention, the deformation of the bonding area of the array substrate generated in the manufacturing process is reduced through arrangement of the support structure and/or the auxiliary structure without adjusting the material of the device array in the array substrate nor adjusting the thickness of each of the film layers in the device array. As such, the problem of deformation of the array substrate is resolved without affecting electrical property of the array substrate.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An array substrate, comprising:
   a device array;
   a bonding pad located in a bonding area and electrically connected to the device array;
   at least one support structure, wherein a first horizontal distance between the at least one support structure and the bonding pad is between 5 μm and 1000 μm;
   a first substrate;
   a first insulation layer located on the first substrate; and
   a second insulation layer located on the first insulation layer, wherein at least a portion of the at least one support structure is embedded in the second insulation layer, a first vertical distance formed between the at least one support structure and an upper surface of the first insulation layer is greater than 0 μm, the at least one support structure comprises a first portion and a second portion made of different materials, a material of the first portion of the at least one support structure comprises metal oxide, the second portion of the at least one support structure is located in the first portion, the second portion is not in contact with the first insulation layer, and the second portion comprises an air void.

2. The array substrate as claimed in claim 1, further comprising:
   a third insulation layer located on the second insulation layer, the at least one support structure being further embedded in the third insulation layer, and the bonding pad comprising:
   a first conductive layer extending from the bonding area towards the device array, wherein a second vertical distance is formed between a portion of the first conductive layer not being located in the bonding area and the upper surface of the first insulation layer, and the second vertical distance is between 0 μm and 1 μm.

3. An array substrate, comprising:
   a device array;
   a bonding pad located in a bonding area and electrically connected to the device array;
   at least one support structure, wherein a first horizontal distance between the at least one support structure and the bonding pad is between 5 μm and 1000 μm;
   a first substrate;
   a first insulation layer located on the first substrate; and
   a second insulation layer located on the first insulation layer, wherein at least a portion of the at least one support structure is embedded in the second insulation layer, a first vertical distance formed between the at least one support structure and an upper surface of the first insulation layer is greater than 0 μm, the at least one support structure comprises a first portion and a second portion made of different materials, a material of the first portion of the at least one support structure comprises metal oxide, the second portion is located between the first insulation layer and the first portion, and a material of the second portion of the at least one support structure comprises metal.

4. The array substrate as claimed in claim 3, wherein the at least one support structure further comprises a third portion located between the second portion and the first portion, and a material of the third portion comprises an insulation material.

5. The array substrate as claimed in claim 3, further comprising:
   a third insulation layer located on the second insulation layer, the at least one support structure being further embedded into the third insulation layer, and the bonding pad comprising:
   a first conductive layer extending from the bonding area towards the device array, a second vertical distance being formed between a portion of the first conductive layer not being located in the bonding area and the upper surface of the first insulation layer, and the second vertical distance being between 0 μm and 1 μm.

6. An array substrate, comprising:
a device array;
a bonding pad located in a bonding area and electrically connected to the device array;
at least one support structure, wherein a first horizontal distance between the at least one support structure and the bonding pad is between 5 μm and 1000 μm;
a first substrate;
a first insulation layer located on the first substrate; and
a second insulation layer located on the first insulation layer, wherein at least a portion of the at least one support structure is embedded in the second insulation layer, a first vertical distance formed between the at least one support structure and an upper surface of the first insulation layer is greater than 0 μm, the at least one support structure comprises a first portion and a second portion made of different materials, a material of the first portion of the at least one support structure comprises metal oxide, the second portion is located in the first portion, the second portion is not in contact with the first insulation layer, and a material of the second portion comprises an insulation material, wherein the insulation material comprises silicon nitride, silicon oxide, or polymethylmethaciylate (PMMA).

7. The array substrate as claimed in claim 6, further comprising:
a third insulation layer located on the second insulation layer, the at least one support structure being further embedded into the third insulation layer; and
a fourth insulation layer located on the third insulation layer.

8. The array substrate as claimed in claim 7, wherein the at least one support structure is further embedded into the fourth insulation layer.

9. The array substrate as claimed in claim 6, further comprising:
an auxiliary structure, wherein a second horizontal distance formed between the auxiliary structure and the bonding pad is between 5 μm and 1000 μm.

10. The array substrate as claimed in claim 9, further comprising:
a third insulation layer located on the second insulation layer, at least a portion of the auxiliary structure being embedded into the third insulation layer, and a material of the auxiliary structure comprising metal oxide, an insulation material, or a combination of the foregoing materials.

11. An array substrate, comprising:
a device array;
a bonding pad located in a bonding area and electrically connected to the device array;
at least one support structure, wherein a first horizontal distance between the at least one support structure and the bonding pad is between 5 μm and 1000 μm;
a first substrate;
a first insulation layer located on the first substrate;
a second insulation layer located on the first insulation layer, wherein at least a portion of the at least one support structure is embedded in the second insulation layer, a first vertical distance is formed between the at least one support structure and a lower surface of the first insulation layer, the first vertical distance is between 0 μm and 1 μm; and
a first conductive layer extending from the bonding area towards the device array, a portion of the first conductive layer located in the bonding area being embedded into the first insulation layer, a second vertical distance being formed between the portion of the first conductive layer and a lower surface of the first insulation layer, and the second vertical distance being between 0 μm and 1 μm.

12. The array substrate as claimed in claim 11, the at least one support structure comprising a main body portion embedded in the second insulation layer and a plurality of fork-like portions extending from the main body portion towards the first insulation layer, wherein the fork-like portions are embedded in the first insulation layer.

13. The array substrate as claimed in claim 11, wherein the at least one support structure comprises a first portion and a second portion stacked with the first portion along a direction perpendicular to the first substrate, the first portion and the second portion are embedded in the second insulation layer, a portion of the second insulation layer is sandwiched between the first portion and the second portion, and a material of the first portion and the second portion comprises metal.

14. An array substrate, comprising:
a device array;
a bonding pad located in a bonding area and electrically connected to the device array;
at least one support structure, wherein a first horizontal distance between the at least one support structure and the bonding pad is between 5 μm and 1000 μm;
a first substrate;
a first insulation layer located on the first substrate;
a second insulation layer located on the first insulation layer, wherein at least a portion of the at least one support structure is embedded in the second insulation layer, a first vertical distance is formed between the at least one support structure and a lower surface of the first insulation layer, the first vertical distance is between 0 μm and 1 μm; and
a first conductive layer extending from the bonding area towards the device may, a second vertical distance being formed between a portion of the first conductive layer not being located in the bonding area and an upper surface of the first insulation layer, a third vertical distance being formed between the at least one support structure and the upper surface of the first insulation layer, the third vertical distance being less than or equal to the second vertical distance, and the at least one support structure and the portion of the first conductive layer not being located in the bonding area belonging to a same film layer.

* * * * *